(12) United States Patent
Lee

(10) Patent No.: US 7,402,832 B2
(45) Date of Patent: Jul. 22, 2008

(54) QUANTUM DOTS OF GROUP IV SEMICONDUCTOR MATERIALS

(75) Inventor: Howard Wing Hoon Lee, Fremont, CA (US)

(73) Assignee: UltraDots, Inc., Menlo Park, CA (US)

( * ) Notice: Subject to any disclaimer, the term of this patent is extended or adjusted under 35 U.S.C. 154(b) by 0 days.

(21) Appl. No.: 10/893,059

(22) Filed: Jul. 16, 2004

(65) Prior Publication Data

US 2004/0262583 A1    Dec. 30, 2004

Related U.S. Application Data

(62) Division of application No. 10/212,001, filed on Aug. 2, 2002, now abandoned.

(60) Provisional application No. 60/309,898, filed on Aug. 2, 2001, provisional application No. 60/309,905, filed on Aug. 2, 2001, provisional application No. 60/309,979, filed on Aug. 2, 2001, provisional application No. 60/310,090, filed on Aug. 2, 2001, provisional application No. 60/310,095, filed on Aug. 2, 2001.

(51) Int. Cl.
*H01L 29/16* (2006.01)

(52) U.S. Cl. .................. 257/17; 257/22; 257/E29.071; 977/814

(58) Field of Classification Search .............. 257/17, 257/22
See application file for complete search history.

(56) References Cited

U.S. PATENT DOCUMENTS

| | | | |
|---|---|---|---|
| 3,995,311 A | 11/1976 | Taylor | |
| 4,211,467 A | 7/1980 | Cross et al. | |
| 4,332,974 A | 6/1982 | Fraas | |
| 4,557,551 A | 12/1985 | Dyott | |
| 4,688,882 A | 8/1987 | Failes | |
| 4,693,547 A | 9/1987 | Soref et al. | |
| 4,818,050 A | 4/1989 | Duthie | |
| 4,856,859 A | 8/1989 | Imoto | |
| 4,894,818 A | 1/1990 | Fujioka et al. | |
| 4,906,064 A | 3/1990 | Cheung | |
| 4,962,987 A | 10/1990 | Doran | |
| 4,973,122 A | 11/1990 | Cotter et al. | |

(Continued)

FOREIGN PATENT DOCUMENTS

EP    0 254 509 A1    1/1988

(Continued)

OTHER PUBLICATIONS

Bley et al., "Characterization of silicon nanoparticles prepared from porous silicon," *Chem. Mater.* 8:1881-1888, 1996.

(Continued)

*Primary Examiner*—Jerome Jackson, Jr.
(74) *Attorney, Agent, or Firm*—Cooley Godward Kronish LLP

(57) ABSTRACT

The invention relates to a quantum dot. The quantum dot comprises a core including a semiconductor material Y selected from the group consisting of Si and Ge. The quantum dot also comprises a shell surrounding the core. The quantum dot is substantially defect free such that the quantum dot exhibits photoluminescence with a quantum efficiency that is greater than 10 percent.

8 Claims, 12 Drawing Sheets

U.S. PATENT DOCUMENTS

| | | | |
|---|---|---|---|
| 5,079,594 A | 1/1992 | Mitsuyu et al. |
| 5,113,473 A | 5/1992 | Yoshida et al. |
| 5,136,669 A | 8/1992 | Gerdt |
| 5,147,841 A | 9/1992 | Wilcoxon |
| 5,191,630 A | 3/1993 | Tajima |
| 5,253,103 A | 10/1993 | Boyd et al. |
| 5,260,957 A | 11/1993 | Hakimi et al. |
| 5,262,357 A | 11/1993 | Alivisatos et al. |
| 5,291,034 A | 3/1994 | Allam et al. |
| 5,307,428 A | 4/1994 | Blow et al. |
| 5,406,407 A | 4/1995 | Wolff |
| 5,432,873 A | 7/1995 | Hosoya et al. |
| 5,449,561 A | 9/1995 | Golding et al. |
| 5,449,582 A | 9/1995 | Hsieh et al. |
| 5,452,123 A | 9/1995 | Asher et al. |
| 5,459,801 A | 10/1995 | Snitzer |
| 5,460,701 A | 10/1995 | Parker et al. |
| 5,474,591 A | 12/1995 | Wells et al. |
| 5,477,377 A | 12/1995 | Golding et al. |
| 5,491,114 A | 2/1996 | Goldstein |
| 5,493,433 A | 2/1996 | Prucnal et al. |
| 5,496,503 A | 3/1996 | Kurihara et al. |
| 5,500,054 A | 3/1996 | Goldstein |
| 5,505,928 A | 4/1996 | Alivisatos et al. |
| 5,508,829 A | 4/1996 | Freeouf et al. |
| 5,527,386 A | 6/1996 | Statz |
| 5,535,001 A | 7/1996 | Tajima |
| 5,537,000 A | 7/1996 | Alivisatos et al. |
| 5,546,480 A | 8/1996 | Leonard |
| 5,559,057 A | 9/1996 | Goldstein |
| 5,559,825 A | 9/1996 | Scalora et al. |
| 5,576,248 A | 11/1996 | Goldstein |
| 5,580,655 A | 12/1996 | El-Shall et al. |
| 5,592,319 A | 1/1997 | Lee et al. |
| 5,594,818 A | 1/1997 | Murphy |
| 5,636,309 A | 6/1997 | Henry et al. |
| 5,642,453 A | 6/1997 | Margulis et al. |
| 5,646,759 A | 7/1997 | Lichtman et al. |
| 5,647,040 A | 7/1997 | Modavis et al. |
| 5,670,279 A | 9/1997 | Goldstein |
| 5,686,351 A | 11/1997 | Golding et al. |
| 5,690,807 A | 11/1997 | Clark, Jr. et al. |
| 5,695,617 A | 12/1997 | Graiver et al. |
| 5,710,845 A | 1/1998 | Tajima |
| 5,711,803 A | 1/1998 | Pehnt et al. |
| 5,728,195 A | 3/1998 | Eastman et al. |
| 5,737,102 A | 4/1998 | Asher |
| 5,740,287 A | 4/1998 | Scalora et al. |
| 5,811,030 A | 9/1998 | Aoki |
| 5,825,519 A | 10/1998 | Prucnal |
| 5,834,378 A | 11/1998 | Kurtz et al. |
| 5,840,111 A | 11/1998 | Wiederhoft et al. |
| 5,840,562 A | 11/1998 | Diep et al. |
| 5,850,064 A | 12/1998 | Goldstein |
| 5,854,868 A | 12/1998 | Yoshimura et al. |
| 5,881,200 A | 3/1999 | Burt |
| 5,888,885 A | 3/1999 | Xie |
| 5,897,331 A | 4/1999 | Sopori |
| 5,909,614 A | 6/1999 | Krivoshlykov |
| 5,932,309 A | 8/1999 | Smith et al. |
| 5,959,753 A | 9/1999 | Duling, III et al. |
| 5,963,360 A | 10/1999 | Sato et al. |
| 5,963,571 A | 10/1999 | Wingreen |
| 5,990,479 A | 11/1999 | Weiss et al. |
| 6,005,707 A | 12/1999 | Berggren et al. |
| 6,026,205 A | 2/2000 | McCallion et al. |
| 6,049,090 A | 4/2000 | Clark, Jr. |
| 6,058,127 A | 5/2000 | Joannopoulos et al. |
| 6,060,026 A | 5/2000 | Goldstein |
| 6,064,506 A | 5/2000 | Koops |
| 6,074,742 A | 6/2000 | Smith et al. |
| 6,075,203 A | 6/2000 | Wang et al. |
| 6,075,915 A | 6/2000 | Koops et al. |
| 6,084,176 A | 7/2000 | Shiratsuchi et al. |
| 6,086,794 A | 7/2000 | Nobutoki et al. |
| 6,094,273 A | 7/2000 | Asher et al. |
| 6,101,300 A | 8/2000 | Fan et al. |
| 6,139,626 A | 10/2000 | Norris et al. |
| 6,144,779 A | 11/2000 | Binkley et al. |
| 6,147,080 A | 11/2000 | Bemis et al. |
| 6,174,424 B1 | 1/2001 | Wach et al. |
| 6,179,912 B1 | 1/2001 | Barbera-Guillem et al. |
| 6,207,229 B1 | 3/2001 | Bawendi et al. |
| 6,207,392 B1 | 3/2001 | Weiss et al. |
| 6,225,198 B1 | 5/2001 | Alivisatos et al. |
| 6,225,647 B1 | 5/2001 | Kurtz et al. |
| 6,229,633 B1 | 5/2001 | Roberts et al. |
| 6,239,355 B1 | 5/2001 | Salafsky |
| 6,268,014 B1 | 7/2001 | Eberspacher et al. |
| 6,268,041 B1 | 7/2001 | Goldstein |
| 6,277,740 B1 | 8/2001 | Goldstein |
| 6,306,736 B1 | 10/2001 | Alivisatos et al. |
| 6,313,015 B1 | 11/2001 | Lee et al. |
| 6,316,715 B1 | 11/2001 | King et al. |
| 6,319,426 B1 | 11/2001 | Bawendi et al. |
| 6,322,901 B1 | 11/2001 | Bawendi et al. |
| 6,344,082 B1 | 2/2002 | Furuya et al. |
| 6,344,272 B1 | 2/2002 | Oldenburg et al. |
| 6,352,942 B1 | 3/2002 | Luan et al. |
| 6,361,660 B1 | 3/2002 | Goldstein |
| 6,366,392 B1 | 4/2002 | Tokushima |
| 6,369,405 B1 | 4/2002 | Canham et al. |
| 6,404,940 B1 | 6/2002 | Tsuyama et al. |
| 6,407,439 B1 | 6/2002 | Hier et al. |
| 6,416,818 B1 | 7/2002 | Aikens et al. |
| 6,440,213 B1 | 8/2002 | Alivisatos et al. |
| 6,444,143 B2 | 9/2002 | Bawendi et al. |
| 6,444,897 B1 | 9/2002 | Luque-Lopez et al. |
| 6,452,092 B2 | 9/2002 | Han et al. |
| 6,456,423 B1 | 9/2002 | Nayfeh et al. |
| 6,468,808 B1 | 10/2002 | Nie et al. |
| 6,476,312 B1 | 11/2002 | Barnham |
| 6,501,014 B1 | 12/2002 | Kubota et al. |
| 6,501,091 B1 | 12/2002 | Bawendi et al. |
| 6,503,831 B2 | 1/2003 | Speakman |
| 6,514,446 B1 | 2/2003 | Smith et al. |
| 6,515,314 B1 | 2/2003 | Duggal et al. |
| 6,558,995 B1 | 5/2003 | Gilliland et al. |
| 6,585,947 B1 | 7/2003 | Nayfeh et al. |
| 2001/0005495 A1 | 6/2001 | O'Brien |
| 2001/0028055 A1 | 10/2001 | Fafard et al. |
| 2001/0033371 A1 | 10/2001 | Lawandy |
| 2001/0040232 A1 | 11/2001 | Bawendi et al. |
| 2001/0055764 A1 | 12/2001 | Empedocles et al. |
| 2002/0006723 A1 | 1/2002 | Goldstein |
| 2002/0031783 A1 | 3/2002 | Empedocles et al. |
| 2002/0045045 A1 | 4/2002 | Adams et al. |
| 2002/0070121 A1 | 6/2002 | Nayfeh et al. |
| 2002/0071952 A1 | 6/2002 | Bawendi et al. |
| 2002/0074543 A1 | 6/2002 | Petroff et al. |
| 2002/0098680 A1 | 7/2002 | Goldstein |
| 2002/0110180 A1 | 8/2002 | Barney et al. |
| 2002/0127224 A1 | 9/2002 | Chen |
| 2002/0144644 A1 | 10/2002 | Zehnder et al. |
| 2002/0167254 A1 | 11/2002 | Craig et al. |
| 2003/0003300 A1 | 1/2003 | Korgel et al. |
| 2003/0008145 A1 | 1/2003 | Goldstein |
| 2003/0017264 A1 | 1/2003 | Treadway et al. |
| 2003/0034486 A1 | 2/2003 | Korgel |
| 2003/0042850 A1 | 3/2003 | Bertram et al. |

2003/0047816 A1    3/2003    Dutta

FOREIGN PATENT DOCUMENTS

| | | |
|---|---|---|
| EP | 0 545 595 B1 | 10/1997 |
| EP | 0859386 A1 | 8/1998 |
| EP | 0 886 167 A1 | 12/1998 |
| EP | 0 918 245 A1 | 5/1999 |
| EP | 0774443 B1 | 5/1999 |
| EP | 1 011 008 A1 | 6/2000 |
| EP | 1160888 A1 | 12/2001 |
| EP | 1244168 A1 | 9/2002 |
| GB | 2 341 722 A | 3/2000 |
| JP | 11-264958 A | 9/1999 |
| JP | 2000-29081 A | 1/2000 |
| JP | 2000-321607 A | 11/2000 |
| WO | WO 97/06469 A1 | 2/1997 |
| WO | WO 98/34251 A1 | 8/1998 |
| WO | WO 98/36434 A1 | 8/1998 |
| WO | WO 98/46799 A1 | 10/1998 |
| WO | WO 00/07250 A1 | 2/2000 |
| WO | WO 00/10197 A1 | 2/2000 |
| WO | WO 00/22682 A2 | 4/2000 |

OTHER PUBLICATIONS

Bley et al., "A low-temperature solution phase route for the synthesis of silicon nanoclusters," *J. Am. Chem. Soc.* 118:12461-12462, 1996.
Chiu et al., "Gas phase synthesis and processing of silicon nanocrystallites: characterization by photoluminescence emission spectroscopy," *Journal of Electronic Materials* 29(3):347-354, 1994.
Cullis, "The structural and luminescence properties of porous silicon," *J. Appl. Phys.* 82(3):909-965, 1997.
Dhas et al., "Preparation of luminescent silicon nanoparticles: a novel sonochemical approach," *Chem. Mater.* 10:3278-3281, 1998.
Heath, "A liquid-solution-phase synthesis of crystalline silicon," *Science* 258:1131-1133, 1992.
Heath et al., "A liquid solution synthesis of single crystal germanium quantum wires," *Chemical Physics Letters* 208:263-268, 1993.
Heath, "Germanium quantum dots: optical properties and synthesis," *J. Chem. Phys.* 101(2):1607-1615, 1994.
Holmes et al., "Highly luminescent silicon nanocrystals with discrete optical transitions," *J. Am. Chem. Soc.* 123:3743-3748, 2001.
Kagan et al., "Long-range resonance transfer of electronic excitations in close-packed CdSe quantum-dot solids," *Phys. Rev. B* 54:8633-8643, 1996.
Kanemitsu, "Silicon and germanium nanoparticles," *Semiconductors and Semimetals* 49:157-204, 1998.
Kornowaki et al., "Nanometer-sized colloidal germanium particles: wet-chemical synthesis, laser-induced crystallization and particle growth," *Advanced Materials* 5(9):634-636, 1993.
Littau et al., "A luminescent silicon nanocrystal colloid via a high-temperature aerosol reaction," *J. Phys. Chem.* 97: 1224-1230, 1993.
Murray, "Synthesis and characterization of II-VI quantum dots and their assembly into 3-D quantum dot superlattices," Massachusetts Institute of Technology, *thesis*, Cambridge, Massachusetts, 1995.
Murray et al., "Self-organization of CdSe nanocrystallites into three-dimensional quantum dot superlattices," *Science* 270:1335-1338, 1995.
Parker, "Mighty small dots," *S&TR* Jul./Aug. 2000:20-21.
Phely-Bobin, et al., "Characterization of Mechanically Attrited Si/SiO$_x$ Nanoparticles and Their Self-Assembled Composite Films," *Chem. Mater.* 14:1030-1036, 2002.
Prakash et al., "Nonlinear optical properties of silicon nanocrystals grown by plasma-enhanced chemical vapor deposition," *Journal of Applied Physics* 91(7): 4607-4610, 2002.
Taylor et al., "Solution synthesis and characterization of quantum confined Ge nanoparticles," *Chem. Mater.* 11:2493-2500, 1999.
Vijayalakshmi, "Nonlinear Optical properties of silicon nanoclusters," *Appl. Phys. Lett.* 7096:708-710, 1997.
Watanabe et al., "Soluble three-dimensional polysilane with organosilicon nanocluster structure," *Jpn. J. Appl. Phys.* 36:L1265-L1267, 1997.

Wilcoxon et al., "Optical and electronic properties of Si nanoclusters synthesized in inverse micelles," *Physical Review B* 60(4):2704-2714, 1999.
Yang et al., "Synthesis of alkyl-terminated silicon nanoclusters by a solution route," *J. Am. Chem. Soc.* 121:5191-5195, 1999.
Belomoin, et al., "Observation of a magic discrete family of ultrabright Si nanoparticles," *Applied Physics Letters* 80(5):841-843, 2002.
Berg, et al., "Quantum dot amplifiers with high output power and low noise," *Applied Physics Letters* 82(18):3083-3085, 2003.
Ding, et al., "Electrochemistry and Electrogenerated Chemiluminescence from Silicon Nanocrystal Quantum Dots," *Science* 296:1293-1297, 2002.
Garcia, et al., "Size dependence of lifetime and absorption cross section of Si nanocrystals embedded in SiO$_2$," *Applied Physics Letters* 82(10): 1595-1597, 2003.
Ma, et al., "Small-Diameter Silicon Nanowire Surfaces," *Science* 299:1874-1877, 2003.
Pizzagalli, et al., "On the structure and stability of germanium nanoparticles," arXiv:cond-mat/0008145 v11-6, 2000.
Schmidt, et al., "Photoluminescence study of the initial stages of island formation for Ge pyramids/domes and hut clusters on Si(001)," *Applied Physics Letters* 72(13):1905-1907, 1999.
Tang, et al., "Spontaneous Organization of Single CdTe Nanoparticles into Luminescent Nanowires," *Science* 297:237-240, 2002.
Brus, "Quantum crystallites and nonlinear optics," *Appl. Phys. A* 53:465-474, 1991.
Brzozowski et al., "Azobenzenes for photonic network applications: third-order nonlinear optical properties," *Journal of Materials Science: Materials in Electronics* 12:483-489, 2001.
Coffer et al., "Porous silica glasses doped with quantum-confined cadmium selenide," *Journal of Non-Crystalline Solids* 142:208-214, 1992.
Cotter et al., "Nonlinear optics for high-speed digital information processing," *Science* 286:1523-1528, 1999.
Counio et al., "CdS: Mn nanocrystals in transparent xerogel matrices: synthesis and luminescence properties," *J. Phys. Chem.* 100:20021-20026, 1996.
Dabbousi et al., "(CdSe)ZnS Core-shell quantum dots: synthesis and characterization of a size series of highly luminescent nanocrystallites," *J. Phys. Chem. B* 101:9463-9475, 1997.
Doran et al., "Nonlinear-optical loop mirror," *Optics Letters* 13(1):56-58, 1988.
Friberg et al., "Ultrafast all-optical switching in a dual-core fiber nonlinear coupler," *Appl. Phys. Lett.* 51(15):1135-1137, 1987.
Gacoin et al., "Transparent sol-gel matrices doped with quantum sized PbS particles," *Mat. Res. Soc. Symp. Proc.* 358:247-252, 1995.
Gacoin et al., "New systems related to CdS nanoparticles in sol-gel matrices," *Mat. Res. Soc. Symp. Proc.* 435:643-648, 1996.
Garmire in Handbook of Optics (ed. Bass, M.) 4.1-4.80 (McGraw-Hill, New York), 2001.
Guglielmi, "Sol-gel nonlinear materials based on the incorporation of nanosize crystals and fullerence derivatives," Critical Reviews CR68:25-53, 1997.
Hulin et al., "Ultrafast all-optical gate with subpicosecond on and off response time," *Appl. Phys. Lett.* 49(13):749-751, 1986.
Hutchings et al., "Kramers-Krönig relations in nonliner optics," *Optical and Quantum Electronics* 24:1-30, 1992.
Jensen, "The nonlinear coherent coupler," *IEEE Journal of Quantum Electronics* QE-18:1580-1583, 1982.
Kang et al., "1x2 all-optical switch using photochromic-doped waveguides," *Electron. Lett.* 36(19):1641-1643, 2000.
Lasers and Electro-Optics, CLEO 2001, pp. 147, 149, 151, 153, 155, 163, 173, 175, 177, 180, 182, 194, 186, 188.
Lawrence et al., "Large purely refractive nonlinear index of single crystal P-toluene sulphonate (PTS) at 1600 nm," *Electron. Lett.* 30:447-448, 1994.
Liu et al., "Fused InP-GaAs vertical coupler filters," *IEEE Photonics Technology Letters* 11:93-95, 1999.
Maïer, "Self-switching of light in a directional coupler," *Sov. J. Quantum Electron* 14(1):101-104, 1984.

Murray et al., "Synthesis and characterization of nearly nonodisperse CdE (E=sulfur, selenium, tellurium) semiconductor nanocrystallites," *J. Am. Chem. Soc.* 115:8706-8715, 1993.

Patela, "Nonliner devices of integrated optics—technology and applications," Photonics in Information Processing, Stare Jablonki, 2000.

Peng et al., "Epitaxial growth of highly luminescent CdSe/CdS core/shell nanocrystals with photostability and electronic accessibility," *J. Am. Chem. Soc.* 119:7019-7029, 1997.

Peyghambarian, "Materials for fast switching and logic devices," *Proc. SPIE-Int. Soc. Opt. Eng.* 769(Workshop Photonic Logic Inf. Process): 28-40, 1986.

Peyghambarian et al., "Femtosecond optical nonlinearities of CdSe quantum dots," *IEEE Journal of Quantum Electronics* 25:2516-2522, 1989.

Ramaswami et al., Optical Networks: a practical perspective (Morgan kaufmann Publishers, San Francisco), pp. 199-216, 2002.

Ricolleau et al., "Correlation between structural and optical properties of PbS nanocrystals," *Journal of Crystal Growth* 166:769-733, 1996.

Samir et al., "Signal switching by a control beam in a nonlinear coupler," *J. Opt. Soc. Am. B* 11(11):2193-2205, 1994.

Sasaki et al., "Layer-by-layer assembly of titania nanosheet/polycation composite films," *Chem. Mater.* 13:466l-4667, 2001.

Schwerzel, "Nanocomposite photonic polymers. I. third-order nonlinear optical properties of capped cadmium sulfide nanocrystals in an ordered polydiacetylene host," *J. Phys. Chem. A* 102:5622-5626, 1998.

Sheik-Bahae et al., "Dispersion of bound electronic nonlinear refraction in solids," *IEEE Journal of Quantum Electronics* 27:1296-1309, 1991.

Spanhel et al., "Semiconductor clusters in the sol-gel process: synthesis and properties of CdS nanocomposites," *Journal of Non-Crystalline Solids* 147&148:657-662, 1992.

Stegeman in Handbook of Optics (ed. Bass, M.) 21.1-21.8 (McGraw-Hill, New York), 2001.

Takahashi et al., "Ultrafast high-contrast all-optical switching using spin polarization in low-temperature-grown multiple quantum wells," *Appl. Phys. Lett.* 77(19):2958-2960, 2000.

Tykwinski et al., "Structure-property relationships in third-order nonliner optical chromophores," *J. Phys. Chem. B* 102:4451-4465, 1998.

Williams et al., "Picosecond all-optical logic gate in a nonlinear organic etalon," *Appl. Phys. Lett.* 57(23):2399-2401, 1990.

Wong et al., "Synthesis and third-order nonlinear optical properties of end-functionalized oligo-phenylenevinylenes," *Chem. Mater.* 14:2999-3004, 2002.

Zhang et al., "A novel low-threshold all-optical switch," *SPIE* 3556:189-196, 1998.

Agarwal et al., "Tailoring the photonic band gap of a porous silicon dielectric mirror," *Appl. Phys. Lett.* 82(10):1512-1514, 2003.

Ago, et al., "Composites of Carbon Nanotubes and Conjugated Polymers for Photovoltaic Devices," *Advanced Materials* 11(15):1281-1285, 1999.

Anderson, "On quantum well solar cell efficiencies," *Physica E* 14:126-131, 2002.

Aroutiounian, et al., "Quantum dot solar cells," *Journal Of Applied Physics* 89(4):2268-2271, 2001.

The University of New South Wales, "The Generation Photovoltaics 2002 Annual Report," *Special Research Centre for Third Generation Photovoltaics*, 1-35, 2002.

Akazawa, "Self-limiting size control of hemispherical grains of microcrystalline Si self-assembled on an amorphous Si film surface," *Applied Physics Letters* 82(9):1464-1466, 2003.

Barnham, et al., "Quantum-dot concentrator and thermodynamic model for the global redshift," *Applied Physics Letters* 76(9):1197-1199, 2000.

Barnham, et al., "Quantum well solar cells," *Physica E* 14:27-36, 2002.

Brunhes, et al., "Electroluminescence of Ge/Si self-assembled quantum dots grown by chemical vapor deposition," *Applied Physics Letters* 77(12):1822-1824, 2000.

Capellini, et al., "Ordering self-assembled islands without substrate patterning," *Applied Physics Letters* 82(11):1772-1774, 2003.

Das, et al., "High-Efficiency solar cells based on semiconductor Nanostructures," *Solar Energy Materials & Solar Cells* 63:117-123, 2000.

Dashiell, et al., "Photoluminescence investigation of phononless radiative recombination and thermal-stability of germanium hut clusters on silicon(001)," *Applied Physics Letters* 79(14):2261-2263, 2001.

Diehl, et al., "Electroluminescence from stain-compensated $Si_{0.2}Ge_{0.8}$/Si quantum-cascade structures based on a bound-to-continuum transition,"*Applied Physics Letters* 81(25):4700-4702, 2002.

Elkurdi, et al., "Near-infrared waveguide photodetector with Ge/Si self-assembled quantum dots," *Applied Physics Letter* 80(3):509-511, 2002.

Floyd, et al., "Nanometer-scale composition measurments of Ge/Si(100) islands," *Applied Physics Letters* 82(9):1473-1475, 2003.

Gebeyehu, et al., "The Interplay of efficiency and morphology in photovoltaic devices based on interpenetrating networks of conjugated polymer with fullerences," *Synthetic Metals* 118:1-9, 2001.

Goetzberger, et al., "Solar cells: past, present, future," *Solar Energy Materials & Solar Cells* 74:1-11, 2002.

Green, "Third Generation Photovoltaics: Ultra-high Conversion Efficiency at Low Cost," *Prog. Photovolt: Res. Appl.* 9:123-135, 2001.

Green, "Third generation photovoltaics: solar cells for 2020 and beyond," *Physica E* 14:65-70, 2002.

Honsberg, et al., "Design trade-offs and rules of multiple energy level solar cells," *Physica E* 14:136-141, 2002.

Huynh, et al., "CdSe Nanocrystal Rods/Poly(3-hexylthiophene) Composite Photovoltaic Devices," *Adv. Mater.* 11(11):923-927, 1999.

Huynh, et al., "Hybrid Nanorod-Polymer Solar Cells," *Science* 295:2425-2427, 2002.

Könenkamp et al., "Nano-structures for solar cells with extremely thin absorbers," *Physica E* 14:219-223, 2002.

Konle, et al., "Self-assembled Ge-island for photovoltaic applications," *Physica E* 16:596-601, 2003.

Kuznicki, "Enhanced absorption and quantum efficiency in locally modifies single-crystal Si," *Applied Physics Letters* 81(25):4853-5855, 2002.

Kymakis, et al., "Single-wall carbon nanotube/conjugated polymer photovoltaic devices," *Applied Physics Letters* 80(1):112-114, 2002.

Lander, et al., "SiGe Heterojunction pMOSFETs," *Philips*, date not listed.

Lundszien, et al., "Band-gap profiling in amorphous silicon-germanium solar cells," *Applied Physics Letters* 80(9):1655-1657, 2002.

Meissner, et al., "Photovoltaics of interconnected networks," *Synthetic Metals* 121:1551-1552, 2001.

Melosh, et al., "Ultrahigh-Density Nanowire Lattices and Circuits," *Science* 300:112-115, 2003.

Morf, "Unexplored opportunities for nanostructures in photovoltaics," *Physica E* 14:78-83, 2002.

Nozik, "Quantum dot solar cells," *Physica E* 14:115-120, 2002.

Plass et al., "Quantum Dot Sensitization of Organic-Inorganic Hybrid Solar Cells" *J. Phys. Chem. B*, 106, 7578-7580, 2002.

Qi, et al., "Spectroscopy of individual silicon nanowires," *Applied Physics Letters* 82(16):2616-2618, 2003.

Queisser, "Photovoltaic conversion at reduced dimensions," *Physica E* 14:1-10, 2002.

Raffaelle, et al., "Nanomaterials for Space Solar Power for Space Solar Power," *Space Solar Power Concept & Technology Maturation (SCTM) Program Technical Interchange Meeting*, 2002.

Raffaelle, et al., "Quantum Dot Solar Cells," *Prog. Photovolt: Res. Appl.* 10:433-439, 2002.

Ragan, et al., "Nonlithographic epitaxial $Sn_xGe_{1-x}$ dense nanowire arrays grown on Ge(001)," *Applied Physics Letters* 82(20):3439-3441, 2003.

Rebohle, et al., "Energy level engineering in InAs quantum dot nanostructures," *Applied Physics Letters* 81(11):2079-2081, 2002.

Roth, et al., "Self-assembled gradient nanoparticle-polymer multilayers investigated by an advanced characterization method: microbeam grazing incidence x-ray scattering," *Applied Physics Letters* 82(11):1935-1937, 2003.

Sutter, et al., "Continuous formation and faceting of SiGe islands on Si(100)," *Applied Physics Letters* 82(20):3454-3456, 2003.

Tada Tetsuya, "Fabrication of Si Nanopillars and its Application", AIST Today 3:2:10, 2003.

Tennakone, et al., "A dye-sensitized nano-porous solid-state photovoltaic cell," *Samicond. Sd. Technol.* 10:1689-1693, 1995.

Tessler, et al., "Efficient Near-Infrared Polymer Nanocrystal Light-Emitting Diodes," *Science* 295:1506-1508, 2002.

Trindade, et al., "Nanocrystalline Semiconductors: Synthesis, Properties, and Perspectives," *Chem. Mater.* 13:3843-3858, 2001.

Trupke, et al., "Very efficient light emission from bulk crystalline silicon," *Applied Physics Letters* 82(18):2996-1998, 2003.

Underwood, et al., "Charge carrier dynamics in CdSe nanocrystals: implications for the use of quantum dots in novel photovoltaics," *Eur. Phys. J. D.* 16:241-244, 2001.

Vescan, et al., "Self-assembling of Ge on finite Si(001) areas comparable with the island size," *Applied Physics Letters* 82(20):3517-3519, 2003.

Rakovich, Y.P., et al., Third-Order Optical Nonlinearities in Thin Films of CdS Nanocrystals Phys. Stat. Sol. (b) vol. 1, 318-324 (2001).

Liu, F., et al., Enhancement of third-order nonlinearity of nanocrstalline GaSb embedded in silica film Materials Science and Engineering, vol. B76,-161-164 (2000).

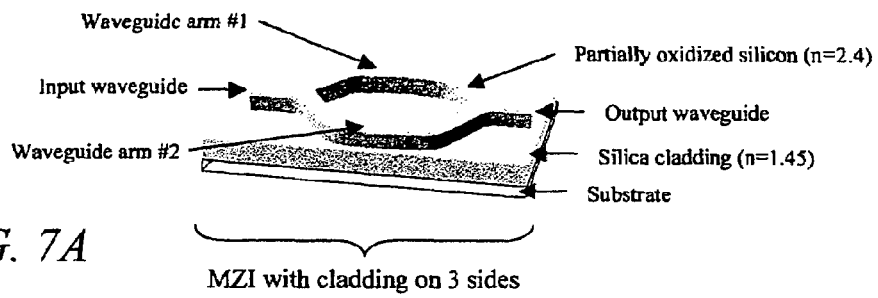
FIG. 7A
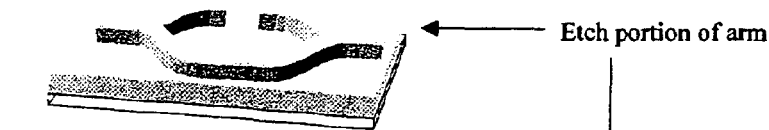
FIG. 7B
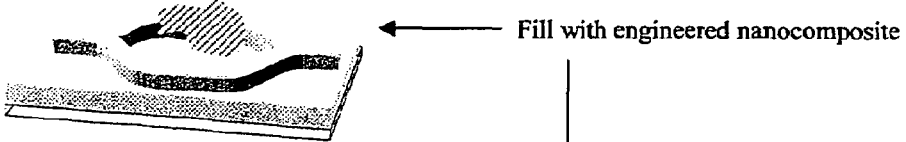
FIG. 7C
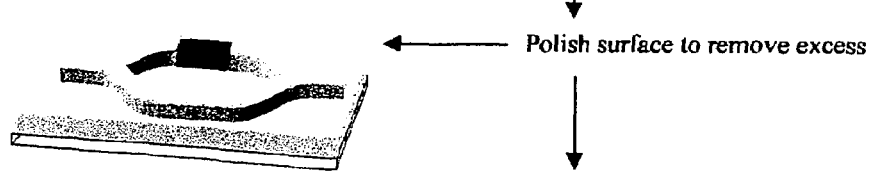
FIG. 7D
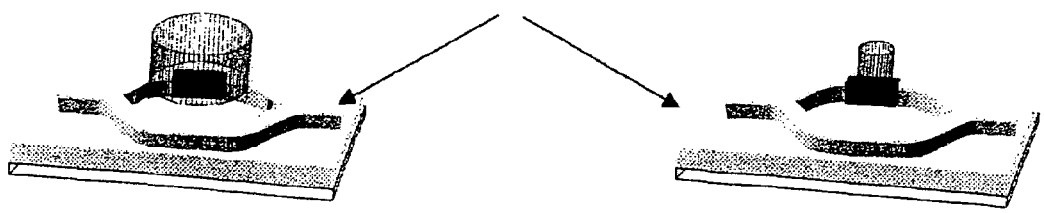
FIG. 7E                     FIG. 7F MZI with cladding on 3 sides Coat surface with engineered nanocomposite Remove excess Illuminate active region

QUANTUM DOTS OF GROUP IV SEMICONDUCTOR MATERIALS

CROSS-REFERENCE TO RELATED APPLICATIONS

This application is a divisional of U.S. patent application Ser. No. 10/212,001, filed on Aug. 2, 2002 now abandoned, which claims the benefit of U.S. Provisional Application Ser. No. 60/309,898, filed on Aug. 2, 2001, U.S. Provisional Application Ser. No. 60/309,905, filed on Aug. 2, 2001, U.S. Provisional Application Ser. No. 60/309,979, filed on Aug. 2, 2001, U.S. Provisional Application Ser. No. 60/310,090, filed on Aug. 2, 2001, and U.S. Provisional Application Ser. No. 60/310,095, filed on Aug. 2, 2001, the disclosures of which are incorporated herein by reference in their entirety.

FIELD OF THE INVENTION

This invention relates generally to quantum dots. More particularly, this invention relates to quantum dots of Group IV semiconductor materials.

BACKGROUND OF THE INVENTION

Over the past several years, there has been an increasing interest in exploiting the extraordinary properties associated with quantum dots. As a result of quantum confinement effects, properties of quantum dots can differ from corresponding bulk values. These quantum confinement effects arise from confinement of electrons and holes along three dimensions. For instance, quantum confinement effects can lead to an increase in energy gap as the size of the quantum dots is decreased. Consequently, as the size of the quantum dots is decreased, light emitted by the quantum dots is shifted towards higher energies or shorter wavelengths. By controlling the size of the quantum dots as well as the material forming the quantum dots, properties of the quantum dots can be tuned for a specific application.

Previous attempts at forming quantum dots have largely focused on quantum dots of direct band gap semiconductor materials, such as Group II-VI semiconductor materials. In contrast to such direct band gap semiconductor materials, Group IV semiconductor materials such as Si and Ge have energy gaps, chemical properties, and other properties that render them more desirable for a variety of applications. However, previous attempts at forming quantum dots of Si or Ge have generally suffered from a number of shortcomings. In particular, formation of quantum dots of Si or Ge sometimes involved extreme conditions of temperature and pressure while suffering from low yields and lack of reproducibility. And, quantum dots that were produced were generally incapable of exhibiting adequate levels of photoluminescence that can be tuned over a broad spectral range. Also, previous attempts have generally been unsuccessful in producing quantum dots of Si or Ge that are sufficiently stable under ambient conditions or that can be made sufficiently soluble in a variety of matrix materials.

It is against this background that a need arose to develop the quantum dots and methods for forming quantum dots described herein.

SUMMARY OF THE INVENTION

In one innovative aspect, the present invention relates to a quantum dot. In one embodiment, the quantum dot comprises a core including a semiconductor material Y selected from the group consisting of Si and Ge. The quantum dot also comprises a shell surrounding the core. The quantum dot is substantially defect free such that the quantum dot exhibits photoluminescence with a quantum efficiency that is greater than 10 percent.

In another embodiment, the quantum dot comprises a core including a semiconductor material Y selected from the group consisting of Si and Ge. The quantum dot also comprises a ligand layer surrounding the core. The ligand layer includes a plurality of surface ligands. The quantum dot exhibits photoluminescence with a quantum efficiency that is greater than 10 percent.

BRIEF DESCRIPTION OF THE DRAWINGS

For a better understanding of the nature and objects of the invention, reference should be made to the following detailed description taken in conjunction with the accompanying drawings, in which:

FIGS. 7(a), 7(b), 7(c), 7(d), 7(e), and 7(f) illustrate an embodiment of a nonlinear Mach-Zehnder (MZ) interferometer comprising an engineered nonlinear nanocomposite material.

DETAILED DESCRIPTION OF THE INVENTION

Definitions

Figure 1A:
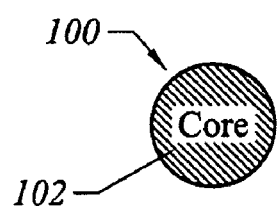
FIGS. 1(a), 1(b), 1(c), and 1(d) illustrate quantum dots according to some embodiments of the invention.

The following definitions may apply to some of the elements described with regard to some embodiments of the invention. These definitions may likewise be expanded upon herein.

As used in this specification and the appended claims, the singular forms "a an", and "the" include plural references unless the content clearly dictates otherwise. Thus, for example, reference to "a quantum dot" includes a mixture of two or more such quantum dots and may include a population of such quantum dots.

"Optional" or "optionally" means that the subsequently described event or circumstance may or may not occur and that the description includes instances where the event or circumstance occurs and instances in which it does not. For example, the phrase "optionally surrounded with a shell" means that the shell may or may not be present and that the description includes both the presence and absence of such a shell.

Embodiments of the invention relate to a class of novel materials comprising quantum dots. As used herein, the terms "quantum dot", "dot", and "nanocrystal" are synonymous and refer to any particle with size dependent properties (e.g., chemical, optical, and electrical properties) along three orthogonal dimensions. A quantum dot can be differentiated from a quantum wire and a quantum well, which have size-dependent properties along at most one dimension and two dimensions, respectively.

It will be appreciated by one of ordinary skill in the art that quantum dots can exist in a variety of shapes, including but not limited to spheroids, rods, disks, pyramids, cubes, and a plurality of other geometric and non-geometric shapes. While these shapes can affect the physical, optical, and electronic characteristics of quantum dots, the specific shape does not bear on the qualification of a particle as a quantum dot.

For convenience, the size of quantum dots can be described in terms of a "diameter". In the case of spherically shaped quantum dots, diameter is used as is commonly understood. For non-spherical quantum dots, the term diameter, unless otherwise defined, refers to a radius of revolution (e.g., a smallest radius of revolution) in which the entire non-spherical quantum dot would fit.

A quantum dot will typically comprise a "core" of one or more first materials and can optionally be surrounded by a "shell" of a second material. A quantum dot core surrounded by a shell is referred to as a "core-shell" quantum dot.

The term "core" refers to the inner portion of the quantum dot. A core can substantially include a single homogeneous monoatomic or polyatomic material. A core can be crystalline, polycrystalline, or amorphous. A core may be "defect" free or contain a range of defect densities. In this case, "defect" can refer to any crystal stacking error, vacancy, insertion, or impurity entity (e.g., a dopant) placed within the material forming the core. Impurities can be atomic or molecular.

While a core may herein be sometimes referred to as "crystalline", it will be understood by one of ordinary skill in the art that the surface of the core may be polycrystalline or amorphous and that this non-crystalline surface may extend a measurable depth within the core. The potentially non-crystalline nature of the "core-surface region" does not change what is described herein as a substantially crystalline core. The core-surface region optionally contains defects. The core-surface region will preferably range in depth between one and five atomic-layers and may be substantially homogeneous, substantially inhomogeneous, or continuously varying as a function of position within the core-surface region.

Quantum dots may optionally comprise a "shell" of a second material that surrounds the core. A shell can include a layer of material, either organic or inorganic, that covers the surface of the core of a quantum dot. A shell may be crystalline, polycrystalline, or amorphous and optionally comprises dopants or defects. The shell material is preferably an inorganic semiconductor with a bandgap that is larger than that of the core material. In addition, preferred shell materials have good conduction and valence band offsets with respect to the core such that the conduction band is desirably higher and the valence band is desirably lower than those of the core. Alternatively, the shell material may have a bandgap that is smaller than that of the core material, and/or the band offsets of the valence or conduction bands may be lower or higher, respectively, than those of the core. The shell material may be optionally selected to have an atomic spacing close to that of the core material.

Shells may be "complete", indicating that the shell substantially completely surrounds the outer surface of the core (e.g., substantially all surface atoms of the core are covered with shell material). Alternatively, the shell may be "incomplete" such that the shell partially surrounds the outer surface of the core (e.g., partial coverage of the surface core atoms is achieved). In addition, it is possible to create shells of a variety of thicknesses, which can be defined in terms of the number of "monolayers" of shell material that are bound to each core. A "monolayer" is a term known in the art referring to a single complete coating of a shell material (with no additional material added beyond complete coverage). For certain applications, shells will preferably be of a thickness between approximately 0 and 10 monolayers, where it is understood that this range includes non-integer numbers of monolayers. Non-integer numbers of monolayers can correspond to the state in which incomplete monolayers exist. Incomplete monolayers may be either homogeneous or inhomogeneous, forming islands or clumps of shell material on the surface of the quantum dot. Shells may be either uniform or nonuniform in thickness. In the case of a shell having nonuniform thickness, it is possible to have an "incomplete shell" that contains more than one monolayer of shell material. For certain applications, shell thickness will preferably range between approximately 1 Å and 100 Å.

It will be understood by one of ordinary skill in the art that there is typically a region between the core and shell referred to herein as an "interface region". The interface region may comprise an atomically discrete transition between the material of the core and the material of the shell or may comprise an alloy of the materials of the core and shell. The interface region may be lattice-matched or unmatched and may be crystalline or noncrystalline. The interface region may contain one or more defects or be defect-free. The interface region may be homogeneous or inhomogeneous and may comprise chemical characteristics that are graded between the core and shell materials such that a gradual or continuous transition is made between the core and the shell. Alternatively, the transition can be discontinuous. The width of the interface region can range from an atomically discrete transition to a continuous graded alloy of core and shell materials that are purely core material in the center of the quantum dot and purely shell material at the outer surface. Preferably, the interface region will be between one and five atomic layers thick.

A shell may optionally comprise multiple layers of a plurality of materials in an onion-like structure, such that each material acts as a shell for the next-most inner layer. Between each layer there is optionally an interface region. The term "shell" is used herein to describe shells formed from substantially one material as well as a plurality of materials that can, for example, be arranged as multi-layer shells.

A quantum dot may optionally comprise a "ligand layer" comprising one or more surface ligands (e.g., organic molecules) surrounding a core of the quantum dot. A quantum dot comprising a ligand layer may or may not also comprise a shell. As such, the surface ligands of the ligand layer may bind, either covalently or non-covalently, to either the core or the shell material or both (in the case of an incomplete shell). The ligand layer may comprise a single type of surface ligand (e.g., a single molecular species) or a mixture of two or more types of surface ligands (e.g., two or more different molecular species). A surface ligand can have an affinity for, or bind selectively to, the quantum dot core, shell, or both at least at one point on the surface ligand. The surface ligand may optionally bind at multiple points along the surface ligand. The surface ligand may optionally contain one or more additional active groups that do not interact specifically with the surface of the quantum dot. The surface ligand may be substantially hydrophilic, substantially hydrophobic, or substantially amphiphilic. Examples of the surface ligand include but are not limited to an isolated organic molecule, a polymer (or a monomer for a polymerization reaction), an inorganic complex, and an extended crystalline structure.

It will be understood by one of ordinary skill in the art that when referring to a population of quantum dots as being of a particular "size", what is meant is that the population is made up of a distribution of sizes around the stated "size". Unless otherwise stated, the "size" used to describe a particular population of quantum dots will be the mode of the size distribution (i.e., the peak size).

As used herein, the "size" of a quantum dot will refer to the diameter of a core of the quantum dot. If appropriate, a separate value will be used to describe the thickness of a shell surrounding the core. For instance, a 3 nm silicon quantum dot with a 1.5 nm $SiO_2$ shell is a quantum dot comprising a 3 nm diameter core of silicon surrounded by a 1.5 nm thick layer of $SiO_2$, for a total diameter of 6 nm.

For certain applications, the thickness of the ligand layer is a single monolayer or less and can sometimes be substantially less than a single monolayer.

As used herein, the term "photoluminescence" refers to the emission of light of a first wavelength (or range of wavelengths) by a substance (e.g., a quantum dot) that has been irradiated with light of a second wavelength (or range of wavelengths). The first wavelength (or range of wavelengths) and the second wavelength (or range of wavelengths) can be the same or different.

As used herein, the term "quantum efficiency" refers to the ratio of the number of photons emitted by a substance (e.g., a quantum dot) to the number of photons absorbed by the substance.

As used herein, the term "monodisperse" refers to a population of quantum dots wherein at least about 60% of the population, preferably 75% to 90% of the population, or any integer or noninteger therebetween, falls within a specified particle size range. A population of monodispersed particles deviates less than 20% root-mean-square (rms) in diameter, more preferably less than 10% rms, and most preferably less than 5% rms.

"Optically pure" refers to a condition in which light passing through or past a material is substantially unchanged in mode quality as a result of inhomogeneities in the material or modulations at the interface between materials. This does not include mode disruption resulting from changes in index of refraction of waveguides. For instance, a material with large aggregates of quantum dots capable of scattering light would not be optically pure. The same material with aggregates of a size that do not significantly scatter light, however, would be optically pure. It will be apparent to one of ordinary skill in the art that what is meant above by "substantially unchanged" will depend on the optical requirements of a particular application. To this end, "optically pure" refers to the level of optical purity required for the application in which the material is to be used.

"Optically homogeneous" is defined as being homogeneous across a length scale that is significant for optical waves, preferably greater than 250 nm, more preferably greater than 4 µm, and most preferably greater than ~1000 µm.

A "waveguide structure" is a term of art and refers to an optical device capable of transmitting light from one location to another. A waveguide structure can transmit light through the use of guiding by localized effective index differences. One example of this involves total internal reflection within a "waveguide core", with an index of refraction $n_1$, surrounded by a "cladding", with an index of refraction $n_2$, wherein $n_1 > n_2$. Another example of a waveguide structure involves appropriately micro or nanostructured materials such as photonic bandgap materials where the guiding results from the periodic micro- or nano-structure of the materials.

"Cladding" is any material that surrounds the waveguide core in a waveguide structure such that $n_1 > n_2$. In a typical waveguide structure, light propagates as a traveling wave within and along the length of the "waveguide core" and evanescently decays within the cladding with a decay constant related to the ratio of $n_1$ to $n_2$. Light trapped within, and traveling along, the length of a waveguide core is referred to as being "guided".

The shape of a waveguide core or a cladding can typically be described in terms of its "cross-section". The cross-section is the shape created by cutting the waveguide core or the cladding along the axes perpendicular to the longitudinal axis of the waveguide structure. The longitudinal axis is the axis in which guided light travels.

"Optical fibers" and "planar waveguides" are two common forms of waveguide structures known in the art. "Optical fiber", as the term is commonly used, typically refers to a structure comprising a substantially cylindrical waveguide core surrounded by a substantially cylindrical cladding and optionally comprising a flexible, protective outer-coating. Alternatively, or in conjunction, an optical fiber can comprise a non-cylindrical waveguide core with a cross-section shaped as a trapezoid, a circle, an oval, a triangle, or another geometric and nongeometric shape.

"Planar waveguides" are waveguide structures fabricated on a substrate by a variety of methods. "Planar waveguides" typically comprise a substantially rectangular waveguide core. Alternatively, or in conjunction, planar waveguides can comprise non-rectangular waveguide cores with cross-sections of trapezoids, circles, ovals, triangles, or a plurality of other geometric and nongeometric shapes. While the term "planar" suggests a flat structure, the term "planar waveguide", as used herein, also refers to structures comprising multiple flat layers. Optionally, one or more layers in a planar waveguide are not flat. One of skill in the art will appreciate that the key aspect of a "planar waveguide" is that it is a waveguide structure fabricated on a "substrate". Unless otherwise stated, the term "waveguide structure" will be used herein to describe a planar waveguide.

"Waveguide substrate" or "substrate" is used herein to describe the material on which a planar waveguide is located. It is common that a planar waveguide is fabricated directly on the surface of the substrate. The substrate typically comprises a solid support such as, for example, a silicon wafer and optionally comprises an additional "buffer layer" that separates the waveguide structure from the solid support. The buffer layer optionally comprises a plurality of layers comprising one or more materials or combination of materials. The buffer layer may optionally act, in part, as a cladding. Alternatively, the waveguide substrate may be a flexible substrate serving the same purpose.

"Single mode" waveguide structures are those waveguide structures (either planar or fiber optic) that typically support a single optical mode (e.g., TEM00). Such waveguide structures are preferred according to some embodiments of the invention. "Multi-mode" waveguide structures are those waveguide structures that typically support multiple optical modes simultaneously.

"Waveguide diameter" is herein used to describe the diameter of a substantially cylindrical waveguide core of an optical fiber. Waveguide diameter is also used to describe the diameter of a substantially cylindrical core on a planar waveguide.

"Waveguide width" or "width" is used herein to describe the cross-sectional dimension of a substantially rectangular waveguide core that is oriented parallel to the substrate surface. This is also referred to as the "horizontal dimension" of the waveguide core. "Waveguide height" or "height" is used herein to describe the cross-sectional dimension of a substantially rectangular waveguide core that is oriented perpendicular to the substrate surface. This is also referred to as the "vertical dimension" of the waveguide core. Based on the definitions of "width" and "height" described here, one of ordinary skill in the art will understand the translation of these terms to other geometrically or nongeometrically shaped waveguide cores. Unless otherwise stated, the standard definitions of width and height used in geometry will be used to describe geometric cross-sectional shapes.

"Core taper" refers to a region of the waveguide core in which the geometry of the waveguide core is changed. This may comprise changing the size and/or shape of the waveguide core in one or two dimensions. A core taper, for example, may comprise a transition of a waveguide core with a square cross-section of 15 μm×15 μm to a waveguide core with a square cross-section of 7 μm×7 μm. A core taper may also, for example, comprise a transition from a waveguide core with a square cross-section of 15 μm×15 μm to a waveguide core with a circular cross-section of 10 μm in diameter. Many other forms of core-tapers are possible and will be understood from the above definition.

A "core taper" is typically engineered to gradually change the characteristics of the waveguide structure over a defined distance, referred to as the "taper length". Ideally, the taper length will be long enough so that the transition preserves the mode structure of an optical signal through the taper. In particular, it is preferred, but not required, that a single optical mode entering a taper remains a single mode after exiting the taper. This retention of the mode-structure is referred to as an "adiabatic transition". While the term "adiabatic transition" is commonly used, those of ordinary skill in the art will recognize that it is typically not possible to have a perfectly adiabatic transition, and that this term can be used to describe a transition in which the mode structure is substantially undisrupted.

A "cladding taper" is a novel embodiment disclosed herein that is similar to a core taper; however, it refers to a change in width of the cladding around the waveguide core. Similar to a core taper, a cladding taper can be used to change the size and/or shape of the cladding and can be defined to have a taper length. The taper length can be such as to produce an adiabatic or nonadiabatic transition.

Both core and cladding tapers may optionally refer to the case in which the index of refraction of the materials in the core or cladding are gradually changed, or "graded" over the taper length. As used herein, the term "gradually" refers to changes that occur continuously or in small steps over a given nonzero distance. Core and cladding tapers may optionally comprise changes to the index, size, and/or shape of the core or cladding, respectively.

A "bend" is used herein to describe a portion of a planar waveguide in which the planar waveguide displays a degree of curvature in at least one dimension. Typically, the cross-section of the waveguide is substantially unchanged within the bend. Typically, bends will be smooth and continuous and can be described in terms of a radius of curvature at any given point within the bend. While bends can curve the planar waveguide both parallel and perpendicular to the substrate (e.g., horizontal or vertical bends, respectively), unless otherwise stated, the term "bend" will herein refer to horizontal bends. Optionally, bends can also comprise tapers.

A "multimode interference device" or multimode interferometer (MMI) refers to an optical device in which the cross-section of the waveguide core is substantially changed (typically increased) within a short propagation length, leading to a region of waveguide core in which more than one mode (but typically fewer than 10 modes) may propagate. The interaction of these propagating multiple modes defines the function performed by the MMI. MMI devices include fixed ratio splitters/combiners and wavelength multiplexers/demultiplexers.

As used herein, a "waveguide coupler", "optical coupler", and "directional coupler" are synonymous and refer to a waveguide structure in which light is evanescently coupled between two or more waveguide cores within a coupling region such that the intensity of the light within each of the individual cores oscillates periodically as a function of the length of the coupling region. A more detailed description of a waveguide coupler is disclosed below.

A "nonlinear waveguide coupler" is a waveguide coupler in which the region between and/or around two or more coupled waveguide cores is filled with a material (e.g., an "active material") with an index of refraction that can be changed. By changing the index of refraction of the active material, the coupling characteristics of the nonlinear waveguide coupler can be modified. Alternatively, the active material may be contained within one or more of the coupled waveguide cores (e.g., as a section of one of the waveguide cores).

A "Mach-Zehnder interferometer" or "MZ interferometer" (MZI) is a waveguide structure in which light from a waveguide core (e.g., an "input waveguide core") is split into two or more separate waveguide cores (e.g., "waveguide arms" or "arms"). Light travels a defined distance within the arms and is then recombined into a waveguide core (e.g., an "output waveguide core"). In a MZ interferometer, the history of the optical signals in each arm affects the resulting signal in the output waveguide core. A more detailed description of a MZ interferometer is disclosed below.

A "nonlinear MZ interferometer" is a MZ interferometer in which one or more of the waveguide arms comprise an active material. The active material may be in the core and/or cladding of the waveguide arm. Modifying the index of refraction of the active material modulates the signal in the output waveguide core by changing the degree of constructive and/or destructive interference from the waveguide arms.

"Active material" refers to any material with nonlinear optical properties that can be used to manipulate light in accordance with some embodiments of the invention. While the term active material will typically be used to refer to an engineered nonlinear nanocomposite material as described herein, the term may also be used to describe other nonlinear materials known in the art.

"Active region" refers to the region of an optical device in which the index of refraction of the active material is modulated in order to manipulate light. In the case of an electro-optic modulator, the active region is that area of the device where a voltage is applied. In a $\chi^{(3)}$ based device, the active region is that area to which a trigger-signal is applied. Note that while the active region can be the only region of the device in which an intentional change in optical properties occurs, it does not restrict the location of the active material, which may extend beyond the active region. Regions containing active materials outside the active region are typically not modulated during normal operation of the device. "Active length" describes the length of the active region along the longitudinal axis of the device.

In the case of optical devices employing evanescent coupling of light between two waveguide cores (e.g., a waveguide coupler), the "interaction region" or "coupling region" is the region of the optical device in which the coupling occurs. As is typically understood in the art, all waveguides can couple at some theoretically non-zero level. The interaction region, however, is typically considered to be that region of the optical device in which evanescent fields of the waveguides overlap to a significant extent. Here again, the interaction region does not restrict the extent of either the active region or the active material, which may be greater or lesser in extent than the interaction region.

"Interaction length" describes the length of the interaction region. "Interaction width" is the spacing between two coupled waveguides within the interaction region. Unless otherwise stated, the interaction width is assumed to be substantially constant across at least a portion of the interaction length.

"Trigger pulse", "trigger signal", "control pulse", "control signal", "control beam", and "activation light" are synonymous and refer to light that is used to create a transient change in the index of refraction in the materials of some embodiments of the present invention. A trigger pulse can either be pulsed or CW.

"Data pulse", data signal", and "data beam" are synonymous and refer to light used to transmit information through an optical device. A data pulse can optionally be a trigger pulse. A Data pulse can either be pulsed or CW.

"CW light" and "CW signal" are synonymous and refer to light that is not pulsed.

"Wavelength range-of-interest" refers to any range of wavelengths that will be used with a particular optical device. Typically, this will include both the trigger and data signals, where the ranges for the trigger and data signals can be the same or different. For instance, if a device is fabricated for use in the 1550 nm telecom range, the data wavelength range-of-interest may be defined as 1.5 µm to 1.6 µm, and the trigger wavelength range-of-interest may be defined as 1.5 µm to 1.6 µm (or a different range). For devices in the 1300 nm range, the data wavelength range-of-interest may be defined as 1.25 µm-1.35 µm. While these are preferred wavelength range-of-interests, it will be understood that the specific wavelength range-of-interest can be different depending on the specific application. The ability to tune the materials of embodiments of the current invention implies that any wavelength range-of-interest may be used. In general, 300 nm to 4000 nm is a preferred wavelength range-of-interest, more preferably 300 nm to 2000 nm, more preferably 750 nm to 2000 nm, more preferably 1260 nm to 1625 nm, most preferably 1310±50 nm and 1580±50 nm.

Quantum Dots

Embodiments of the current invention, in part, exploit the extraordinary properties of quantum dots. Quantum dots have optical and electronic properties that can be dependent (sometimes strongly dependent) on both the size and the material forming the quantum dots.

In nature, it is the size range on the order of a few nanometers in which the quantum mechanical characteristics of atoms and molecules often begin to impact and even dominate the classical mechanics of everyday life. In this size range, a material's electronic and optical properties can change and become dependent on size. In addition, as the size of a material gets smaller, and therefore more atomic-like, many characteristics change or are enhanced due to a redistribution of oscillator strength and density of states. These effects are referred to as "quantum confinement" effects. For example, quantum confinement effects can cause the energy gap of the quantum dot or the energy of the light emitted from the quantum dot to increase as the size of the quantum dot decreases. These quantum confinement effects result in the ability to finely tune many properties of quantum dots (e.g., optical and electronic properties) by carefully controlling their size. This control provides one critical aspect of some embodiments of the current invention.

A quantum dot will typically be in a size range between about 1 nm and about 1000 nm in diameter or any integer or fraction of an integer therebetween. Preferably, the size will be between about 1 nm and about 100 nm, more preferably between about 1 nm and about 50 nm or between about 1 nm to about 20 nm (such as about 2, 3, 4, 5, 6, 7, 8, 9, 10, 11, 12, 13, 14, 15, 16, 17, 18, 19, or 20 nm or any fraction of an integer therebetween), and more preferably between about 1 nm and 10 nm.

FIGS. 1(a), 1(b), 1(c), and 1(d) illustrates quantum dots according to some embodiments of the invention. In particular, FIG. 1(a) illustrates a quantum dot 100 comprising a core 102, according to an embodiment of the invention. A core (e.g., the core 102) of a quantum dot may comprise inorganic crystals of Group IV semiconductor materials including but not limited to Si, Ge, and C; Group II-VI semiconductor materials including but not limited to ZnS, ZnSe, ZnTe, ZnO, CdS, CdSe, CdTe, CdO, HgS, HgSe, HgTe, HgO, MgS, MgSe, MgTe, MgO, CaS, CaSe, CaTe, CaO, SrS, SrSe, SrTe, SrO, BaS, BaSe, BaTe, and BaO; Group III-V semiconductor materials including but not limited to AlN, AlP, AlAs, AlSb, GaN, GaP, GaAs, GaSb, InN, InP, InAs, and InSb; Group IV-VI semiconductor materials including but not limited to PbS, PbSe, PbTe, and PbO; mixtures thereof; and tertiary or alloyed compounds of any combination between or within these groups. Alternatively, or in conjunction, a core can comprise a crystalline organic material (e.g., a crystalline organic semiconductor material) or an inorganic and/or organic material in either polycrystalline or amorphous form.

Figure 1B:
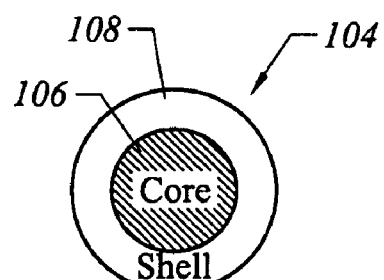

A core may optionally be surrounded by a shell of a second organic or inorganic material. FIG. 1(b) illustrates a quantum dot 104 according to another embodiment of the invention. Here, the quantum dot 104 comprises a core 106 that is surrounded by a shell 108. A shell (e.g., the shell 108) may comprise inorganic crystals of Group IV semiconductor materials including but not limited to Si, Ge, and C; Group II-VI semiconductor materials including but not limited to ZnS, ZnSe, ZnTe, ZnO, CdS, CdSe, CdTe, CdO, HgS, HgSe, HgTe, HgO, MgS, MgSe, MgTe, MgO, CaS, CaSe, CaTe, CaO, SrS, SrSe, SrTe, SrO, BaS, BaSe, BaTe, and BaO; Group III-V semiconductor materials including but not limited to AlN, AlP, AlAs, AlSb, GaN, GaP, GaAs, GaSb, InN, InP, InAs, and InSb; mixtures thereof; and tertiary or alloyed compounds of any combination between or within these groups. Alternatively, or in conjunction, a shell can comprise a crystalline organic material (e.g., a crystalline organic semiconductor material) or an inorganic and/or organic material in either polycrystalline or amorphous form. A shell may be doped or undoped, and in the case of doped shells, the dopants may be either atomic or molecular. A shell may optionally comprise multiple materials, in which different materials are stacked on top of each other to form a multi-layered shell structure.

Figure 1C:
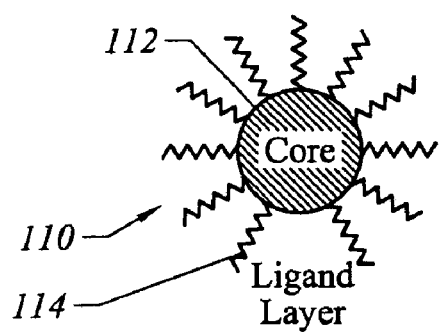
Figure 1D:
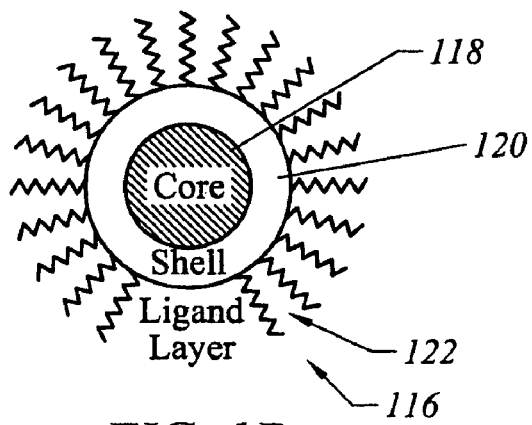

As illustrated in FIGS. 1(c) and 1(d), a quantum dot may optionally comprise a ligand layer comprising one or more surface ligands (e.g., organic molecules) surrounding a core, according to some embodiments of the invention. In FIG. 1(c), a quantum dot 110 comprises a core 112 and a ligand layer 114 surrounding the core 112. In FIG. 1(d), a quantum dot 116 comprises a core 118 and a ligand layer 122 surrounding the core 118. Here, the quantum dot 116 also comprises a shell 120 surrounding the core 118, where the shell 120 is positioned between the core 118 and the ligand layer 122.

Optical Properties

Linear Optical Properties:

One of the most dramatic examples of "quantum confinement" effects is that, for a semiconductor material, the energy gap shifts as a function of size. This can be seen in FIG. 2, where the energy gap of quantum dots fabricated from silicon, referred to herein as "silicon quantum dots", is plotted as a function of the size (e.g., diameter) of the quantum dots, according to an embodiment of the invention. The silicon quantum dots were made as described herein. The vertical axis represents the energy gap of the silicon quantum dots, and the horizontal axis represents the size of the silicon quantum dots. The observed values for the energy gap (dots with error bars) are compared against pseudopotential and tight-binding models (solid line) and against the simple effective mass theory (dashed line).

Figure 2:
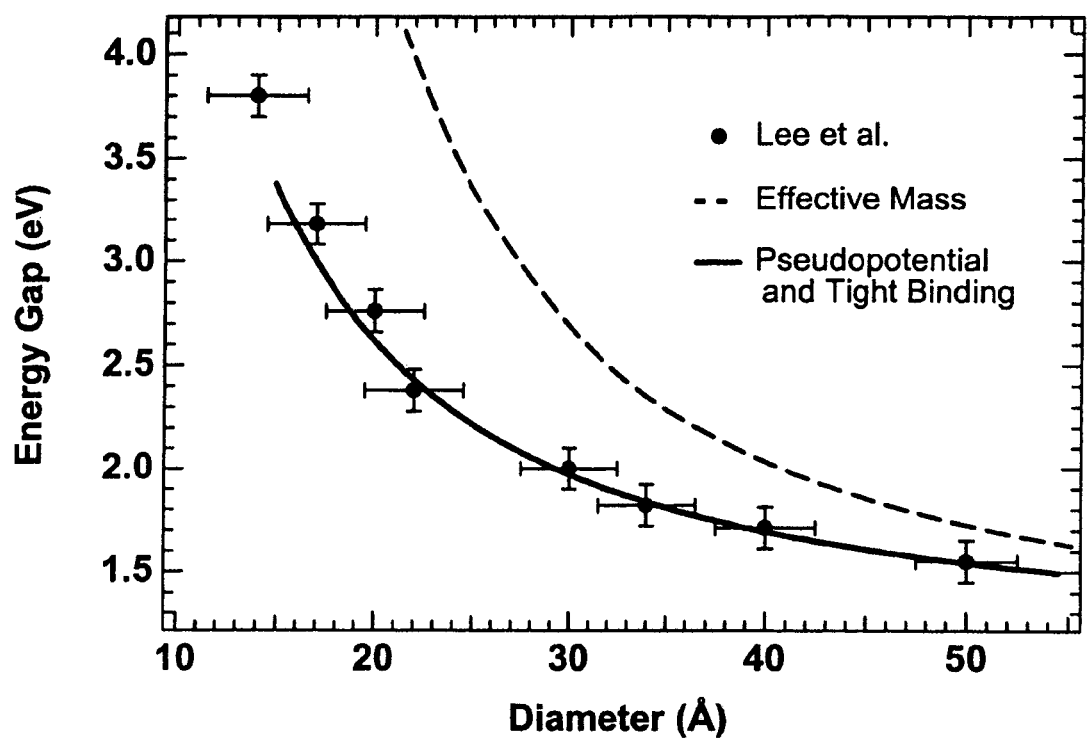
FIG. 2 illustrates the energy gap of quantum dots fabricated from silicon plotted as a function of the size of the quantum dots, according to an embodiment of the invention.
Figure 3:
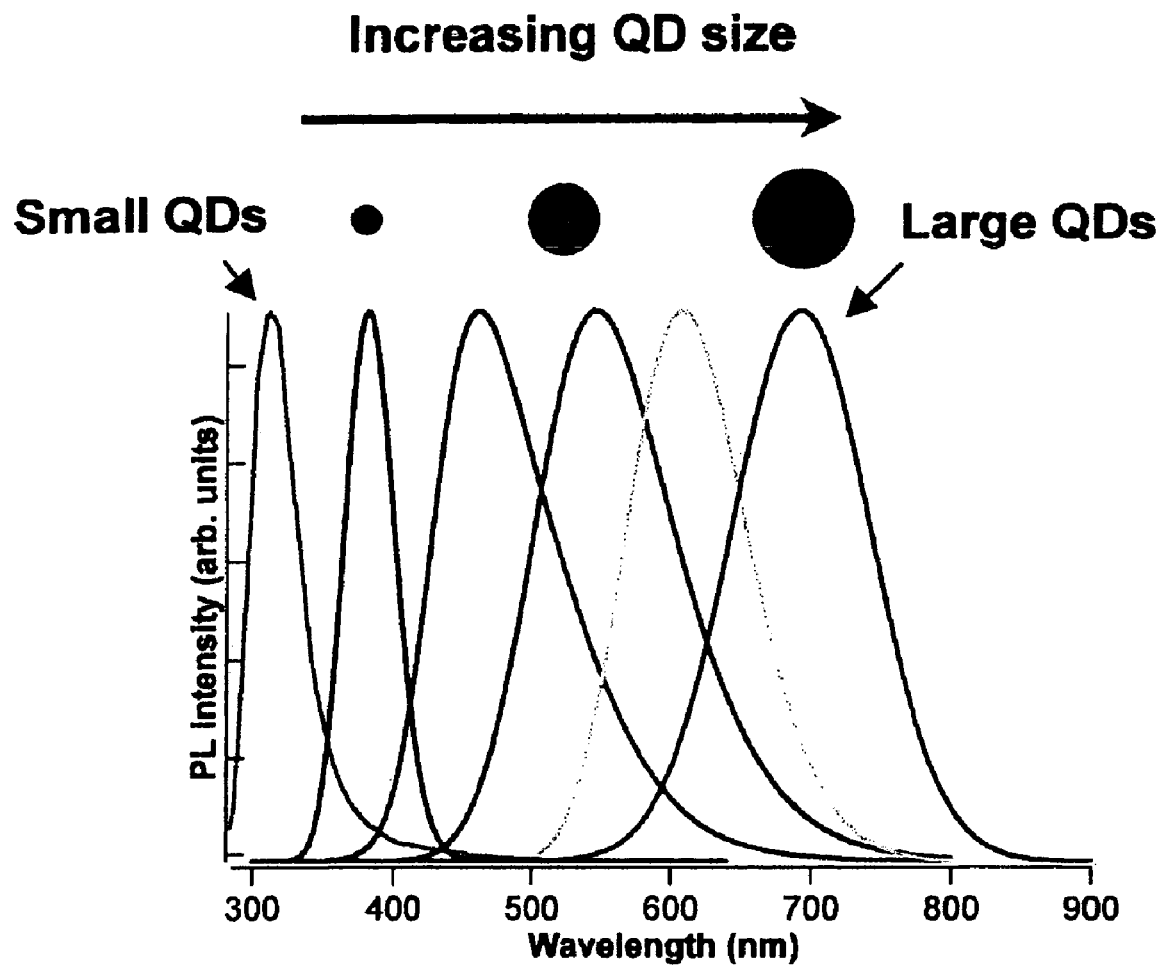
FIG. 3 illustrates photoluminescence (PL) spectra from six samples with different sizes of silicon quantum dots, according to an embodiment of the invention.

The same effect can be seen for the emission wavelength as a function of the size of quantum dots. FIG. 3 illustrates photoluminescence (PL) spectra from six samples with different sizes of silicon quantum dots, according to an embodiment of the invention. The silicon quantum dots were made as described herein and include shells formed of an oxide. The vertical axis represents a normalized PL signal, and the horizontal axis represents the emission wavelength. The PL spectra illustrated in FIG. 3 is obtained by optically exciting the silicon quantum dots with ultraviolet light. The wavelength of the optical excitation is shorter than the wavelength at the absorption edge of the silicon quantum dots. FIG. 3 demonstrates the range of sizes that can be made with the methods described herein. The quantum dots shown at the top of FIG. 3 are not drawn to scale and are meant to illustrate the relative size of the quantum dots responsible for the PL spectra. FIGS. 2 and 3 demonstrate the unprecedented control that can be obtained over absorption and emission characteristics of the silicon quantum dots.

Through a series of relations called the Kramers-Kroenig equations, the properties of refractive index and dielectric constant can be related to absorption. As such, size-dependent control of absorption allows control of refractive index.

Figure 4A:
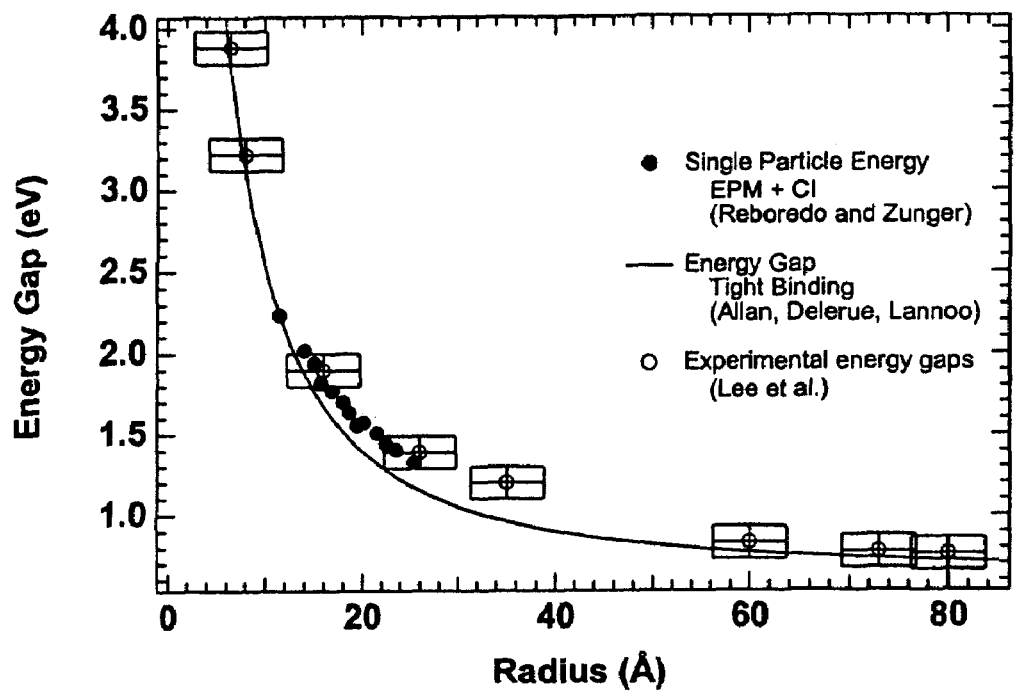
FIG. 4(a) illustrates the energy gap of quantum dots fabricated from germanium plotted as a function of the size of the quantum dots, according to an embodiment of the invention.
Figure 4B:
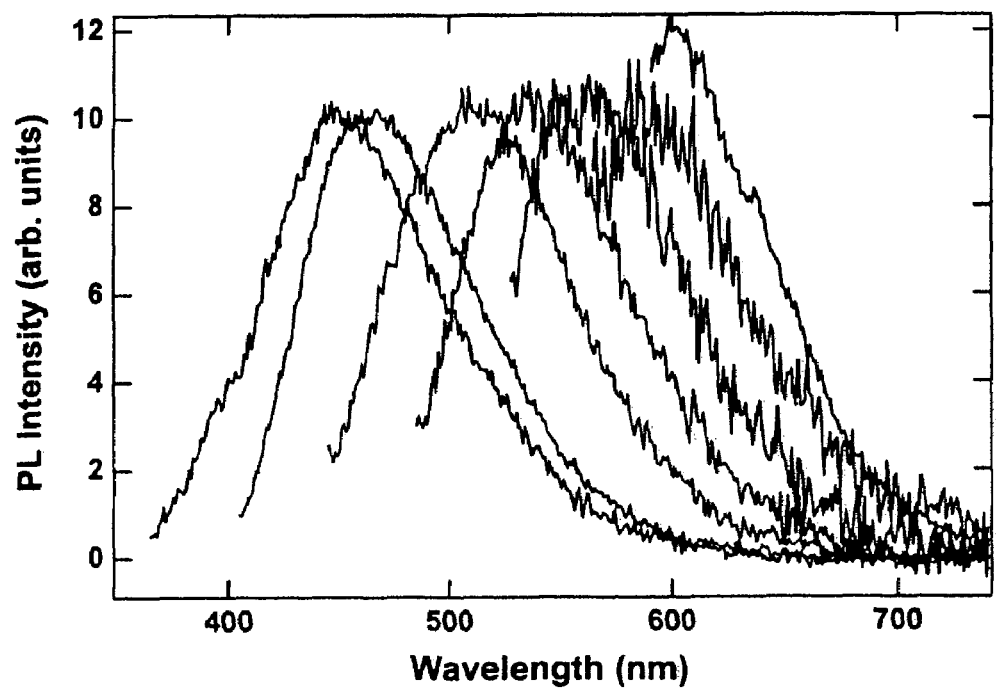
FIG. 4(b) illustrates size-selective photoluminescence (PL) spectra for different sizes of germanium quantum dots, according to an embodiment of the invention.

In addition to the size of a quantum dot, the optical and electronic properties are also strongly influenced by the material from which it is fabricated. Quantum confinement effects represent a modulation of the bulk properties of the material. As such, any changes resulting from a reduction in size are made relative to the bulk properties of the material. By selecting (e.g., independently selecting) the appropriate combination of quantum dot size and material, an even greater control of the optical and electronic properties of a quantum dot is provided. As an example, FIGS. 4(a) and (b) show the size dependent absorption and emission of germanium quantum dots, which differ from those of silicon quantum dots, according to an embodiment of the invention. The germanium quantum dots were made as described herein. In FIG. 4(a), the vertical axis represents the energy gap of the germanium quantum dots, and the horizontal axis represents the size of the germanium quantum dots. The observed values for the energy gap (open dots with error bars) are compared against theoretical predictions (solid dots and solid line). In FIG. 4(b), a size-selective PL spectrum is shown, where the vertical axis represents a normalized PL signal, and the horizontal axis represents the emission wavelength. The far right curve is offset vertically for clarity. The PL spectra shown in FIG. 4(b) are collected using different excitation wavelengths, such that only quantum dots with energy gaps less than or equal to the photon energy of the excitation light (i.e., greater than a certain quantum dot size) are excited.

Relation of Size and Material to Dielectric Constant and Index of Refraction

For most materials, the index of refraction far from resonance decreases as the energy gap of the material increases (a consequence of the Kramers-Kroenig equations). This explains, for example, why the index of refraction of transparent materials (e.g., silica, metal halides, and organics) is less than that for inorganic semiconductors with smaller relative absorption energies. This effect also typically applies to quantum dots. In this case, as the size of the quantum dot decreases, the energy gap increases, decreasing the index of refraction. Thus, for quantum dots, the off-resonant index of refraction (at a fixed wavelength) typically correlates with size, affording another method to control the optical properties of the quantum dots.

Figure 5A:
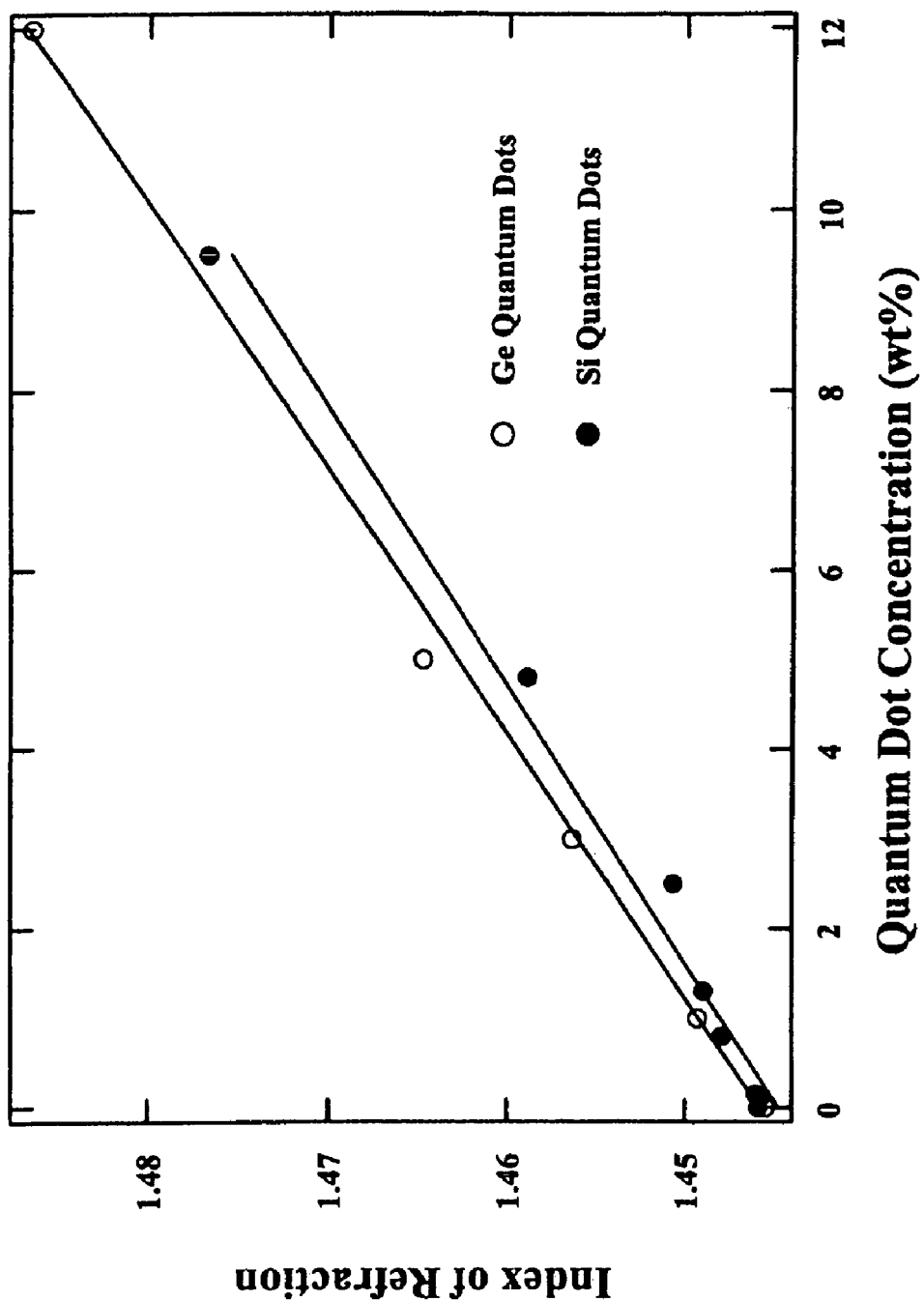
FIG. 5(a) illustrates concentration dependence of the linear index of refraction of engineered nonlinear nanocomposite materials doped with silicon and germanium quantum dots, according to an embodiment of the invention.

Relation of Concentration of Quantum Dots to Dielectric Constant and Index of Refraction Embodiments of the invention involve altering the index of refraction of a material by varying the concentration of quantum dots in the material. An example of this is shown in FIG. 5(a), which illustrates concentration dependence of the linear index of refraction of engineered nanocomposite materials doped with silicon and germanium quantum dots, according to an embodiment of the invention. The silicon and germanium quantum dots were made in accordance with the methods described herein. The index of refraction is plotted as a function of the quantum dot concentration expressed in weight percent. In this figure, the index of refraction is measured in the visible range (sodium D line).

This concentration dependence provides yet another method of controlling the overall refractive index of a material by utilizing the properties of quantum dots. The ability to embed quantum dots into a variety of host materials will be discussed in a later section.

Nonlinear Optical Properties

In general, a wide variety of nonlinear optical phenomena can arise when materials are exposed to high-intensity light. Some of these nonlinear phenomena are used in certain aspects of telecommunications (e.g., Raman amplifiers) and many are being considered for future use (e.g., four-wave mixing, cross-phase modulation, and solitons). Although nonlinear phenomena are typically associated with high-intensities, these phenomena are also observed at lower intensities due to phase matching, resonant enhancement, and/or long interaction lengths.

Light incident on a material can induce a polarization (P), which can be expressed as (in SI units)

$$P = \epsilon_0 \chi E = \epsilon_0 [\chi^{(1)} E + \chi^{(2)} E \times E + \chi^{(3)} E \times E \times E + \ldots],$$

where E is the electric field strength, $\epsilon_0$ is the electric permittivity, $\chi$ is the overall optical susceptibility, and $\chi^{(n)}$ is the nth order optical susceptibility. Since $\chi^{(2)}$ phenomena are typically only present in materials that lack inversion symmetry (e.g., non-centrosymmetry), certain embodiments of the invention primarily exploit $\chi^{(3)}$ phenomena, which can be exhibited by all materials. It should be recognized that tensor elements of $\chi^{(3)}$ are in general complex quantities. The induced refractive index change $\Delta n$ and the nonlinear index of refraction $\gamma$ are related to the real part of appropriate tensor elements of $\chi^{(3)}$, e.g., $\text{Re}[\chi^{(3)}_{1111}]$, while the two-photon absorption coefficient $\beta$ is related to the imaginary part of appropriate tensor elements of $\chi^{(3)}$, e.g., $\text{Im}[\chi^{(3)}_{1111}]$). In particular, certain embodiments of the invention exploit phenomena that change the index of refraction of a material by creating an effective optical susceptibility $$\chi_{\text{eff}} \chi^{(1)} + \chi^{(3)} E \times E = \chi^{(1)} + \chi^{(3)} I,$$

where I is the intensity of the particular light beam creating the effective optical susceptibility (and where the higher order terms are assumed to be small and are therefore neglected here, although they can be utilized as well), which can affect the same light beam or another light beam at the same or different frequency. This leads to an effective or overall index of refraction given by $$n(\omega') = n_0 + \gamma(\omega', \omega) I(\omega),$$

and an operational definition for a nonlinear index of refraction $\gamma$ given by $$\gamma(\omega', \omega) = \frac{n(\omega') - n_0}{I(\omega)}$$

where $n(\omega')$ is the effective index of refraction at $\omega'$, $n_0$ is the low-intensity refractive index (e.g., the linear index of refraction), and $I(\omega)$ is the intensity of light with optical frequency $\omega$ that creates the effective optical susceptibility or index change. The nonlinear index of refraction $\gamma(\omega',\omega)$ is related to $\chi^{(3)}_{ijkl}(-\omega', \omega', \omega, -\omega)$, e.g., $\chi^{(3)}_{1111}(-\omega', \omega', \omega, -\omega)$. If only one light beam is involved, then $\omega'$ can be set equal to $\omega$. If two light beams are involved, then $\omega'$ and $\omega$ can be the same or different. Situations where $\omega'$ and $\omega$ are the same can correspond to degenerate conditions (which is further discussed herein), in which case the nonlinear index of refraction $\gamma$ can be referred to as a degenerate nonlinear index of refraction (or $\gamma_{deg}$) Situations where $\omega'$ and $\omega$ are different can correspond to non-degenerate conditions (which is further discussed herein), in which case the nonlinear index of refraction $\gamma$ can be referred to as a non-degenerate nonlinear index of refraction (or $\gamma_{nondeg}$). As one of ordinary skill in the art will understand, an optical frequency of a light beam (e.g., $\omega$ or $\omega'$) is inversely related to a wavelength of the light beam (e.g., $\lambda$ or $\lambda'$).

This intensity dependent refractive index $n(\omega')$ can be exploited for all-optical switching and optical signal processing. For certain applications, nonlinear absorption processes are of particular importance, in which case, optimization of $\text{Im}[\chi^{(3)}_{ijkl}]$ is preferred.

Nonlinear Optical Properties of Quantum Dots

In general, three mechanisms are principally responsible for $\chi^{(3)}$ nonlinearities in quantum dots. These effects fall into the broad categories of resonant, nonresonant, and near-resonant effects. These categories can be further subdivided into degenerate (e.g., all light beams have the same wavelength) and non-degenerate (e.g., one or more light beams have different wavelengths) cases.

1) Resonant Effects:

Resonant processes typically result from a change in electronic properties upon resonant excitation (e.g., the linear absorption of light). This leads to a corresponding change in refractive index, following the Kramers-Kroenig relations. The magnitude of an absorption change, and hence the optical nonlinearity, is directly related to the ground state absorption cross-section modified by any excited state absorption. In the case of a material with discrete states, such as molecules or quantum dots, the optical nonlinearity results from state-filling and is related to $(\sigma_g - \sigma_e)$ where $\sigma_g$, and $\sigma_e$, are the absorption cross sections of the material in the ground and excited states respectively, with a reduction in refractive index occurring for a reduction in absorption. For quantum dots, further enhancement of $\chi^{(3)}$ results from unique physical phenomena such as quantum confinement, local electric field effects, and quantum interference effects.

As indicated above, the optical nonlinearity is related to $(\sigma_g - \sigma_e)$, so that increasing the oscillator strength of optical transitions from the ground state generally increases the optical nonlinearity. In the case of quantum dots, a decrease in size increases the spatial overlap of the electron and hole wave functions, which in turn increases the oscillator strength. Resonant nonlinearity therefore tends to increase with decreasing size. This enhancement, however, can be limited by any size dispersion.

Another important effect arises from the presence of one or more defects in a quantum dot. Defects can be present as trap states within the quantum dot. Due to the enormous surface to volume ratio in the size range of quantum dots, most relevant traps exist on the surface. If not passivated correctly, resonant excitation of a quantum dot creates electron-hole pairs that quickly relax into these surface-states. Holes, with their relatively large effective mass, tend to trap more easily, while the electrons, with their smaller effective mass, remain largely delocalized. The result is a spatial separation of the electron and hole wavefunctions and a decrease in oscillator strength, reducing the magnitude of the resulting nonlinearity. Furthermore, by tailoring the rate of relaxation between the delocalized quantum dot states and the localized surface states, it is possible to control the response time of the resonant optical nonlinearity.

Resonant nonlinearities can be utilized in both the degenerate and non-degenerate cases with respect to the wavelength of control and data beams. In the degenerate case, the wavelength range-of-interest lies near the absorption edge. For a single beam, the absorption can be saturated, leading to an intensity dependent absorption, commonly known as saturable absorption. For degenerate control and data beams, the control beam can modulate the transmission of the data beam, leading to an optical modulator. The refractive index change caused by the absorption change can also be utilized. Due to the broad electronic absorption in semiconductors in general and quantum dots in particular, resonant nonlinearities can be observed for the case where the control beam and the data beam are non-degenerate. In this case, the control beam can be of higher photon energy, such that carriers are generated which relax (primarily via phonon emission) towards the band edge, where the absorption bleaching and/or excited state absorption can affect the data beam of lower photon energy (but still resonant).

2) Nonresonant Effects:

In contrast to resonant nonlinearities, where linear absorption of light is typically required, non-resonant nonlinearities typically do not require single-photon absorption of light. As a result, nonresonant nonlinearities are intrinsically fast since excited state relaxation is not required. However, nonresonant nonlinearities are generally smaller than resonant nonlinearities, due to the lack of strong single-photon resonance enhancement (although multi-photon resonance can be utilized to enhance the nonresonant nonlinearity).

There are three primary enhancement factors that can be utilized for nonresonant nonlinearities in quantum dots: quantum confinement, multi-photon resonance enhancement, and local-field effects. Quantum confinement provides an increase in oscillator strength due to enhanced wavefunction overlap (as described above), which enhances $\chi^{(3)}$. Multi-photon resonances can be utilized in the absence of single-photon resonances to enhance the nonresonant nonlinearity. However, multi-photon resonances can introduce unwanted nonlinear absorptive losses. For certain applications, the ideal situation is one where the relevant light beams are just below the threshold of a multi-photon resonance, thereby allowing some resonant enhancement without significant nonlinear absorption loss. Finally, local field effects can be utilized to enhance the nonresonant $\chi^{(3)}$. In particular, for a nanocomposite material in which quantum dots with dielectric constant $\in_1$ are imbedded in a matrix material with dielectric constant $\in_2$, an externally applied electric field (such as that originating from an electromagnetic light source) can be locally enhanced at the quantum dots if $\in_1 > \in_2$, with the magnitude of the enhancement related to $\Delta\in = \in_1 - \in_2$. Such a situation can arise by embedding the quantum dots in a lower index matrix material. When illuminated by light, the electric field at the quantum dots is enhanced compared to the incident external field, in turn leading to an increase in the overall nonlinear response. This enhancement increases with size of the quantum dots as the quantum dot bandgap energy decreases, resulting in an increase in dielectric constant ($\in_1$).

Nonresonant nonlinearities can be utilized in the non-degenerate case as well. In this case, the control beam can have either higher or lower photon energy than the data beam. One advantage of the non-degenerate case is that enhancement of cross-phase modulation (the control beam inducing an index change seen by the data beam) can occur without enhancement of self-phase modulation (the data beam affecting itself by the self-induced index change), which can cause some deleterious effects for telecommunications data streams.

3) Near-resonant Effects:

Near-resonant nonlinearities can be classified into two categories: degenerate (typically close to resonance) or non-degenerate (typically with one beam resonant and the other beam nonresonant). In the former case, the beams are typically very close to the resonance edge, i.e., just above, just below, or exactly at the edge of resonance, so that either no direct excitation of the material occurs through linear absorption or very little direct absorption occurs. The non-degenerate case is perhaps the more useful situation, as the refractive index change induced by resonant excitation via a control beam causes a phase change for the data beam that is below resonance (so as to minimize losses due to single- or multi-photon absorption). For example, the refractive index change due to the absorption saturation that extends to photon energies well below the absorption edge can be utilized, where carriers can be directly generated using the control beam instead of generating carriers via two-photon absorption using a high-intensity data beam. In addition, the excitation of free carriers in quantum dots due to absorption of control beam photons can lead to a refractive index change caused by other free carrier effects. For example, due to their small size, quantum dots typically intrinsically have high free carrier densities for even single photon absorption (e.g., $\sim 10^{18}$ carriers/cm$^3$ for one photon absorption in a single quantum dot). This leads to effects such as quantized Auger recombination and enhanced reflectivity (due to a large plasma frequency) at high enough carrier densities (e.g., $\sim 10^{20}$ carriers/cm$^3$).

Size Dependence

From the discussion above, the size dependence (for a given quantum dot material) of both resonant and nonresonant nonlinear processes can be derived. Typically, for resonant optical nonlinearity, the magnitude of the nonlinearity increases as the quantum dot size decreases, decreases as the number of quantum dots with traps that localize electrons or holes increases, and decreases as the size dispersion increases.

Typically, for nonresonant processes, the optical nonlinearity increases with increasing quantum dot size, increases with increasing index of refraction of the quantum dot, increases with decreasing index of refraction of the surrounding matrix material. There is the caveat that these trends may not continue indefinitely to all sizes of quantum dots but can be useful as aids in practical design considerations. By carefully tailoring the specific size of the quantum dot, resonant effects, nonresonant effects, or both, can be used to optimize the resulting nonlinear response.

Quantum Dot Material Dependence

One important consideration for a material forming a quantum dot is that, for bound electrons, the optical nonresonant nonlinearity typically depends on the energy gap of the material as $1/E_g^n$, where n typically ranges from about 4 to about 6. The nonresonant nonlinearity therefore can increase significantly as the energy gap decreases. This trend favors a combination of large quantum dot sizes and materials with intrinsically small bandgap energies. At the same time, however, the photon energy in the wavelength range-of-interest can affect the choice of material and quantum dot size in order to avoid significant linear and nonlinear absorption. Specifically, the material in the bulk form desirably should have an energy gap roughly equal to or greater than the photon energy in the wavelength range-of-interest for a data beam in order to exploit quantum confinement effects that shift the energy gap to higher energies. At the same time, to avoid significant multi-photon absorption effects, the energy gap of the material desirably should be sufficiently large that the energy gap of the resulting quantum dot is greater than two times the photon energy of the data beam photons.

For the case of nonresonant optical nonlinearities, these two concerns specify opposing trends that bracket the energy gap of the material of choice for quantum dots according to some embodiments of the present invention. The material in the bulk form desirably should have an energy gap less than this bracketed energy in order to exploit quantum confinement effects that shift the energy gap to higher energies. As an example, to avoid two-photon losses in degenerate all-optical switching components operating near 1550 nm (corresponding to a photon energy of 0.8 eV) and to also take advantage of the $1/E_g''$ behavior of the nonlinear response, the quantum dot energy gap should be less than but close to 775 nm (or greater than but close to 1.6 eV).

Enhanced Optical Properties

In addition to size-dependent spectral characteristics, quantum confinement can also result in an enhancement in the magnitude of various optical and electronic properties due to a redistribution of the density of states. Properties such as absorption cross-section and excited-state polarizability have been found to be enhanced by several orders of magnitude over bulk materials. $\chi^{(3)}$ can also be enhanced by quantum confinement, as described previously.

Additional Effects

There are many practical definitions of a figure-of-merit (FOM) that take into account the many parameters that can be important and relevant for all-optical switching. One example of such a FOM is defined as $$\frac{\Delta n}{\alpha \cdot \tau},$$

where $\Delta n$ is the induced refractive index change, $\alpha$ is the linear and nonlinear absorption coefficient, and $\tau$ is the response time of the material. For this FOM, which is particularly relevant for resonant optical nonlinearities where light absorption is used, the larger the FOM, the better will be the performance of the all-optical switching. A definition of a FOM useful for nonresonant optical nonlinearities, where ideally no or little light absorption occurs, is $2\gamma/\beta\lambda$, where $\gamma$ is the nonlinear index of refraction, $\beta$ is the two-photon absorption coefficient, and $\lambda$ is the wavelength of operation. In this case, useful all-optical switching typically occurs when FOM>1. According to some embodiments of the invention, the following effects can be important for the formation of nanocomposite materials with a FOM in a usable range for practical optical switching.

The Effect of Defects on FOM:

Defects within quantum dot materials can have a substantial negative impact on their performance as nonlinear optical materials. Defects in the core and/or surface of the quantum dot can yield direct absorption of below-bandgap photons, increasing optical losses, and decreasing the overall FOM. As a result, while $\chi^{(3)}$ may be high, the material can still be inappropriate for optical switching. The effect of defects on optical switching using quantum dots has not been previously considered as discussed herein.

One important aspect of some embodiments of the invention is that, for quantum dots to be used as a nonlinear optical material, they desirably should comprise a substantially defect-free core. In this case, the term "defect" typically refers to defects with energy below the energy gap of the quantum dot core or within the energy range of the wavelength range-of-interest. Additionally, the surface of quantum dots should be well passivated, such that there are substantially no defect states. Passivation can be accomplished, for example, through the inclusion of appropriate surface ligands in the ligand layer to bind to defect sites and remove them from the energy gap. Alternatively, or in conjunction, passivation can be achieved by applying a shell to the quantum dot core to fill or eliminate the defect sites. In this case, the shell material is preferably a material with an energy gap that is higher than that corresponding to the wavelength range-of-interest, and more preferably higher than the energy gap of the quantum dot core. Additionally, the shell desirably should be substantially defect-free or should have defects that can be eliminated through the inclusion of appropriate surface ligands.

Figure 5B:
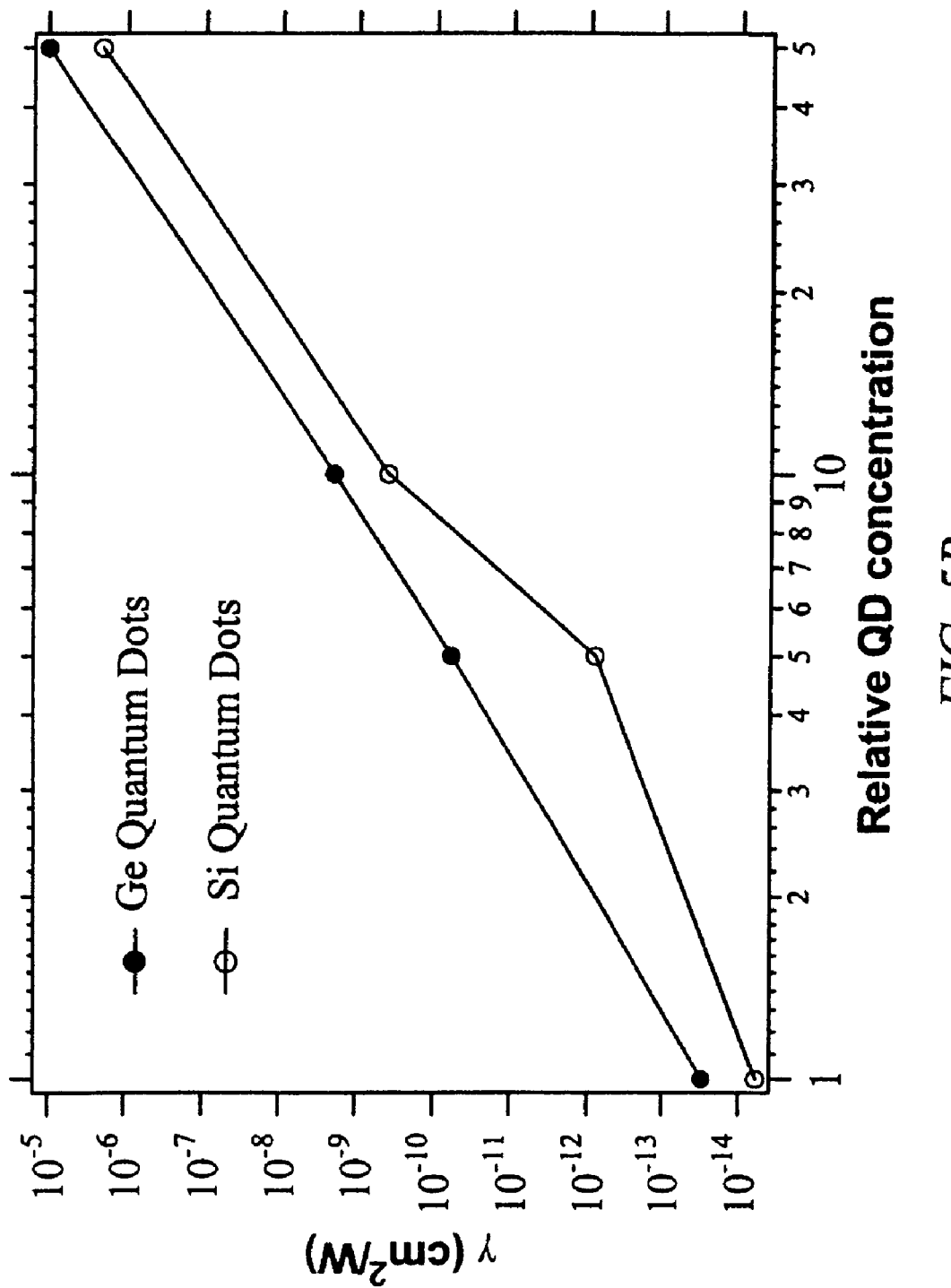
FIG. 5(b) illustrates concentration dependence of the optical nonlinearity of engineered nonlinear nanocomposite materials doped with silicon and germanium quantum dots, according to an embodiment of the invention.

Concentration Effects:

One important aspect of some embodiments of the invention is that the nonlinear properties of a material including quantum dots can be substantially affected by correlated interactions between two or more quantum dots. In particular, while $\chi^{(3)}$ can be proportional to concentration of quantum dots at low concentrations, as the concentration increases, the individual quantum dots can get close enough to interact with each other, producing collective phenomena that can further enhance nonlinearity. This effect is seen in FIG. 5(b), which illustrates concentration dependence of the optical nonlinearity of engineered nonlinear nanocomposite materials doped with silicon and germanium quantum dots, according to an embodiment of the invention. The silicon and germanium quantum dots were made in accordance with the methods described herein. The vertical axis represents the nonlinear index of refraction $\gamma$, and the horizontal axis represents the relative concentration of quantum dots in a matrix material. As shown in FIG. 5(b), $\gamma$ can increase superlinearly with concentration at sufficiently high concentrations. The effect of concentration (and particularly the superlinear concentration dependence) on optical switching using quantum dots has not been previously considered as discussed herein.

For FIG. 5(b), $\gamma$ arises as a result of nonresonant degenerate nonlinearities. The values attained for $\gamma$ are particularly large. As shown in FIG. 5(b), the nanocomposite material doped with silicon quantum dots has $\gamma$ as high as about $8\times10^{-5}$ cm$^2$/W, which is 9 orders of magnitude larger than the bulk material from which the silicon quantum dots are fabricated (bulk silicon has a nonresonant degenerate $\gamma$ of about $8\times10^{-14}$ cm$^2$/W). Additional nonlinear enhancement can be induced through the appropriate selection of molecular species in the ligand layer (see discussion below on Molecular Tethers).

Summary of Nonlinear Optical Properties of Quantum Dots

Enhancement and tunability of the optical nonlinearity in individual quantum dots and multi-quantum dot nanocomposites, combined with substantially defect free and/or well passivated quantum dot cores, provide the engineered nonlinear nanocomposite materials according to some embodiments of the current invention. Such nanocomposite materials can satisfy various characteristics for an ideal $\chi^{(3)}$ based optical material that include (but are not limited to): large $\text{Re}[\chi^{(3)}_{ijkl}]$ in the wavelength range-of-interest; a multi-photon transition that can be tuned to maximize near-resonance enhancement while minimizing optical loss due to absorption; the use of non-degenerate control and data beams where the control beam is resonant and induces a large index change at the data beam wavelength while introducing low optical loss at that wavelength; the use of degenerate control and data beams to allow cascading of devices; and low optical loss due to absorption by defects.

Colloidal Quantum Dots

Structures comprising quantum dots can be fabricated using vapor deposition, ion-implantation, photolithography, spatially modulated electric fields, semiconductor doped glasses, strain-induced potential variations in quantum wells, atomic width fluctuations in quantum wells, and a variety of other techniques. Preferably, quantum dots are formed or used in a form that can be easily incorporated into flexible or engineered optical materials or devices. In addition, it is desirable to separate the optical properties of the quantum dots from those of a matrix material to achieve a sufficiently large FOM with reduced absorption and/or scattering by the matrix material.

In a preferred embodiment, the current invention comprises colloidal quantum dots. Colloidal quantum dots are freestanding nanostructures that can be dispersed in a solvent and/or a matrix material. Such colloidal quantum dots are a particularly preferred material for some embodiments of the current invention because they can be more easily purified, manipulated, and incorporated into a matrix material.

It will be apparent to one of ordinary skill in the art that the defining characteristic for a "colloidal" quantum dot is that it is a freestanding nanostructure. The method of fabrication, size, and shape of the particular colloidal quantum dot do not bear on its classification.

Chemical Properties

Chemically Controllable Surface

According to some embodiments of the invention, a unique physical characteristic of quantum dots is that, while the core can comprise a crystalline semiconductor material, the surface can be coated with a variety of different organic and/or inorganic materials. These surface coatings (e.g., shells or ligand layers) can impart stability and chemical activity, as well as passivation of electrically and optically active defect sites on the quantum dot surface. These surface coatings are optionally substantially different in chemical nature than the inorganic core. As a result, while quantum dots can comprise primarily a highly nonlinear semiconductor material, they substantially appear to the surrounding material as surface ligands. As such, the processability and chemical stability of this highly nonlinear and tunable optical material can primarily be a function of the surface layer and not a function of the material that provides the majority of the optical characteristics.

Surface ligands are preferably bi-functional. By bi-functional, it is meant that there are at least two portions of the surface ligand such that one portion interacts primarily with the quantum dot surface, while the second portion interacts primarily with the surrounding environment (e.g., solvent and/or matrix material). These at least two portions of the surface ligand may be the same or different, contiguous or noncontiguous, and are optionally contained within two or more different molecular species that interact with each other to form the ligand layer. The at least two portions can be selected from a group consisting of hydrophilic groups, hydrophobic groups, or amphiphilic groups. The interaction of each of the at least two portions and the quantum dot or surrounding environment can be covalent or noncovalent, strongly interacting or weakly interacting, and can be labile or non-labile. The at least two portions can be selected independently or together.

In some embodiments of the current invention, the surface ligands are selected such that the portion that interacts with the quantum dot passivates defects on the surface such that the surface is made substantially defect-free. At the same time, the portion that interacts with the environment is selected specifically to impart stability and compatibility (e.g., chemical compatibility or affinity) of the quantum dot within a matrix material that is selected for a specific application. Simultaneously satisfying both of these requirements is an important aspect of certain embodiments of the current invention relating to the development of an engineered nonlinear nanocomposite material. Alternative methods of achieving these requirements include (but are not limited to): 1) Passivating the surface of the quantum dot independent of the ligand layer (e.g., using a shell or creating an intrinsically defect free surface), while the environmental compatibility is imparted by the surface ligands, or 2) imparting both passivation and environmental compatibility independent of the ligand layer. Achieving passivation of the surface of quantum dots is one advantage of using colloidal quantum dots over alternate approaches.

Through the appropriate selection of surface ligands, quantum dots can be incorporated into a variety of matrix materials such as, for example, liquids, glasses, polymers, crystalline solids, and even close-packed ordered or disordered quantum dot arrays. The resulting nanocomposite materials can be formed into homogeneous, high-quality optical films of quantum dots. Alternatively, the chemistry can be selected to allow dispersion of the quantum dots into a matrix material with a controllable degree of aggregation, forming micron or sub-micron sized clusters. The result is an increased local fill-factor and an enhanced local field effect that may further increase the nonlinear response of the nanocomposite materials of embodiments of the present invention.

An important aspect of some embodiments of this invention relates to effectively separating the optical properties of the quantum dots from the optical, chemical, mechanical, and other properties of the matrix material. In this aspect, it is possible to combine the large nonlinearities of quantum dots with the ease of handling and processability of a matrix material such as a standard polymer. Thus, this aspect provides two additional features of an ideal $\chi^{(3)}$ based optical material: physical and chemical compatibility with specific device architectures and the ability to be easily processed for incorporation.

Molecular Tethers:

In addition to conveying stability and chemical compatibility with the surrounding environment, the ligand layer can optionally be used to tailor the physical, optical, chemical, and other properties of the quantum dots themselves. In this case, it is not just the chemical nature of the surface ligand but also the interaction of the surface ligand with the quantum dot that imparts an additional level of control over the physical, optical, chemical, and other properties of the resulting nanocomposite material. We refer herein to any molecule, molecular group, or functional group coupled (e.g., chemically attached) to the surface of a quantum dot that imparts additional functionality to the quantum dot as a "molecular tether". In some cases, the molecular tether can be electrically active, optically active, physically active, chemically active, or a combination thereof. The inclusion of molecular tethers into a quantum dot structure is an important aspect of some embodiments of the present invention.

Active species are used to precisely control the electrical, optical, transport, chemical, and physical interactions between quantum dots and the surrounding matrix material and/or the properties of individual quantum dots. For instance, a conjugated bond covalently bound to the surface of one or more quantum dots may facilitate charge transfer out of one quantum dot and into another. Similarly, a physically rigid active group bound in a geometry substantially normal to the surface of a quantum dot can act as a physical spacer, precisely controlling minimum interparticle spacing within an engineered nonlinear nanocomposite material.

As described above, collective phenomena (e.g., at high concentrations) are an important aspect of some embodiments of the current invention. This aspect can be further enhanced by allowing individual quantum dots to interact with one another using molecular tethers that foster interactions between quantum dots. At sufficiently high number densities, the molecular tethers begin to make contact with molecular tethers from other quantum dots or with other quantum dots directly. This can serve to augment nonlinearity by controlling the interaction between quantum dots and thus increasing the degree of collective phenomena compared to single particle phenomena. Molecular tethers may include, but are not limited, to conducting polymers, charge transfer species, conjugated polymers, aromatic compounds, or molecules with donor-acceptor pairs. These molecular tethers can foster electron delocalization or transport and thus can increase the interaction between quantum dots. Additionally, the molecular tethers can be selected to facilitate high quantum dot number densities without the detrimental aggregation that often plagues high concentration systems.

Molecular tethers can also be selected to impart stability of quantum dots under a variety of environmental conditions including ambient conditions. Molecular tethers can optionally contain chemically active groups to allow quantum dots to be attached to polymer backbones, along with other active molecules. This provides a method for controlling the density of quantum dots within close proximity of molecules that influence a variety of functions such as carrier transport or delocalization.

An additional aspect of the present invention is the use of molecular tethers to physically connect two or more quantum dots in a 1 dimensional, 2 dimensional, or 3 dimensional structure or array. Such quantum dot superstructures can be created to initiate multiple dot quantum interference interactions or collective phenomena yielding new and useful properties such as enhanced, nonsaturating optical nonlinearities. The length and properties of these molecular tethers can be tailored to enhance or generate specific quantum phenomena. These nanostructures can have the properties of single quantum dots or an ensemble of quantum dots depending on the nature of the molecular tethers. For certain applications, more than one type of molecular tether can be used to connect quantum dots.

The quantum dots according to some embodiments of the invention exemplify microscopic conditions that enhance the nonresonant optical nonlinearity arising from local electric field effects described above. Whether the quantum dot surface is terminated with oxide or ligand layer (e.g., molecular tethers), the result is a particle (e.g., a core of the quantum dot) with dielectric constant $\in_1$ surrounded by an environment (e.g., the surface oxide layer or molecular tethers) with dielectric constant $\in_2$ where $\in_1 > \in_2$. Therefore, the enhancement of the nonresonant optical nonlinearity can be engineered by the judicious choice of oxide or molecular tether without resorting to a surrounding bulk matrix material. In other words, a single quantum dot as described in this patent should exhibit an enhanced nonresonant optical nonlinearity since the surface layer functions as a surrounding matrix material with a lower dielectric constant. Optionally, molecular tethers can be used to connect quantum dots together without a separate matrix material. In this case, an extrinsic matrix material is not required since the individual interconnected quantum dots exhibit an enhanced local electric field effect.

A preferred approach of attaching appropriate molecular tethers to a quantum dot surface can be thought of as essentially treating a quantum dot as a very large molecule (e.g., a macro-molecule) and the molecular tethers as functionalizations of this large molecule. This creates a large three-dimensional structure with enhanced nonlinear optical properties resulting from the combination of quantum effects from the quantum dot and carrier polarization and delocalization effects from the molecular tethers and from the interaction of these two effects. These properties can be tailored by the choice of molecular tethers. In addition, a quantum dot can also represent a large and stable reservoir of polarizable charge that also contributes to a large nonlinear optical response.

Macroscopic Quantum Dot Solids

Macroscopic solids can be fabricated in which quantum dots form a substantially close-packed array (e.g., a cubic closed-packed array) in the absence of an extrinsic matrix material. These "quantum dot solids" can either be crystalline, polycrystalline, or amorphous. While containing a relatively high density of quantum dots, quantum dot solids can still be easily processed since, during formation, the quantum dots can be dispersed in a solvent that is subsequently removed. Uniform solid quantum dot films, for instance, can be formed using standard spin-coating techniques as, for example, described in C. R. Kagan et al., "Long-range resonance transfer of electronic excitations in close-packed CdSe quantum-dot solids," Phys. Rev. B 54, 8633 (1996), the disclosure of which is incorporated herein by reference in its entirety. In addition, surface ligands can still be selected to impart solvent compatibility and appropriate chemical stability to the final quantum dot solid. In contrast to the interconnected material described above, these macroscopic quantum dot solids are typically not held together by molecular bonds but rather by Van der Waals forces.

High-quality optical materials can be fabricated from quantum dot solids with substantially homogeneous optical properties throughout the material. The density of quantum dots can be tuned by modifying the length and/or structure of the surface ligands. Careful selection of surface ligands can produce continuously tunable densities up to a maximum fill-factor of about 75% by volume of the quantum dot solid, preferably between about 0.005% and 75% by volume (e.g., between about 10% and 75% by volume, between about 30% and 75% by volume, between about 50% and 75% by volume, or between about 60% and 75% by volume). The surface ligands are optionally removed partially or completely by heating or chemical treatment after the quantum dot solid is formed. More specifically, the length of the surface ligands can be used to define the spacing between quantum dots. By combining the ability to create density-controlled quantum dot solids with variable density quantum dots in a matrix material, the concentration of quantum dots, and therefore the nonlinear index of refraction of the materials described herein, can be tuned over many orders of magnitude.

In the case of quantum dot solids, the surface ligands can take the place of an extrinsic matrix material according to some embodiments of the current invention. In the case of close-packed quantum dots in which the surface ligands have typically been removed, the quantum dots themselves are considered to form their own "intrinsic" matrix material. Quantum dot solids according to some embodiments of the invention can be fabricated in a variety of ways, such as, for example, described in C. B. Murray et al., "Self-Organization of CdSe Nanocrystallites into Three-Dimensional Quantum Dot Superlattices," Science 270, 1335 (1995), C. R. Kagan et al., "Long-range resonance transfer of electronic excitations in close-packed CdSe quantum-dot solids," Phys. Rev. B 54, 8633 (1996), and U.S. Pat. No. 6,139,626 to Norris et al., entitled "Three-dimensionally patterned materials and methods for manufacturing same using nanocrystals" and issued on Oct. 31, 2000, the disclosures of which are incorporated herein by reference in their entirety. Quantum dot solids according to some embodiments of the invention can be fabricated with a variety of different quantum dot materials, sizes, and size distributions. It is also possible to form mixed quantum dot solids comprising a plurality of quantum dot materials, sizes, and size distributions.

Engineerable Nonlinear Nanocomposite Materials

One embodiment of the present invention comprises an engineered nonlinear nanocomposite material that combines the large nonlinear and size dependent optical properties of quantum dots with the processability and chemical stability of a matrix material and/or a chemically controlled quantum dot surface. By separately selecting the size and material of the quantum dot, the surface ligands, the matrix material, and the density of quantum dots within the matrix material, one can independently tune various significant characteristics in designing an ideal nonlinear optical material.

In particular, this embodiment of the present invention comprises the following characteristics that, taken together, in part or in whole, provides a substantially improved nonlinear optical material over what is known in the art.

The effects of quantum confinement and the specific selection of quantum dot material is used to create extremely large optical nonlinearities, specifically $Re[\chi^{(3)}_{ijkl}]$, in the data beam wavelength range-of-interest, while the energies of single- and multi-photon absorption features are selected to minimize absorptive loss of the data beam and heating and to optimize resonant enhancement effects. This optimization can include the use of appropriately chosen non-degenerate control and data beams. Alternatively, the nonlinear absorption mechanisms can be enhanced, e.g., $Im[\chi^{(3)}_{ijkl}]$ can be optimized, depending upon the application.

The matrix material is selected, independent of the quantum dot material and size, with the desired chemical and mechanical properties to impart physical and chemical compatibility with the specific device architecture and materials as well as the process of incorporation into devices.

The surface ligands of the quantum dots are selected to facilitate homogeneous incorporation of the quantum dots into the selected matrix material and are optionally selected to facilitate controlled aggregation of quantum dots within the selected matrix material.

The density of quantum dots in the matrix material is selected to precisely tune the linear index of refraction to match the boundary conditions for a given device architecture (in the case of high-index materials, a quantum dot solid can be used).

EXAMPLE 1

This example describes a preferred embodiment in which an engineered nonlinear nanocomposite material is incorporated into a nonlinear directional coupler that utilizes non-resonant or near-resonant nonlinearities. In the current example, the waveguide core is fabricated from doped silica with an index of refraction of 1.52 at 1.55 µm. It will be recognized by one of ordinary skill in the art that doped silica can have an index of refraction over a wide range of values. The current example is not meant to limit the scope of the invention, and it will be understood that variations on this example can extend to waveguide cores with an arbitrary index of refraction.

In the case of a nonlinear directional coupler, light is evanescently coupled between two waveguide cores such that a signal entering one waveguide core oscillates between the two as a function of the interaction length. By choosing an appropriate length, the light can be coupled completely into one or the other of the two waveguide cores (i.e., the "off" state can be transmission through one or the other waveguide core by appropriate device design). By changing the index of refraction between the waveguide cores, it is possible to switch the output waveguide core from the "off" state to the other waveguide core (i.e., the "on" state) for a fixed length device. An index change from a $\chi^{(3)}$ based nonlinear material can yield extremely fast optical switching. However, so far no single material has been appropriate for a commercial optical switch based on a nonlinear direction coupler.

The active material in this optical device desirably should have a large nonlinear response in the data beam wavelength range-of-interest. It is also desirable (primarily for nonresonant nonlinearities) to maximize resonant enhancement, while simultaneously avoiding significant single-or multi-photon absorption. At the same time, the linear index of refraction of the active material desirably should be less than that of the core material and be close to that of the rest of the cladding to avoid disruption of the optical mode as light is guided into the active region.

Figure 6A:
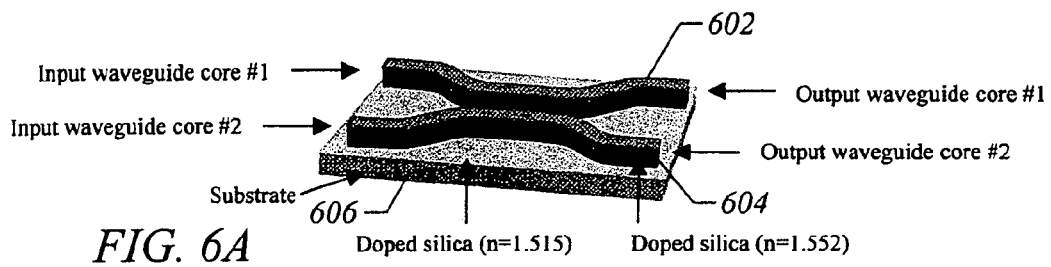
FIGS. 6(a), 6(b), 6(c), 6(d), 6(e), and 6(f) illustrate nonlinear directional couplers comprising engineered nonlinear nanocomposite materials, according to some embodiments of the invention.
Figure 6B:
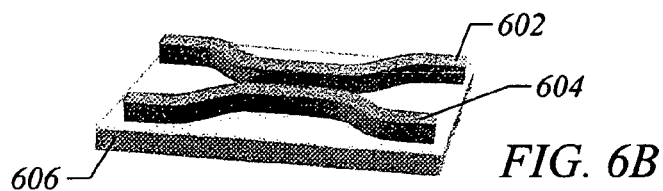
Figure 6C:
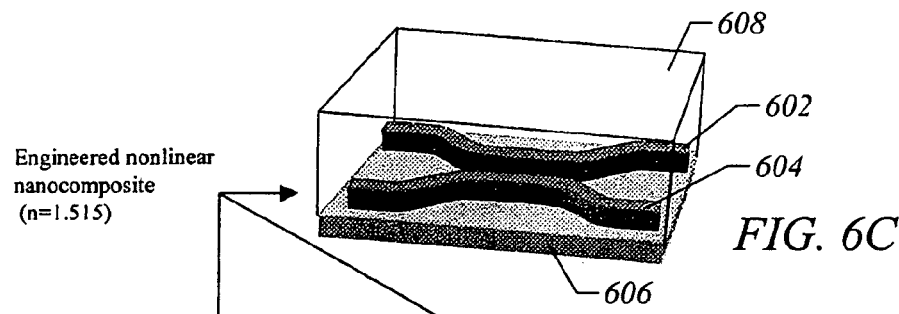
Figure 6D:
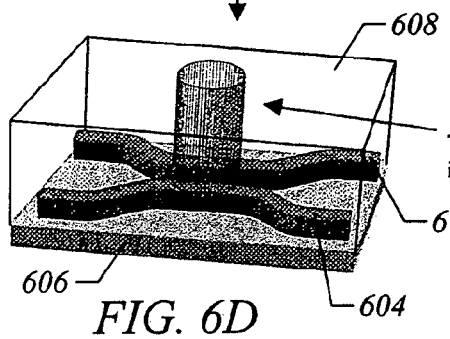
Figure 6E:
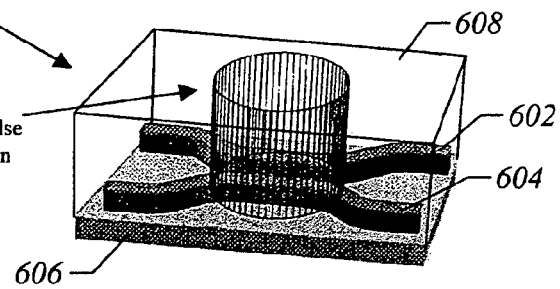

In this example, depicted in FIGS. 6(a) through 6(e), the device comprises doped silica waveguide cores 602 and 604 (n=1.552) fabricated on a doped silica substrate 606 (n=1.515). As shown in FIG. 6(b), the other three sides of the waveguide cores 602 and 604 are initially surrounded by air (n=1), as is the space between the waveguide cores 602 and 604 in the interaction region. The space around the waveguide cores 602 and 604 is then filled with an engineered nonlinear nanocomposite material 608 (n=1.515) to match the waveguide boundary conditions of the substrate 606, as shown in FIG. 6(c). By illuminating the interaction region with trigger-pulses as shown in FIGS. 6(d) and 6(e), the index of refraction between the waveguide cores 602 and 604 is changed, activating the switch.

Operation of this switch is slightly different than what is commonly described in the art. It is best understood by presupposing that the directional coupler length is chosen such that in the inactivated state, the two waveguide cores 602 and 604 exchange energy such that each output will receive substantially half of the power from each input (acting as a 3 dB coupler). If the illumination is such that the index of refraction increases in the nonlinear nanocomposite material 608, the interaction between the two propagating waveguide cores 602 and 604 will decrease, leading to a reduction in the data energy transferred between the cores 602 and 604, forcing the switch closer to a bar state. If the illumination is such that the index of refraction decreases in the nonlinear nanocomposite material 608, the interaction between the two cores 602 and 604 increases, increasing the energy transferred between the cores 602 and 604, forcing the switch closer to a cross state. One skilled in the art will recognize that this transfer function is cyclic and that further reduction of the index of refraction of the nonlinear nanocomposite material 608 will result in oscillations between the cross and bar states. If desired, the length of nonlinear directional coupler may be chosen to include several oscillations in the inactive state, leading to an effective bias in the total oscillations.

The engineered nonlinear nanocomposite material 608 for this example comprises silicon oxide coated silicon quantum dots or organic-terminated silicon or germanium quantum dots dispersed in a poly(methyl methacrylate) polymer matrix material (PMMA; n=1.49). PMMA is chosen here due to its desirable optical properties for use in the 1.55 µm range and its ease of processing in waveguide structures. Examples of these desirable optical properties include high optical transmissivity in the visible wavelength, relatively low absorption near 1550 nm, and low birefringence (as low as 0.0002 at 1550 nm has been observed).

In order to optimize degenerate nonresonant switching at 1.55 µm, silicon quantum dots with a diameter of around 4 nm are used, placing the 2-photon absorption peak at higher energy than the spectral energy range-of-interest. This is sufficient to minimize 2-photon absorption that may result in signal loss and heating, while maintaining a significant resonance enhancement at the wavelength of the trigger pulse. This particular combination of quantum dot material and size also yields a maximum in $\chi^{(3)}$ at 1.55 µm. To maximize near-resonant switching, the appropriate choice of control wavelength and quantum dot resonance at the control wavelength desirably should be chosen that minimizes or reduces absorption loss at the data wavelength.

To facilitate incorporation of the quantum dots into PMMA, the silicon or germanium quantum dots can be coated with a ligand layer comprising a long-chained hydrocarbon with a methacrylate functional group at the end. Alternatively, any functional group compatible with PMMA can be used. Quantum dots and PMMA are dissolved in an organic solvent, such as toluene, and applied to the device as shown in FIG. 6(c). The concentration of PMMA is determined based on the desired thickness of the final nanocomposite material and the method of application. In the case of spin-coating, a 5% PMMA solution is appropriate. The concentration of quantum dots is selected such that the final nanocomposite material, after deposition, has a linear index of refraction of 1.515. This is determined by calibrating the initial concentration of quantum dots (as measured by the absorption characteristics) to the final index of refraction of a PMMA-quantum dot film deposited in the method to be used. The linear index of the film can be measured using ellipsometry or the like.

After spin-coating the polymer-quantum dot solution over the device, the solvent is allowed to evaporate, leaving an engineered nonlinear nanocomposite coated device as shown in FIG. 6(c). The index of refraction around all sides of the waveguide cores 602 and 604 is matched and optimized for the specific device. At the same time, $\chi^{(3)}$ and the resonance conditions for 1.55 µm are independently tuned for optimum switching performance. As a final aspect of the current example, based on the known intensity of the trigger-pulse and the resulting nonlinear response of the engineered nonlinear nanocomposite material 608, the active length of the device is selected to provide optimal switching performance. This can be done by limiting the illumination area of the trigger-pulse to define the active area as in FIG. 6(d) or by designing the specific waveguide structure with the appropriate interaction length as in FIG. 6(e). The actual active length can be determined empirically or through simulation.

Figure 6F:
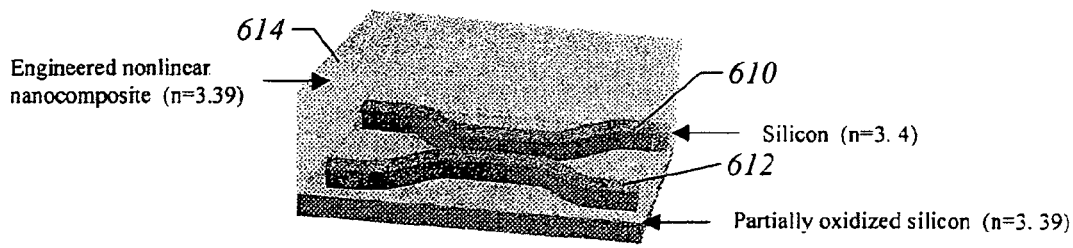

By increasing the index of refraction of waveguide cores, substantially larger concentrations of quantum dots can be incorporated into the active material while retaining functionality of the switch. This can yield substantially higher switching efficiency. For example, as shown in FIG. 6(f), with silicon waveguide cores 610 and 612 having an index of refraction of ~3.4, an active material 614 desirably should have an index of refraction equal to or less than 3.39 to achieve efficient waveguiding through the active region. This allows densities of quantum dots as high as those of close-packed quantum dot solids (either crystalline or amorphous).

EXAMPLE 2

To highlight the flexibility of embodiments of the current invention, this example describes a second preferred embodiment in which an engineered nonlinear nanocomposite material may be used in a waveguide nonlinear Mach-Zehnder (MZ) interferometer. In this case, as shown in FIGS. 7(a) through 7(f), a waveguide core is fabricated from partially oxidized silicon with an index of refraction of 2.4 at 1.55 µm. Once again, it will be apparent to one of ordinary skill in the art that partially oxidized silicon can have a range of indices of refraction, and that 2.4 is not meant to limit the scope of the invention. Variations on this example comprising other possible indices can be used depending on the specific application.

In the nonlinear MZI of the present example, a data signal traveling along a waveguide core is split into two separate and uncoupled waveguide arms with a defined phase relation between them. The signals travel along the arms for a predetermined length and are then recombined. Phase differences resulting from the propagation of the light in each arm result in constructive or destructive interference of the signals in the output waveguide core. By modulating the index of refraction of one or both of the arms, the output signal can be switched on or off by creating a relative 0- to π-phase shift between the signals. One of ordinary skill in the art will realize that further changes in index of refraction will result in cyclic exchange between the on and off states. An index change from a $\chi^{(3)}$ based nonlinear material would yield extremely fast optical switching; however, so far no single material has been appropriate for a commercial switch based on this device.

As with the example above, the active material in this device desirably should have a high nonlinear response in the wavelength range-of-interest and no significant absorption. In this case, however, the nonlinear material is incorporated directly into the waveguide core. As such, the index of refraction of the engineered nonlinear nanocomposite desirably should be greater than that of the cladding material and be close to that of the core to avoid disruption of the optical mode as light moves into the active region.

In this example, as shown in FIG. 7(a), the device comprises a partially oxidized waveguide core (n=2.4) fabricated on a silica substrate (n=1.45) and surrounded by a silica cladding on three sides. The top of the waveguide core is bounded by air (n=1). A section of one of the waveguide arms is etched away as shown in FIG. 7(b), filled with an engineered nonlinear nanocomposite material (n=2.4) as shown in FIG. 7(c) to match the boundary conditions of the waveguide core, and then polished as shown in FIG. 7(d). By illuminating the active region with trigger-pulses as shown in FIGS. 7(e) and 7(f), the index of refraction in one arm is changed, thus activating the switch. A preferred engineered nonlinear nanocomposite material for this example comprises silicon oxide coated silicon quantum dots formed into a close-packed quantum dot solid with index of refraction tuned to 2.4.

In order to optimize switching at 1.55 µm, silicon quantum dots with a diameter of 4 nm are used, placing the 2-photon absorption peak at higher energy than the spectral energy range-of-interest. This is sufficient to eliminate or reduce 2-photon absorption that may result in signal loss and potential heating of the device by the trigger-pulse. This particular combination of material and size also yields a maximum in $\chi^{(3)}$ at 1.55 µm. To maximize near-resonant switching, the appropriate choice of control wavelength and quantum dot resonance at the control wavelength desirably should be chosen that minimizes or reduces any absorption loss at the data wavelength.

In order to achieve precise index of refraction control within the waveguide arm, surface ligands desirably should be selected to yield a specific particle-to-particle spacing within the final quantum dot solid. This can be achieved by measuring the index of refraction of many thin-films, formed by the method to be used, with quantum dots comprising different types of surface ligands. By using ellipsometry or the like, the index of refraction resulting from each type of surface ligand and deposition method can be determined and calibrated for determining the optimum conditions for the final device deposition. In the case of the present example, an index of 2.4 corresponds roughly to a packing density of 70% by volume. A short-chained hydrocarbon is preferable in this case, such as a butyl- or other alkyl group.

The quantum dots, in a solvent of hexane or toluene, are spin-coated over the surface of the device, filling the open region of the waveguide arm as shown in FIG. 7(c). A slow spin speed is preferable, since the thickness of the material in the waveguide arm can be controlled by polishing the overflow off the surface (1000 rpm). The concentration of quantum dots in the solution should be high, preferably in the range of 1 nM to 1M, more preferably 10 µM to 1 mM.

After spin-coating, the solvent is allowed to evaporate, creating a close-packed quantum dot solid filling the open region of the waveguide arm as shown in FIG. 7(c). The surface is then polished to provide an optical-quality interface on the topside of the device in the active region as shown in FIG. 7(d). The index of refraction of the engineered nonlinear nanocomposite is matched to that of the waveguide core of the arm and optimized for the specific device. At the same time, $\chi^{(3)}$ and the resonance conditions for 1.55 µm are independently tuned for optimum switching performance. As a final aspect of the current embodiment, based on the known intensity of the trigger-pulse and the resulting nonlinear response of the engineered nonlinear nanocomposite material, the active length is selected to provide optimal switching. This can be done by designing the etched length of the waveguide arm to the desired active length as in FIG. 7(e) or by limiting the illumination area of the trigger-pulse as in FIG. 7(f). The specific active length can be determined empirically or through simulation.

Figure 8A:
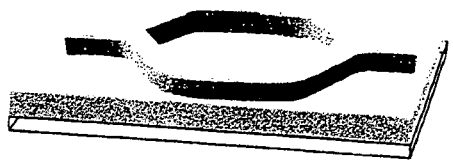
FIGS. 8(a), 8(b), 8(c), and 8(d) illustrate an alternative embodiment of a nonlinear MZ interferometer comprising an engineered nonlinear nanocomposite material.
Figure 8B:
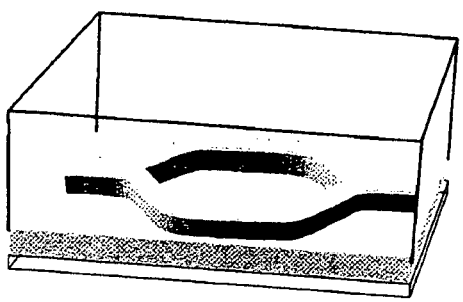
Figure 8C:
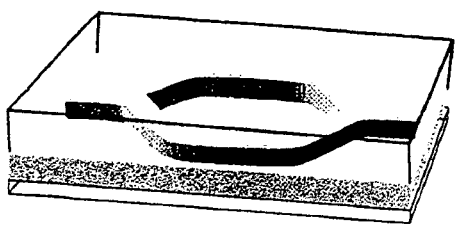
Figure 8D:
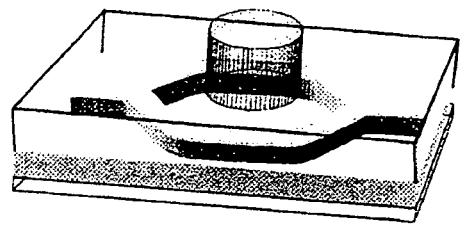

Alternatively, a nonlinear MZ interferometer can be fabricated without etching a portion of a waveguide core as shown in FIGS. 8(a) through 8(d). In this case, a engineered nanocomposite material can be simply cast on top of the entire device as shown in FIG. 8(b) with any excess removed as shown in FIG. 8(c), such that the active material is in evanescent contact with the signal passing through each of the arms (as well as elsewhere). By illuminating a portion of one or both arms, the active region can be defined as shown in FIG. 8(d). In this preferred embodiment, the engineered nonlinear nanocomposite desirably should be designed to have an index of refraction that is compatible with waveguiding in the partially oxidized silicon core (e.g., n<2.4). Again, this nanocomposite material is preferably a close-packed quantum dot solid.

Had further chemical processing steps been required in either of the above examples, it would also be possible to select the matrix material and/or surface ligands to impart stability of the engineered nonlinear nanocomposite under the required conditions.

The current embodiments not only provide a nonlinear material with a dramatically increased nonlinear response for use in these optical devices, they simultaneously provide materials that have been engineered to have optimum linear index of refraction, 2-photon absorption, near-resonance enhancement, and processability for each application. This level of independent control of optical, chemical, and mechanical properties does not exist in other materials.

Preferred Quantum Dot Materials

Preferred quantum dots according to some embodiments of the present invention comprise substantially defect free quantum dots with a well-passivated surface. Preferred quantum dots also comprise a bandgap energy that is preferably greater than the photon energy range-of-interest (e.g., for the data beam), and more preferably greater than twice the photon energy range-of-interest (primarily for nonresonant nonlinearities) for its intended applications. While maintaining these requirements, the material and size of the quantum dots can be interchangeable. The specific material and size can be selected as necessary to engineer the optical characteristics for a particular application. The following provides certain preferred characteristics according to some embodiments of the invention:

Core-shell Quantum Dots:

Core-shell quantum dots are particularly preferred because defects can result in traps for electrons or holes at the surface of a quantum dot core. These traps can degrade the electrical and optical properties of the quantum dot, yielding low-energy states within the bandgap of the material. An insulating layer at the surface of the quantum dot core provides a rise in the chemical potential at the interface, which can eliminate energy states that serve as traps. Surprisingly, these trap states can actually interfere with efficient switching or decrease the FOM of a material by contributing to single or multi-photon absorption. Additionally, shells act to physically protect the core material from chemical interactions such as oxidation, reduction, or dissolution. For instance, one embodiment of the present invention relates to the use of a shell to stabilize intrinsically unstable silicon or germanium quantum dots. Optionally, the shell can provide an appropriate chemical surface for covalent or non-covalent binding of molecules to the quantum dot, wherein the core material may or may not provide an appropriate surface for such binding.

Preferably, a quantum dot will be substantially defect free. By substantially defect free, it is typically meant that within the quantum dot there is fewer than 1 defect per quantum dot, preferably substantially fewer than 1 defect per quantum dot, more preferably less than 1 defect per 1000 quantum dots, more preferably less than 1 defect per $10^6$ quantum dots, more preferably less than 1 defect per $10^9$ quantum dots. Typically, a smaller number of defects within a quantum dot translates into an increased photoluminescence quantum efficiency. For certain embodiments of the invention, a quantum dot that is substantially defect free will typically exhibit photoluminescence with a quantum efficiency that is greater than 6 percent, preferably greater than 10 percent, more preferably at least 20 percent, more preferably at least 30 percent, more preferably at least 40 percent, and more preferably at least 50 percent.

Preferably, the core will be substantially crystalline and be substantially defect-free. By substantially defect free, it is typically meant that within the core there is fewer than 1 defect per quantum dot, preferably substantially fewer than 1 defect per quantum dot, more preferably less than 1 defect per 1000 quantum dots, more preferably less than 1 defect per $10^6$ quantum dots, more preferably less than 1 defect per $10^9$ quantum dots.

In a similar manner, the shell and/or the interface region preferably will be substantially defect free, where it is typically meant that within the shell and/or the interface region there is fewer than 1 defect per quantum dot, preferably substantially fewer than 1 defect per quantum dot, more preferably less than 1 defect per 1000 quantum dots, more preferably less than 1 defect per $10^6$ quantum dots, more preferably less than 1 defect per $10^9$ quantum dots.

Figure 9:
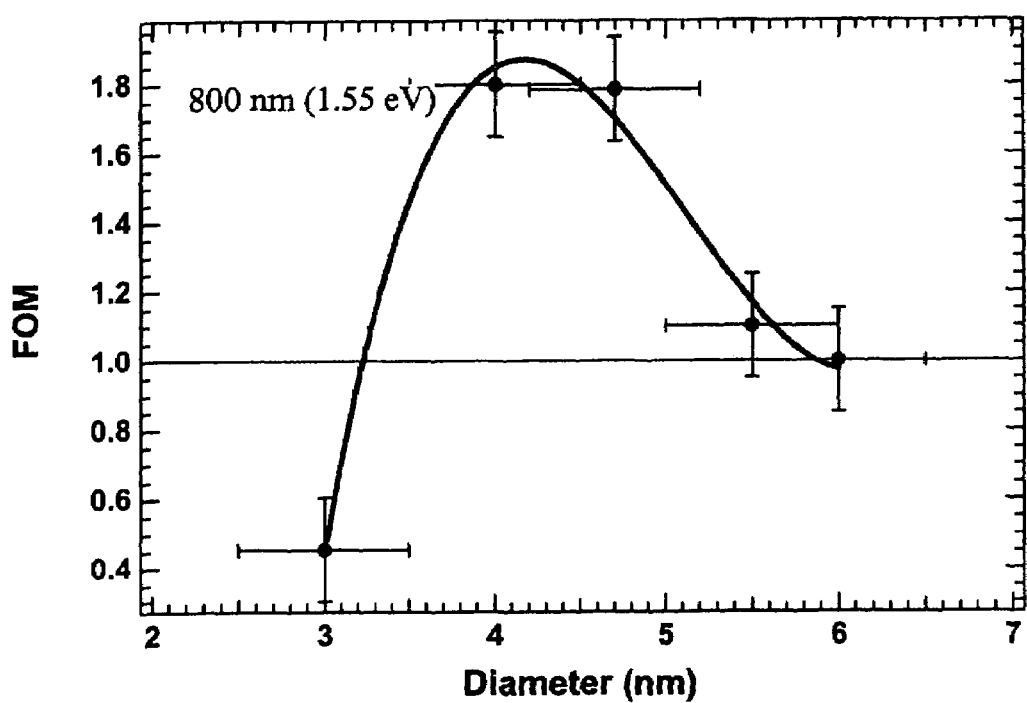
FIG. 9 illustrates a figure-of-merit (FOM) for all-optical switching with an engineered nonlinear nanocomposite material as a function of quantum dot size, according to an embodiment of the invention.

Size and Size-distribution:

Another preferred characteristic of the quantum dots of some embodiments of the present invention is such that a figure-of-merit (FOM) for all-optical switching or processing can be largely insensitive to size dispersion, contrary to results and predictions in the literature. FIG. 9 illustrates a figure-of-merit (FOM) for all-optical switching with an engineered nonlinear nanocomposite material as a function of quantum dot size, according to an embodiment of the invention. Here, the nanocomposite material includes germanium quantum dots made with methods described herein. The FOM in this case is defined as $2\gamma/\beta\lambda$, which is applicable for non-resonant nonlinearities. The criteria for effective all-optical switching is FOM>1. FIG. 9 shows how the FOM for all-optical switching depends on the size of the quantum dots. It can be seen that the FOM exceeds 1 for a large size dispersion, e.g., for diameters ranging from 3 nm to 6 nm. Similar results can be obtained with the other quantum dots described herein, e.g., silicon quantum dots. Therefore, some embodiments of the present invention avoid the need for a substantially monodispersed size distribution of quantum dots while substantially improving switching characteristics and efficiency over previous uses of quantum dots as nonlinear materials. The effects of size distribution and specifically how the FOM of switching depends on the quantum dot size has not been previously considered in detail.

Shape and Shape Distribution

Quantum dots can be fabricated in a variety of shapes, including (but not limited to) spheroids, rods, pyramids, cubes, and other geometric and non-geometric shapes. For shapes that are not spherically symmetric, a distribution of orientations can result in an effective broadening of the size distribution as seen by incident light. To avoid the need for orientation of quantum dots within a matrix material, the preferred quantum dot shape is spherical, according to some embodiments of the invention. Spherical quantum dots are also preferred for nanocomposites comprising oriented quantum dots. Alternatively, another preferred embodiment comprises spheroid or substantially spherical quantum dots, with an aspect ratio restricted to between 1±(% size distribution) or with an aspect ratio between approximately 0.8 and 1.2. In this case, orientation plays an insignificant role in the inhomogeneous broadening of the spectral features. For similar reasons, the preferred quantum dot will also be substantially monodisperse in shape. These considerations regarding the importance of shape and/or shape-distribution constitute an improvement in the use of quantum dots as a nonlinear material.

It should be recognized that an arbitrary shape may still be preferred as long as the relative orientation dependence of the broadening of the linear and nonlinear optical properties is less than the broadening resulting from the size distribution of the quantum dot sample.

Crystal Structure of the Core

For reasons similar to those described above for shape, preferred quantum dots according to some embodiments of the invention will have a core with a crystal structure that is spherically symmetric, more preferably a cubic or diamond crystal structure. Alternatively, the crystal structure may be non-spherically symmetric, preferably cylindrically symmetric, more preferably a wurtzite crystal structure.

It should be recognized that an arbitrary crystal structure may still be preferred as long as the relative orientation dependence of the broadening of the linear and nonlinear optical properties is less than the broadening resulting from the size distribution of the quantum dot sample. Once again, the considerations described here regarding the importance of crystal structure constitute an improvement in the use of quantum dots as a nonlinear material.

Semiconductor Materials

There are a variety of preferred quantum dot materials for some embodiments of the current invention. For any given application, the preferred materials can be determined based on the specific optical requirements for that application. Examples of such preferred materials include but are not limited to inorganic crystals of Group IV semiconductor materials including but not limited to Si, Ge, and C; Group II-VI semiconductor materials including but not limited to ZnS, ZnSe, ZnTe, ZnO, CdS, CdSe, CdTe, CdO, HgS, HgSe, HgTe, HgO, MgS, MgSe, MgTe, MgO, CaS, CaSe, CaTe, CaO, SrS, SrSe, SrTe, SrO, BaS, BaSe, BaTe and BaO; Group III-V semiconductor materials including but not limited to AlN, AlP, AlAs, AlSb, GaN, GaP, GaAs, GaSb, InN, InP, InAs and InSb; Group IV-VI semiconductor materials including but not limited to PbS, PbSe, PbTe, and PbO; mixtures thereof; and tertiary or alloyed compounds of any combination between or within these groups, including but not limited to GeSe, SnS, SnSe, PbS, PbSe, PbTe $ZnGeAs_2$, $ZnSnP_2$, $ZnSnAs_2$, $CdSiAs_2$, $CdGeP_2$, $CdGaAs_2$, $CdSnP_2$, and $CdSnAs_2$.

Quantum dots of many semiconductor materials can be fabricated, at least in part, using a variety of methods. Some preferred synthetic methods include those described for Group III-V and Group II-VI semiconductors as described in U.S. Pat. No. 5,990,479 to Weiss et al., entitled "Organo Luminescent semiconductor nanocrystal probes for biological applications and process for making and using such probes" and issued on Nov. 23, 1999; U.S. Pat. No. 5,262,357 to Alivisatos et al., entitled "Low temperature thin films formed from nanocrystal precursors" and issued on Nov. 16, 1993; U.S. Pat. No. 5,505,928 to Alivisatos et al., entitled "Preparation of III-V semiconductor nanocrystals" and issued on Apr. 9, 1996; C. B. Murray et al., "Synthesis and characterization of nearly monodisperse CdE (E=sulfur, selenium, tellurium) semiconductor nanocrystallites, "*J. Am. Chem. Soc.* 115, 8706 (1993); and in the thesis of C. Murray, "Synthesis and Characterization of II-VI Quantum Dots and Their Assembly into 3-D Quantum Dot Superlattices" (Massachusetts Institute of Technology, Cambridge, Mass., 1995), the disclosures of which are hereby incorporated in their entireties by reference.

The fabrication of some types of shells on quantum dots can be performed using a variety of methods. Preferred methods include those described in X. Peng et al., "Epitaxial Growth of Highly Luminescent CdSe/CdS Core/Shell Nanocrystals with Photostability and Electronic Accessibility," *J. Am. Chem. Soc.* 119, 7019 (1997) and B. O. Dabbousi et al., "(CdSe)ZnS Core-Shell Quantum Dots: Synthesis and Characterization of a Size Series of Highly Luminescent Nanocrystallites," *J. Phys. Chem. B* 101, 9463 (1997), the disclosures of which are hereby incorporated by reference in their entirety.

Two preferred materials for use in quantum dots are silicon and germanium, according to some embodiments of the invention. Both Si and Ge have bulk energy gaps that are less than 1.6 eV, making them ideal materials from which to fabricate quantum dots that exploit quantum confinement to enhance optical nonlinearities at telecommunications wavelengths (where photon energies are typically ~0.8 eV). The ideal chemistry of Group IV materials (as discussed below) further solidifies these choices.

In addition, the electron affinity or ionization potential of Group IV materials (e.g., Si and Ge) makes them amenable to forming strong and stable covalent bonds with organic and inorganic surface ligands, making them ideal for this purpose and for enabling quantum dots that are stable in ambient as well as reasonably extreme environmental conditions. The significance of this capability can be better appreciated by recognizing that the surfaces of quantum dots comprised of more ionic materials often require surfactants or ionic species to cap, which involves less preferable and weaker van der Waals bonds, hydrogen bonds, or ionic bonds. Examples of these more ionic quantum dot materials include Group II-VI materials such as CdSe. These more ionic quantum dots often require complex processing to modify the ionic quantum dots so as to enable the more desirable covalent bonding between the quantum dot surface and surface ligands, e.g., a surface layer or layers comprised of a material different than the core quantum dot material typically needs to be added to the ionic quantum dot surface, wherein the attached surface layer or layers are amenable to covalent bonding to surface ligands. An example of such a surface layer is one comprised of CdS.

In addition, the chemical properties of Group IV materials (e.g., Si and Ge) are such that a stable oxide can be formed that serves to confine carriers and to passivate the surface to mitigate surface traps.

In addition, the Bohr exciton is relatively large in Ge (~12 nm), thus providing a large size range over which the beneficial effect of quantum confinement, as discussed in various sections herein, are relevant.

A Novel Quantum Dot Material

In one embodiment, the quantum dots are silicon quantum dots or germanium quantum dots that are surface passivated (or terminated) with an inorganic layer (such as oxides of silicon and germanium) and/or organic and/or inorganic surface ligands, herein sometimes referred to as SiQDs and GeQDs, respectively. SiQDs and GeQDs as described herein are novel types of quantum dots that show definitive quantum confinement effects as manifested by size dependent properties such as size-dependent energy gaps that can be tuned over a very broad range and in particular from the near infrared to the near ultraviolet. In addition, SiQDs and GeQDs are stable under a variety of environmental conditions including ambient (e.g., pressure: ~1 atmosphere; Gases: ~70% nitrogen, ~30% oxygen; Temperature: ~20-25° C.) for desired periods of time depending on the specific application. A SiQD and a GeQD can be comprised of a substantially Si core for a SiQD and a substantially Ge core for a GeQD. In addition, the "surface" of the SiQD can be comprised of Si and inorganic elements such as oxygen and/or organic ligands (R). In addition, the "surface" of the GeQD can be comprised of Ge and inorganic elements such as oxygen and/or organic ligands (R).

In one embodiment of the invention, a SiQD comprises a substantially defect free silicon crystal core of diameter between approximately 1 nm and 100 nm, preferably between approximately 1 nm and 20 nm, more preferably between approximately 1 nm and 10 nm, while a GeQD comprises a substantially defect free germanium crystal core of diameter between approximately 1 nm and 100 nm, preferably between approximately 1 and 50 nm, more preferably between approximately 1 and 20 nm. In the case of an inorganic shell surrounding the silicon or germanium core, this shell typically has a thickness of between approximately 0.1 and 5 nm. One preferred inorganic shell is $SiO_n$ for SiQD and $GeO_n$ for GeQD with n ranging between approximately 0 and 2, preferably ranging between approximately 1.5 and 2, most preferably ranging between approximately 1.8 to 2. The chemical composition of the shell (e.g., relative amounts of Si (or Ge) and O) is potentially varying continuously through a portion of the shell and optionally varying discontinuously through a portion of the shell, in which case n can represent an averaged value within the shell. In the case of organic surface ligands terminating the surface, the SiQD and GeQD can comprise ligand layers comprising organic molecules with a structure R. R can be any one of a variety of hydrophobic, hydrophilic, or amphiphilic molecules (a list of preferred surface ligands is included below). The surface ligands can provide a surface coverage of available silicon (or germanium) and oxygen binding sites at the surface to provide between approximately 0% and 100% surface coverage, preferably between approximately 20% and 100% surface coverage, more preferably between approximately 50% and 100% surface coverage, more preferably between approximately 80% and 100% surface coverage, with a maximum of one or more complete layers of surface ligands. R can optionally comprise a plurality of different organic molecules at a plurality of absolute and relative densities. Finally, a SiQD or GeQD may optionally comprise additional R-groups that do not interact directly with the quantum dot surface, but rather indirectly through other R-groups interacting directly with the surface. In this case, surface coverage greater than 100% is possible.

It has long been considered that the production of an ambient-stable silicon quantum dot or germanium quantum dot with a defined oxide shell could not be achieved due to difficulties in growing a stable and trap-free surface oxide shell Thus, the SiQD and GeQD described herein represent a substantial advance.

Methods for fabricating SiQDs and GeQDs in accordance with some embodiments of the invention are discussed below. It should be noted, however, that the current invention refers to SiQDs or GeQDs synthesized by a variety of other methods in addition to those described herein. Some embodiments of the invention encompass various possible variations of composition of SiQD and GeQDs that could be made while retaining the general characteristics of a substantially crystalline Si or Ge core and a substantially noncrystalline inorganic (e.g., oxide) shell or organic ligand layer.

Method One—"Top Down" Approach

A general method for the formation of quantum dots of some embodiments of this invention involves a "top down" approach in which "bulk" material is converted to nanostructured material in the form of quantum dots. In this approach, a form of energy is applied to a form of a material from which the quantum dot is to be made. The material can be in bulk form, hence the term "top down." The material in the bulk form is preferably converted to a fine powder, preferably as fine as possible, more preferably particles in the nanometer size regime (e.g., between approximately 1 nm and 100 nm) comprised of the material from which the quantum dot is to be made. One advantage of using a fine powder is that it leads to shorter processing times to achieve the desired quantum dot. The applied energy can be in the form of, for example, acoustic or vibrational energy (e.g., sound energy), optical energy (e.g., light energy), electrical energy, magnetic energy, thermal energy, chemical energy, or any combination thereof. More precise size control of the final quantum dots can be achieved by applying more than one source of energy to the starting material. Multiple sources of energy can be applied simultaneously or they can be applied in various sequential combinations. This also leads to shorter processing times to achieve the desired quantum dot. It is believed that the applied energy fractures or breaks the starting material into smaller particles and/or "grows" the starting material into larger particles by, for example, fracturing or breaking (e.g., "consuming") the smaller particles. In essence, this method evolves the starting material into the desired nanostructured form. This results in the unique quantum dots described herein in which a stable, well-formed, substantially defect-free inorganic shell is formed on the surface of the QD, as well as a defect-free interfacial region between the core and the shell. This shell imparts a high stability to the QDs under a variety of environmental conditions including ambient. In the specific case of an oxide shell, the oxide is stable and substantially defect-free.

Specific examples of "top-down" methods of formation of quantum dots of some embodiments of this invention follow:

EXAMPLE 1

Oxide-terminated SiQDs

A powdered form of Si, from which Si quantum dots can made for some embodiments of this invention, is derived from porous silicon (PSi). A nanostructured PSi layer is removed and made into a fine powder. Energy is then applied in the form of sound energy through sonication and light energy through irradiation with a light source. The size of the SiQDs is determined by the duration and power of the sonication (with longer and higher power sonication giving rise to smaller quantum dots) and by the characteristics of the light source (with shorter wavelengths and longer irradiation times giving rise to smaller quantum dots).

The method in this example uses sonication periods sufficient to form stable and well-formed quantum dots with stable oxide surface termination that were not previously available. In addition, the method allows the size of the quantum dots to be controlled by the sonication period. In addition, the method also uses light irradiation as a means to control the size and the size distribution of the quantum dots, where shorter wavelengths of irradiation and longer irradiation times give smaller quantum dots and narrower size distributions. This light irradiation allows better control over the size and range of sizes of the quantum dots than previously available, with sizes ranging from ~1 nm to ~6 nm in diameter in one embodiment of the invention.

The result from the method of this invention is oxide-terminated SiQDs that are stable under a variety of environmental conditions including ambient. This stability results largely from the stable and substantially defect-free oxide shell and interfacial region between the core and shell.

PSi is formed using a variety of methods that include, but are not limited to, anodic electrochemical etching of p-doped or n-doped silicon as, for example, described in A. G. Cullis et al., "The structural and luminescence properties of porous silicon," *J. Appl. Phys.* 82, 909 (1997), the disclosure of which is incorporated herein by reference in its entirety. One preferred method includes starting with p-type (e.g., Boron-doped) silicon (Si) wafers comprising a plurality of orientations, with the (100) orientation being preferred. The wafer resistivity preferably ranges from 0.02 Ω-cm to 30 Ω-cm. The wafer is preferably between approximately 500-600 microns thick. Electrical contact to the wafer is made through a thin layer of metal (e.g., aluminum or platinum; preferably between approximately 100-500 microns thick) deposited on the backside of the wafer. Anodic electrochemical etching is performed on the wafer, which is placed in a solution comprising aqueous hydrofluoric acid (HF, preferably 48 wt %) and ethanol. The weight percentage of ethanol to aqueous HF ranges between approximately 0% and 60%, preferably between approximately 45% and 55%. Various conducting materials can be used as the counter electrode in which metals are an example. Examples of such metals include, but are not limited to, aluminum, copper, brass, and platinum.

The metal layer making electrical contact with the silicon wafer may optionally be protected from erosion in the acidic solution by isolating the metal layer from the solution. This can be achieved by sealing the silicon surface with a gasket such that the etching solution is substantially only in contact with the silicon side of the substrate. Alternatively, the electrode metal can be selected to be relatively inert under the selected etching conditions or can be selected with a thickness great enough to withstand the etching procedures described below.

Electrochemical etching of the Si wafer is carried out for various time durations (which can range from between approximately 2 and 200 minutes, depending on the starting parameters) using a constant current density ranging from between approximately 5 and 1000 mA/cm$^2$ with approximately 60 mA/cm$^2$ as a preferred current density and approximately 30 minutes as a preferred etching time. After etching, the surface of the Si wafer is left with a thin layer (between approximately 10 microns and 1 mm in thickness) of nanostructured material, which comprises PSi. The peak of the luminescence of the PSi ranges typically from 600 nm to 800 nm (or to greater than 0.800 nm).

The PSi is optionally rinsed with deionized water, dried under a stream of nitrogen gas, and placed in a vacuum chamber. The chamber is evacuated to a moderate pressure for several hours, preferably less than 1 Torr, more preferably less than 500 mTorr, and most preferably less than 100 mTorr. The samples are then transferred to a solvent-free environment (e.g., a drybox). The nanostructured PSi layer is then mechanically removed or scraped (which can be accomplished, for example, with a knife edge or scalpel) from the Si substrate, and the removed material is collected. The nanostructured PSi layer can also be separated from the Si wafer through a second electrochemical etching process in which low concentration HF/H$_2$O (preferably between 0.5 and 2%) and a high current density (preferably greater than 160 mA/cm$^2$) is used for a few minutes to separate the anodized and nanostructured PSi layer from the Si substrate.

After the PSi layer has been separated from the silicon substrate, the PSi is ground into a fine powder (using, for example, a mortar and pestle and/or a mechanical agitator) yielding about 25 to 40 mg of powdered PSi from a wafer surface area measuring approximately 1 inch in diameter. The peak of the PL spectra of the powder is in the red spectral region and ranges any where from 600 nm to greater than 800 nm, depending on the conditions of the electrochemistry. A solvent is then added to the powdered PSi. Preferred solvents include, but are not limited to, acetonitrile, toluene, hexane, methanol, ethanol, ethylene glycol, and water. In the case of organic solvents, the solvent may be dried over a dehydrant (e.g., calcium hydride or magnesium sulfate), distilled, and degassed prior to being added to the PSi.

The resulting mixture of PSi powder and solvent is placed in a bath and sonicated with acoustic waves or sound energy for a period of time. Although acoustic energy is being disclosed, it is to be understood that other types of energy may be used, as discussed above. The sonication can be accomplished with a variety of equipment that emits acoustic waves or vigorously agitates or shakes the powder, with an ultrasonic bath being a particularly convenient method.

The size and size distribution of the quantum dots in the mixture can be controlled by varying the duration of sonication. The precise period of time required for sonication depends on a number of factors that include the acoustic power of the sonicator, the solvent used, the initial size and size distribution of the nanostructures in the PSi powder, etc., and the characteristics of the sonication should be calibrated for the specific processing conditions used. A factor determining the optimum time duration of the sonication is the time required to achieve the desired size of the resultant quantum dots, i.e., the sonication is continued until the desired quantum dot size is reached (e.g., until cores are formed with diameters within a predetermined or desired range). Generally, the size of the quantum dots decreases as the sonication time increases, and the size of the quantum dots can be determined by the energy gap or the peak wavelength of the photoluminescence of the colloidal suspension of quantum dots. The relationship between quantum dot size and energy gap and the relationship between the PL peak wavelength and quantum dot size for silicon quantum dots were previously described with respect to FIGS. 2 and 3. Therefore, the photoluminescence spectrum of the colloidal suspension can be periodically taken during the sonication process to monitor the progress of the sonication. Typically, the PL peak wavelength shifts towards shorter wavelengths (corresponding to a shift towards smaller peak sizes) during the sonication process. Once the sonication time is calibrated for the processing conditions used to give the desired quantum dot size, this method can give very consistent results.

Another factor that can be used to determine the optimum time duration of the sonication is the time required to achieve the desired shells for the resultant quantum dots, e.g., the sonication is continued until oxide shells are formed having desired properties as discussed herein. If desired, the sonication time can be calibrated for the processing conditions used to give the desired photoluminescence quantum efficiencies.

As mentioned above, the precise relationship between sonication time and the quantum dot size that results depends on several parameters that may need to be calibrated with each specific fabrication setup and conditions. The following is an example that serves as a point of reference. With a sonication power of 80 W and with methanol as the solvent, a sonication period of 10 days resulted in oxide-terminated Si quantum dots with an average size of ~1.5-1.7 nm in diameter and emitting in the near ultraviolet-blue; a sonication period of 3 days resulted in quantum dots with an average size of ~2.5 nm in diameter and emitting in the green; a sonication period of 1 day resulted in quantum dots with an average size of ~3.6 nm in diameter and emitting in the red.

Upon removal from the ultrasonic bath, the mixture is allowed to settle and is centrifuged, and the supernatant is filtered to remove any large particles. Preferred pore sizes of the filter range between approximately 20 m and 450 nm. Filters can also be used to separate the different sizes of quantum dots. Additionally, other separation techniques such as chromatography, more specifically gel permeation chromatography or size exclusion chromatography, can be used to separate the different sizes of quantum dots. The result is a colloidal suspension of oxide-terminated Si quantum dots (SiQDs) of various sizes that are stable in a variety of environmental conditions that include ambient (room temperature, pressure, and atmosphere).

As mentioned above, more precise size and size distribution control of the final quantum dots can be achieved by applying more than one source of energy to the starting material. In one preferred method, two sources of energy are applied to the starting material. One additional preferred source of energy is light energy. In this example of a preferred method, the sample is irradiated with light during or sequentially with sonication. The light source can be a lamp (e.g., Tungsten, Xenon, or Mercury), a light emitting diode (LED), a laser, or any other light source capable of emitting light at the appropriate wavelengths, where "appropriate wavelengths" is described below. Alternatively, irradiation can be implemented during the electrochemical etching process (in which the etched surface of the Si wafer is irradiated). The size of the quantum dots that result is determined by a number of parameters including wavelength, intensity, spectral bandwidth, and duration of irradiation. Preferably, the wavelength of irradiation should be within the spectral region where the light is absorbed by at least a subset of the quantum dot sizes to be controlled. Specifically, within a size distribution of quantum dots, the longer the wavelength of the irradiation, the larger the size of the resulting quantum dots. More specifically, to achieve a specific size SiQD, the sample should be irradiated with photons of energy approximately equal to the energy gap of the desired SiQD. This effect can be accentuated by increasing the duration and/or intensity of irradiation. In particular, the size and size distribution of the quantum dots in the mixture can be controlled by varying the duration of irradiation. The optimum time duration of the irradiation is the time required to achieve the desired size and/or size distribution of the resultant quantum dots, i.e., the irradiation is continued until the desired quantum dot size is reached (e.g., until cores are formed with diameters within a predetermined or desired range) and/or until the desired size distribution is reached (e.g., until substantially monodisperse quantum dots are formed).

For any specific set of synthesis parameters, the precise relationship between irradiation wavelength, irradiation intensity, irradiation duration, and quantum dot size should be calibrated as is done in the case of the sonication method alone. This can be achieved by monitoring the energy gap or peak wavelength or spread of the photoluminescence at various times during the irradiation as an indicator of the progress toward the desired quantum dot. Typically, the photoluminescence has a peak wavelength that shifts towards shorter wavelengths (corresponding to a shift towards smaller peak sizes) and a wavelength spread that narrows (corresponding to a shift towards narrower spread in sizes) during the irradiation process.

The following serves as examples or points of reference. Simultaneously irradiating and sonicating the sample as described above for 5 days with 50 mW of laser light at 400 nm results in oxide-terminated SiQDs that luminesce in the near ultraviolet-blue spectral region; simultaneously irradiating and sonicating the sample as described above for 2 days with 100 mW of laser light at 532 nm results in oxide-terminated SiQDs that luminesce in the green spectral region; simultaneously irradiating and sonicating the sample as described above for 0.5 days with 150 mW of laser light at 620 nm results in oxide-terminated SiQDs that luminesce in the red spectral region.

The result of this "top down" approach is oxide-terminated Si quantum dots that are stable in a variety of environmental conditions, including ambient. This capability was previously thought to not be possible. This is achieved in the "top down" approach through the establishment of a stable and substantially defect-free silicon oxide shell surrounding the Si quantum dot core.

The defect-free nature of the resulting SiQDs is manifested in the quantum efficiency of the photoluminescence from these SiQDs. The presence of defects in quantum dots can trap excited carriers (electrons and holes). These trapped carriers can either nonradiatively relax, or they can radiatively recombine in a defect. Both processes lead to a low quantum efficiency for the photoluminescence from the quantum dots. Previous quantum dots formed of Si or Ge typically exhibited photoluminescence quantum efficiencies of ~1-5%. In contrast, the photoluminescence quantum efficiency of the SiQDs made with the methods of some embodiments of this invention is greater than 6%, preferably at least or greater than 10%, more preferably at least 20%, more preferably at least 30%, more preferably at least 40%, and more preferably at least 50% (e.g., as high as between approximately 50% and 60%). This represents the largest photoluminescence quantum efficiency observed for such quantum dots.

FIG. 3 shows global PL spectra of six samples of different sized oxide-terminated Si quantum dots made with the method described herein. FIG. 3 shows that the light emission can be readily tuned from the red to the ultraviolet, and as a result, the size can be readily tuned as well. And, this light emission is stable in a variety of environmental conditions including ambient.

The electronic and optical properties of these SiQDs that are made in this fashion are unique in that they show size dependent properties that are uniquely consistent with quantum confinement. The optical and electronic properties of these Si quantum dots are uniquely consistent with theoretical calculations more sophisticated than Effective Mass approaches, such as the Empirical Pseudopotential Method and the Tight Binding Method. A comparison of the size dependent energy gap calculated by these methods and with measurements taken on the SiQDs synthesized by the method disclosed herein is shown in FIG. 2. The agreement is extremely good and is the best observed for any quantum dots formed of Si.

The use of light to control the physical size or size distribution of the quantum dots in this synthetic process is a particularly novel aspect of certain embodiments of the present invention. Previous methods have typically used optical excitation not for control of the physical parameters of the quantum dots but to initiate the chemical reaction needed for quantum dot formation, i.e., to photolyze the chemical precursors. As described above, embodiments of the invention utilize optical control over the physical parameters of quantum dots in a synthetic method. This aspect is also applicable to other quantum dot synthetic procedures and is not limited to those described herein with respect to SiQDs and GeQDs.

Overall, the size and size distribution of the resulting SiQDs can be precisely controlled by varying the duration of sonication processing, the strength or intensity of the acoustic energy of the sonication device, the photon wavelength (photon energy) of irradiation, the intensity of irradiation, the spectral width of irradiation, the duration of irradiation, the size and size distribution of the starting material, and the solvent into which the starting material is incorporated. For certain embodiments of the invention, the average SiQD size can be varied from ~1 nm to greater than 6 nm with this technique. These average sizes give rise to light emission from the infrared to the ultraviolet.

Alternatively, PSi can be fabricated using n-doped Si wafers. In this case, a process similar to that described above can be followed. However, the electrochemical etching process may be performed in the dark, and the wafer desirably should be illuminated with a light source (UV light being preferred) during etching in order to generate "holes" (as opposed to electrons) needed in the etching process.

EXAMPLE 2

Oxide-terminated GeQDs

In the synthesis above, the reactants and starting materials can be replaced with their germanium counterparts for the formation of GeQDs. As shown in FIGS. 4(a) and 4(b), GeQDs of sizes ranging from 1 nm to 16 nm have been synthesized using the method according to an embodiment of the invention.

The electronic and optical properties of these GeQDs that are made in this fashion are unique in that they show size dependent properties that are uniquely consistent with quantum confinement. The optical and electronic properties of these GeQDs are uniquely consistent with theoretical calculations more sophisticated than Effective Mass approaches, such as the Empirical Pseudopotential Method and the Tight Binding Method. A comparison of the size dependent energy gap calculated by these methods with measurements taken on the GeQDs synthesized by the method disclosed herein is shown in FIG. 4(a). The agreement is extremely good and is the best observed for any quantum dots formed of Ge.

Method Two—"Bottoms Up" Approach

In another embodiment, quantum dots can be fabricated from chemical precursors. This is essentially a "bottoms up" approach in which the quantum dots can be assembled "atom-by-atom" through chemical synthesis.

The present invention provides general high yield methods of synthesizing surface-functionalized quantum dots and, in particular, methods of synthesizing soluble quantum dots of a Group IV semiconductor material in a solution at relatively low temperatures.

The methods can be described by reference to the following:

Method 2-a:

$$YX_a + \text{Reducing Agent} \rightarrow (Y)X \qquad (1)$$

$$(Y)X + \text{Capping Agent}(R) \rightarrow (Y)R \qquad (2)$$

Method 2-b:

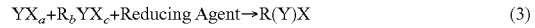
$$YX_a + R_b YX_c + \text{Reducing Agent} \rightarrow R(Y)X \qquad (3)$$

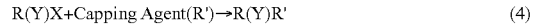
$$R(Y)X + \text{Capping Agent}(R') \rightarrow R(Y)R' \qquad (4)$$

wherein $YX_a$ is a source of Y, with Y being Si or Ge, and X is selected from the group consisting of —F, —Cl, —Br, —I, —O—CO—$R^{(1)}$, —$NR^{(2)}R^{(3)}$, —O—$R^{(4)}$, —S—$R^{(5)}$, and so forth, with $R^{(1)}$, $R^{(2)}$, $R^{(3)}$, $R^{(4)}$, and $R^{(5)}$ independently selected from the group consisting of alkyls, alkenyls, alkynyls, aryls, and so forth. The reducing agent is selected from either activated metals (e.g., Group IA, Group IIA, transition metals, and lanthanides) or hydrides (Group IIIB hydrides, Group IVB hydrides, and transition metal hydrides). Electrochemical reduction can also be used for reduction. The capping agent(R) and the capping agent(R') are sources of surface ligands R and R', respectively, and can be selected from organometallic reagents, e.g., RM (or R'M), with R (or R') being a surface ligand (e.g., a linear or branched alkyls, alkenyls, alkynyls, ether, ester, acid, amide or nitrile moiety having between 1 and about 20 carbon atoms). It should be recognized that the surface ligands R and R' can be the same or different. The capping agents can also be an alcohol, amine, thiol, and so forth. M is preferably from Group IA, Group IIIA, or Group IIB. In the above, "a" represents an oxidation state or coordination number of Y in the source of Y, which is typically 2, 4, or 6, and "b" and "c" are integers that can each range from 1 to 6. "a" is typically equal to the sum of "b" and "c". In method 2-a, (Y)X represent intermediate particles comprising cores including Y and with surfaces terminated with X, and (Y)R represent quantum dots that are formed with surfaces terminated with R. In method 2-b, R(Y)X represent intermediate particles comprising cores including Y and with surfaces terminated with R and X, and R(Y)R' represent quantum dots that are formed with surfaces terminated with R and R'.

The basic strategy involves solution phase reduction of $Si^{a+}$ or $Ge^{a+}$, where a represents the oxidation state of Si or Ge, and subsequent termination with organic or organometallic reagents. The methods according to some embodiments of the invention allow mild synthesis, precise manipulation, functionalization, and interconnection of the Group IV quantum dots to an extent not previously achieved. The key differentiations between previously used methods and the methods according to some embodiments of the invention include one or more of the following:

Some embodiments can avoid arduous procedures typically associated with the use of highly pyrophoric and air-sensitive starting materials, such as Group IV Zintl compounds or sodium metal. The Group IV Zintl salts are typically prepared by combining starting materials (e.g., K and Si) at elevated temperature (500-900° C.) in a sealed tube for a few days. As an example, a method of some embodiments of this invention uses milder and air-stable reducing agents such as magnesium (Mg), other Group IIA metals, transition metals, or lanthanides. This makes the method more amenable to scale up and large scale manufacture.

Some embodiments provide a method in which the reaction conditions are less extreme than required by previous methods. In particular, a method of some embodiments of the invention avoids the high pressure and high temperature conditions as sometimes previously used that can produce large amounts of undesirable insoluble materials.

Some embodiments need not utiltize high energy sonochemical techniques for reduction of $Si^{4+}$, which has typically produced either small amorphous particles with ill-defined surface composition or larger insoluble aggregates with an irregular network.

Some embodiments need not utilize highly toxic gaseous Group IV hydrides and pyrophoric metal hydrides.

The yields from the method of some embodiments in this invention are significantly higher than in previously reported methods. In some embodiments, the yields that can be obtained are between approximately 35% and 95%.

The size control that can be achieved is greater than previous methods.

The range of sizes possible that can be produced is greater than achievable with previously reported methods. Some embodiments allow production of different sizes of quantum dots that can give rise to infrared to ultraviolet light emission (e.g., not limited to production of smaller quantum dots that emit primarily in the blue and blue-green region).

The resultant quantum dots are not limited to certain size distributions (e.g., the size distribution control that can be achieved is greater).

Some embodiments afford quantum dots with defined surface composition and high surface coverage with surface ligands.

The resultant quantum dots are more stable than those produced from other methods and have the unique properties as described herein.

The resultant quantum dots are more crystalline than those produced from other methods.

Quantum dots can be produced with higher amounts than achievable with other methods. (e.g., in quantities of at least ten grams).

The functionalization of quantum dots using methods 2-a or 2-b allows functional group inter-conversion at the surface of intermediate particles produced in equations 1 or 3 with appropriate organic reagents in equations 2 or 4 to form ligands layers. The intermediate particles typically will comprise cores that include Y. The organic functionalization of these quantum dots imparts favorable solubility in common organic solvents and compatibility in various matrix materials such as organic polymers, inorganic polymers, gels, glasses, and the like.

Method 2-a is based on controlled chemical reduction of readily available molecular $Si^{a+}$ and $Ge^{a+}$ reagents, where a ranges from 2 to 6 and typically from 2 to 4, and the quenching of the corresponding intermediate particles (Y)X with different reagents in a reaction medium. Two suitable families of reducing agents are activated metals and hydrides. A non-aqueous reaction medium desirably should be used for the reduction of silicon and germanium reagents because of the large negative reduction potential and high oxophilicity of Group IV compounds. The controlled addition of a capping agent(R) such as RM (R=alkyl, aryl, etc. and M=Li, Na, MgA, ZnA, with A being a halogen, and so forth) to the corresponding intermediate particles at relatively low temperatures produces the functionalized quantum dots in high yield.

In a further effort to control quantum dot particles and size distributions, terminating agents, $R_bYX_c$, can be employed using method 2-b (equation 3). R group, in this method, serves as the terminating agent for the quantum dots. The ratio of $R_bYX_c$ to the $YX_a$ reagent in equation 3 can be used as a basic measure of the surface-to-volume ratio of the quantum dots. A mixture of $YX_a$ and $R_bYX_c$, in the presence of a reducing agent, yields the corresponding intermediate particles, R(Y)X, which can be treated with a capping agent(R') such as R'M to displace the remaining leaving groups, X, on the surface of the intermediate particles (equation 4). This methodology can, in principle, produce highly functionalized quantum dots.

A preferred method of this chemical synthetic method is described as follows.

A silicon source, e.g., $SiCl_4$, is reacted with a reducing agent, e.g., Mg powder, under an inert atmosphere, e.g., argon. These materials are heated together in a liquid-phase reaction medium. The reaction medium should desirably be aprotic. It can be a hydrocarbon, or it could be aromatic. It could be a cyclic or acyclic ether, an aromatic ether, or a polyether. It could contain oxygen, nitrogen, sulfur, and/or phosphorous (so long as it is compatible with the other reagents). It can include an organic solvent with various combinations of more than one hetero-atom or any combination of the solvents discussed previously. Representative solvents include alkanes such as heptane, decane, and octadecane; aromatics including benzene, tetralin, and naphthalene; and alkylaromatics such as toluene, xylene, and mesitylene; ethers such as dialkylethers, diarylethers, alkylarylethers, and cyclic ethers; and polyethers like glymes.

In this process, a Group IV source, such as providing $Si^{4+}$, $Ge^{4+}$, or $Ge^{2+}$, especially in the form of halides or with corresponding 1-20 carbon organic substituent (RA, R=organic substituent, A=O, S, N, Si, etc.), is reacted with a reducing agent, such as a Group IA compound, Group IIA compound, transition metal, lanthanide, or hydride, in liquid phase reaction medium at an elevated temperature. Representative Group IV sources include $SiF_4$, $SiCl_4$, $SiBr_4$, $SiL_4$, $GeF_4$, $GeCl_4$, $GeBr_4$, $GeI_4$, $GeCl_2$, $GeBr_2$, $GeI_2$, $SiR_4$, $Si(OR)_4$, $Si(SR)_4$, $Si(NR^{(1)}R^{(2)})_4$, $Si(O_2R)_4$, $Si(SiR)_4$, $GeR_4$, $Ge(OR)_4$, $Ge(SR)_4$, $Ge(NR^{(1)}R^{(2)})_4$, $Ge(O_2R)_4$, $Ge(SiR)_4$, $Ge(NR^{(1)}R^{(2)})_2$ as well as the dimmers and the higher oligomers of the above reagents (R, $R^{(1)}$, $R^{(2)}$=organic substituent). Representative reducing agents include Li, Na, K, Na/K alloy, Rb, Cs, Be, Mg, Ca, Sr, Ba, Sc, Ti, Zr, Mn, Fe, Co, Ni, Pd, Cu, Zn, Ce, Sm, Gd, Eu, $LiAlH_4$, $NaBH_4$, Super-hydride, L-Selectride, $RSiH_3$, $R_2SiH_2$, $R_3SiH$ (R=organic substituent), and the like. Reducing agents can be provided in a variety of forms (e.g., as a powder, a liquid, a solid, and so forth). For certain reducing agents (e.g., a Group IIA compound such as, for example, Mg), it is desirable to provide such reducing agents in a powdered form to facilitate reaction with the Group IV source. Alternatively, or in conjunction, it is desirable to provide such reducing agents in other forms such as in the form of chips, a mesh, dendritic pieces, ribbons, rods, turning or activated (e.g., "Rieke magnesium", etc.).

One or two of each of these two groups of materials are mixed together in the reaction medium (e.g., an anhydrous aprotic solvent) for at least few minutes. For some embodiments, the reaction between a source of Si or Ge and a reducing agent is performed by maintaining the reaction medium at a temperature between approximately −78° C. and 300° C., preferably between approximately 60° C. and 280° C., and at around ambient pressure (e.g., about 1 atm) for a period of time between approximately 2 and 48 hrs. For some embodiments, the reaction between Na and silicon reagents can require an elevated temperature and a prolonged period to complete. The reflux temperature of the reaction medium can be used. Elevated pressures of up to about 100 atmospheres can be used to obtain higher temperatures. Suitable temperatures range between approximately 25 and 300° C.

In an additional step in the same pot, the intermediate product, which is chemically labile, can be functionalized with organic substituents when treated with an appropriate reactive material (e.g., capping agent, surface ligands, molecular tethers, terminating agents, passivator, etc.). These reagents can be organometallic reagents, RM (R=surface ligand such as alkyl, aryl, heteroaryl, and so forth and M=Li, Na, MgA, ZnA, with A being a halogen, and so forth), alcohols, amines, amides, thiols, phosphines, oxyphosphines, acids, silanes, germanes, oxides, silanols, and germanols or their corresponding anion salts. Representative ligand sources include organolithium reagents (e.g., n-butyllithium, sec-butyllithium, tert-butyllithium, n-hexyllithium, and phenyl lithium); Grignard reagents (e.g., octylmagnesium halide, phenylmagnesium halide, and allylmagnesium halide); alcohols (e.g., ethanol, isopropyl alcohol, and phenol); amines and thiols (e.g., diethylamine, octylamine, and hexylthiol); and the like.

For some embodiments, the reaction between the intermediate particles or nanocrystallites and the source of surface ligands can require a prolonged period to complete and can require an elevated temperature. Suitable temperatures range from room temperature to about 100° C. The reaction can be completed in between approximately 2 and 100 hours at ambient temperature. Subsequent work-up affords the organically functionalized quantum dots as a powder. The subsequent work-up preferably involves the addition under an inert atmosphere (e.g. argon) of acidic water to destroy the unreacted reducing agent or the organometallic reagent. The product can be extracted with organic solvents. The solvent can be a hydrocarbon, an aromatic, or a mixed hydrocarbon fraction. It could be an ether or a polyether. It could be ester. It could contain nitrogen, sulfur, and/or halides (so long as it is not very soluble in water). Representative solvents include hexanes, decane, toluene, xylene, diethyl ethers, glyme, dichloromethane, chloroform, ethyl acetate, carbon disulfide, and the like. The extraction process desirably should be repeated several times to improve the yield.

The product is a quantum dot powder that can be isolated by removing the solvent. This can be carried out by evaporation, filtration, and the like.

The synthetic method described above is associated with yields in the range of 35 to 95%, which are significantly higher than previously obtainable. A broad range of particle sizes can be achieved, e.g., between approximately 1-100 nm.

Various factors can affect particle size, including the nature of the reaction medium, the nature of the reducing agent, the nature of the starting material, the ratio of reagents employed, concentration, temperature, and pressure employed. The reaction medium employed can play an important role in the physical properties of the quantum dot product. More particularly, coordinating solvents or agents such as oxygen or nitrogen or sulfur or phosphorous containing organic compounds tend to yield quantum dots with larger particle size. In particular, the size and the size distribution of the quantum dots can be controlled by varying the coordination ability of the solvent or the co-solvent. As to the effect of temperature, higher reaction temperatures improve the crystallinity of the quantum dots and aid in the production of bigger quantum dots. Concentration also affects the particle size, with lower concentrations tending to produce smaller quantum dots (the larger amount of solvent effectively causes better heat dispersion from the reacting species).

This invention will be further described by the following examples. These examples are not to be construed as limiting the scope of this invention, which is defined by the appended claims.

EXAMPLE 1

A 500-ml three-neck round bottom flask equipped with a stirring bar, a reflux condenser, and a thermometer was purged with argon and charged with 200 ml of the selected solvent (e.g., glymes (n=1 to 5)) and the reducing agent (e.g., magnesium powder, 0.05 to 0.20 mol). Freshly distilled $YX_4$ (0.05 to 0.20 mol) was added dropwise, and the resulting brown-reddish solution was heated to higher temperatures (e.g., between approximately 60 and 280° C.) for a period of time (e.g., between approximately 2 and 100 hrs, typically between approximately 2 and 48 hrs). The resulting mixture was cooled to about −20° C. and treated with an excess amount of the capping agent (e.g., 1.8 M solution of phenyllithium), which was added dropwise to keep the temperature below room temperature. After the reaction mixture was stirred at ambient temperature for a period of time (e.g., between approximately 2 and 48 hrs), it was quenched with dilute protic acid (pH~2) and extracted with an organic solvent (e.g., toluene). The combined organic extracts were washed with water and dried over a drying agent (e.g., sodium sulfate). The solvents were removed under reduced pressure, and traces of the solvents were removed by precipitation with a nonsolvent (e.g., pentane). After centrifugation or filtration, the product was collected and dried in a vacuum oven. The product can be purified by column chromatography (e.g., silica, $CH_2Cl_2$/methanol, 95/5).

EXAMPLE 2

The preparation of Example 1 is repeated using sodium as the reducing agent.

EXAMPLE 3

The preparation of Example 1 is repeated using barium as the reducing agent.

EXAMPLE 4

The preparation of Example 2 is repeated using a mixture of 35%/65% (by volume) diglyme/xylenes as the reaction medium.

EXAMPLE 5

The preparation of Example 1 is repeated using diphenyl ether as the reaction medium.

EXAMPLE 6

The preparation of Example 1 is repeated using tetraglyme as the reaction medium.

EXAMPLE 7

The preparation of Example 1 is repeated using n-butyllithium as the capping agent.

EXAMPLE 8

The preparation of Example 1 is repeated using 3-butenylmagnesium bromide as the capping agent.

EXAMPLE 9

The preparation of Example 1 is repeated using allylmagnesium bromide as the capping agent.

EXAMPLE 10

The preparation of Example 1 is repeated using 4-methoxyphenyllithium as the capping agent.

EXAMPLE 11

The preparation of Example 1 is repeated using pentafluorophenyllithium as the capping agent.

EXAMPLE 12

The preparation of Example 1 is repeated using perfluorohexyllithium as the capping agent.

EXAMPLE 13

The preparation of Example 1 is repeated using sodium ethoxide as the capping agent.

EXAMPLE 14

The preparation of Example 1 is repeated using silicon tetrabromide as the source of silicon.

EXAMPLE 15

The preparation of Example 1 is repeated in a sealed pressure reactor at 260° C.

EXAMPLE 16

The preparation of Example 1 is repeated using a mixture of 70%/10%/10%/10% (by molar ratio) germaniumtetrachloride/phenyltrichlorogermane/diphenyldichlorogermane/triphenylgermanium as germanium source and terminating agents, $R_bYX_c$.

Preferred Surface Ligands and Molecular Tethers

As described in the previous sections, the ligand layer can serve to passivate the surface of a quantum dot and eliminate surface defects. It also facilitates compatibility with matrix materials. This is further explained as follows. Fluoropolymers are a group of desirable materials for optical applications because of their unique properties. Fluoropolymers, in general, have low indices of refraction (e.g., in comparison with regular hydrocarbon polymers) and thus low intrinsic scattering loss. They also, in general, exhibit low absorption loss as they are typically comprised of little or no carbon-hydrogen bonds. They are hydrophobic and thus low in moisture absorption. They, in general, are chemically and thermally inert and thus compatible in demanding environments and extreme process conditions in device fabrication. Because of their inertness, fluoropolymers are nearly non-mixable with many materials, such as conventional quantum dots. Embodiments of the current invention provide a novel approach to circumvent the compatibility issue by introducing fluorinated surface ligands to the surface of quantum dots (e.g., as in Example 11 and 12 of the preceding section). The quantum dots, which are terminated with a ligand layer of fluorinated surface ligands, can now be incorporated into, for example, Cytop® brand polymer (a perfluorinated polymer from Asahi), facilitated, for example, by using a solvent vehicle, CT-SOLV 180 from Asahi.

The following are preferred surface ligands of the ligand layer, according to some embodiments of the invention. This list, which is not intended to be exhaustive, describes a number of surface ligands having desirable physical characteristics that can be used to form ligand layers for SiQDs or GeQDs. In the following, Y is Si or Ge, and Y—C, Y—O, Y—S, Y—Si, and Y—N denote covalent bonds between Si or Ge and a C atom, an O atom, a S atom, a Si atom, and a N atom, respectively. Other preferred surface ligands, not listed below, can contain a P or a Se atom that is covalently bonded to Si or Ge.

Figure 10A:
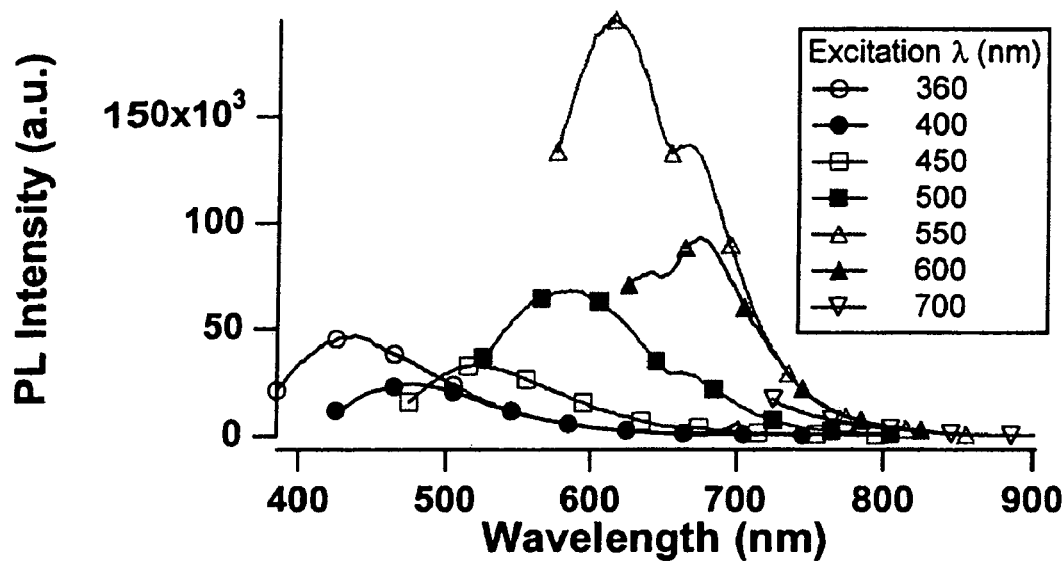
FIGS. 10(a) and 10(b) illustrate photoluminescence spectra of silicon quantum dots made in accordance with an embodiment of the invention.
Figure 10B:
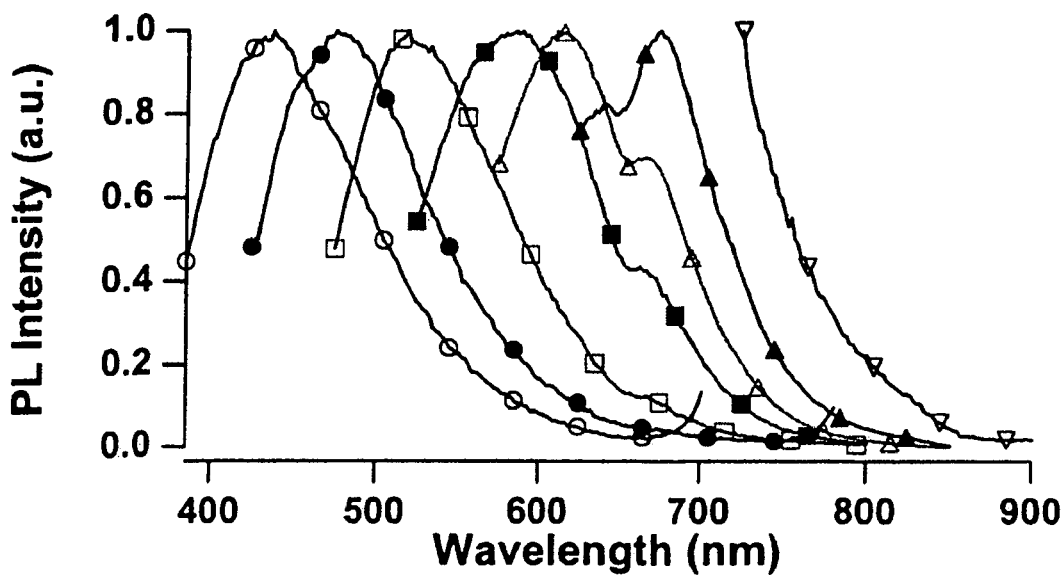
Figure 11A:
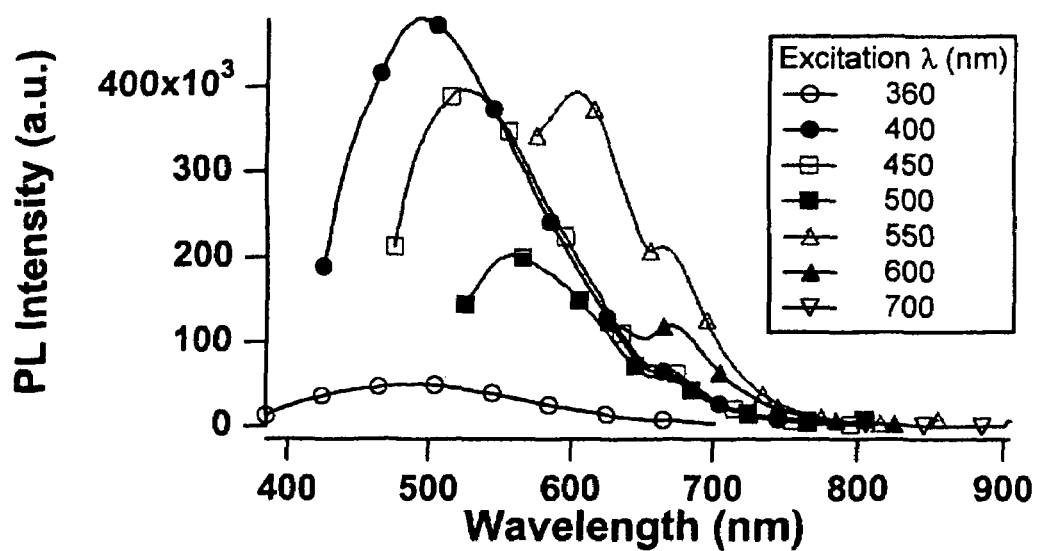
FIGS. 11(a) and 11(b) illustrate photoluminescence spectra of germanium quantum dots made in accordance with an embodiment of the invention.
Figure 11B:
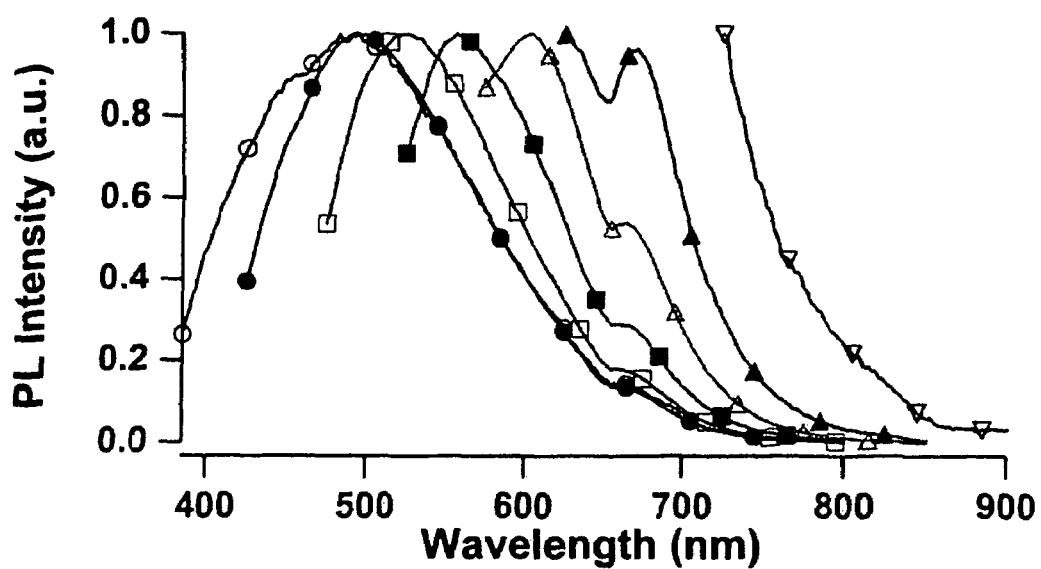

Y—C
- A) Alkyls
  - a. Simple aliphatic alkyl groups (e.g., methyl, ethyl, propyl, etc.)
  - b. Branched and cyclic alkyl groups (e.g., iso-propyl, tert-butyl, cyclohexyl, etc.)
  - c. Substituted alkyl groups (e.g., 4-cyanobutyl, 3-ethoxy-3-oxopropyl, etc.)
  - d. Perfluorinated alkyl groups (e.g., linear, branched, or cyclic)
- B) Alkenyls
  - a. Simple isolated double bonds (e.g., 1-hexenyl, 1-dodecenyl, etc.)
  - b. Substituted alkenes (e.g., 6-heptenenitrile, etc.)
  - c. Conjugated polyenes (e.g., pentadienyl etc.)
  - d. Polymerizable alkenes (e.g., allyl, 3-butenyl, 2-butenyl etc.)
- C) Alkynyls
  - a. Simple isolated alkynes (e.g., hexynyl, octynyl, etc.)
  - b. Substituted alkynes (e.g., phenylethynyl, etc.)
  - c. Polymerizable alkynyls
  - d. Perfluoro alkynyls
- D) Aromatics and Aromatic Heterocycles
  - a. Phenyls, Pyridyls, Thienyl, etc.
  - b. Substituted Aromatics and Aromatic Heterocycles
    - i. With electron withdrawing groups (nitro, nitrile, fluoro, perfluoro, carboxylate, e.g., 4-cyanophenyl, etc.)
    - ii. With electron donating groups (amino, alkoxy, e.g., 4-methoxyphenyl, etc.)
- E) Conjugated Aromatics, Aromatic Heterocycles, and Polyenes (poly is referred to well defined oligomers)
  - a. Polyenes
  - b. Poly(p-phenylene)

c. Poly (diacetylene)
d. Poly(triacetylene)
e. Poly(p-phenylene vinylene)
f. Poly(p-phenylene ethynylene)
g. Polythiophene
h. Polypyrrol
i. Polyaniline
j. Poly(phenylene sulfide)
F) Cyanide Y—O
A) Hydroxy, Alkoxy, etc.
a. Diol, triol, polyol, etc.
b. Cholesteryl group
c. Trisubstituted siloxy
B) Carboxylate
C) Phenoxy
D) Siloxy
E) Cyanate
F) Inorganic Oxides Y—S
A) Thioalkyl
B) Thioaryl
C) Thiocyanate
D) Silylthio Y—Si
A) Substituted silyl group
B) Tri-substituted silyl group with one or more functional groups Y—N
A) Amino group (e.g., linear, branched, aromatic, or cyclic)
B) Mono and di-substituted amines
C) Imino group (e.g., linear, branched, aromatic, or cyclic)
D) Silylamino FIGS. 10(a) and 10(b) show PL spectra of organic-terminated Si quantum dots, and FIGS. 11(a) and 11(b) show PL spectra of organic-terminated Ge quantum dots. The Si and Ge quantum dots were made with the methods described herein. The PL spectra show that the light emission can be readily tuned from the red to the ultraviolet by exciting quantum dots of different sizes. The PL spectra are obtained by optically exciting the quantum dots with wavelengths shorter than the wavelength at the absorption edge of the quantum dots. This light emission is stable in ambient conditions. This stability is due in large part to the relative completeness and stability of the surface termination, e.g., the surface termination and the interface between the core and the surface termination is substantially defect free. In FIGS. 10(a) and 10(b), the surfaces of the Si quantum dots are terminated with 4-methoxyphenyl groups. In FIG. 10(b), the vertical axis represents a normalized photoluminescence signal from FIG. 10(a). In FIGS. 11(a) and 11(b), the surfaces of the Ge quantum dots are terminated with butyl groups. In FIG. 11(b), the vertical axis represents a normalized photoluminescence signal from FIG. 11(a). Similar results can be seen for Si quantum dots having surfaces terminated with ethoxy groups and Ge quantum dots having surfaces terminated with methyl groups.

The electronic and optical properties of these organic-terminated SiQDs and GeQDs that are made in this fashion are unique in that they show size dependent properties that are uniquely consistent with quantum confinement. The optical and electronic properties of these SiQDs and GeQDs are uniquely consistent with theoretical calculations more sophisticated than Effective Mass approaches, such as the Empirical Pseudopotential Method and the Tight Binding Method. A comparison of the size dependent energy gap calculated by these methods with measurements taken on the SiQDs and GeQDs synthesized by the method disclosed herein show that the agreement is extremely good and is the best observed for any quantum dot formed of Si or Ge.

According to some embodiments of the invention, nanocomposite materials comprising quantum dots that are surface-terminated with various organic groups and dispersed in processable matrix materials such as organic polymers or sol-gels can exhibit new quantum phenomena. This new quantum phenomena in turn allow a large variety of new applications (such as all-optical switching) and the fabrication of device structures using low cost processing techniques (e.g., spin coating or dipping). Described herein are several novel synthetic schemes to fabricate these quantum dots and to functionalize their surfaces with molecular species that are chemically bonded to the surface for stability and robustness. Use of such functionalized quantum dots avoids the need for expensive and specialized fabrication equipment and facilities. The synthesis of these nanostructures can be readily implemented in many laboratories.

As discussed above, the value of this quantum dot nanostructure can derive from molecular tethers serving multiple functions. The molecular tethers may be active in a variety of ways, e.g., electrically, chemically, mechanically, or optically active. This enables precise control of the electrical, optical, transport, chemical, and physical interactions between quantum dots and the surrounding matrix material or the properties of individual quantum dots. These molecular tethers can be a key innovation needed to develop new devices and applications. Examples of particularly preferred embodiments of optically active molecular tethers are molecules with polarized or polarizable sections or with large polarizabilities, donor-acceptor molecules, hetero-molecules, and charge transfer molecules.

Another major innovation comes from collective phenomena resulting from nanocomposite materials that include coupled quantum systems such as coupled quantum dots. The ability to attach active molecular tethers to the quantum dot surface allows coupling quantum dots together in various one, two, and three-dimensional configurations or arrays to initiate multiple quantum interference interactions between quantum dots that may be applied towards novel devices. The length and properties of these molecular tethers can be tailored to enhance or generate specific quantum phenomena such as enhanced nonlinear optical properties. For instance, molecular tethers can provide charge transport between two or more interconnected quantum dots. For certain embodiments of the present invention, the quantum dots can be massively interconnected to an extent that is unlike previous efforts. The massively interconnected quantum dot system can be comprised of more than 2 interconnected quantum dots, preferably more than 10 interconnected quantum dots, preferably more than 1000 interconnected quantum dots, and most preferably more than $10^9$ interconnected quantum dots. For certain embodiments of the invention, the massively interconnected quantum dot system can be comprised of two or more massively interconnected quantum dot subsystems, which subsystems may or may not be connected. The quantum dots can be interconnected via the formation of chemical bonds between appropriate molecular tethers on different quantum dot surfaces. This, in turn, can be performed using the functionalization of the quantum dot surfaces as described earlier herein. After the quantum dot surface is functionalized, the interconnection can proceed via chemical reaction between surface functional groups, e.g., conjugated species, aromatics, etc. As a result of such interconnection, a large variety of nanostructures is possible:

(1) n quantum dots coupled in a linear structure or array.
(2) n quantum dots coupled in an arbitrary 2-dimensional structure or array.
(3) n quantum dots coupled in an arbitrary 3-dimensional structure or array (e.g., to produce new lattice structure and new materials with tailorable properties.).
(4) n quantum dots attached to a polymer backbone to give controllable densities of quantum dots. These quantum dots can be coupled with other species (e.g., electron donating or accepting molecules) onto the polymer backbone to generate other new phenomena and applications.

These nanostructures can have the properties of single quantum dots or an ensemble of quantum dots, which will be determined by the nature of the molecular tethers. This approach can be important for exploiting collective excitations in quantum dot systems towards innovative devices. These new nanostructures represent an important innovation in nanotechnology. Examples of particularly preferred embodiments of molecular tethers that can be used to interconnect quantum dots in this fashion and to generate controllable collective phenomena include conjugated species such as conjugated polymers (e.g., alkenes, alkynes, and aromatics).

The uniqueness of the synthetic process described above is manifested in, but is not restricted to, the following properties of the resultant quantum dots and nanocomposite materials formed of such quantum dots: (1) extremely large optical nonlinearities are manifested, e.g., in large values of $Re[\chi^{(3)}_{ijkl}]$, with values as high as $10^{-5}$ cm$^2$/W to $10^{-4}$ cm$^2$/W. Previous materials with optical nonlinearities in the infrared and more specifically in the important telecommunications region of 1500 nm to 1600 nm typically have values of nonresonant degenerate γ of ~$10^{-12}$ cm$^2$/W to $10^{-11}$ cm$^2$/W or less. As a result, the optical nonlinearity, e.g. $Re[\chi^{(3)}_{ijkl}]$, of the quantum dots of this invention is ~$10^6$ to $10^8$ times larger than such previous materials; (2) stability of the quantum dots in a variety of environmental conditions including ambient; (3) stability of the infrared to ultraviolet emission in a variety of environmental conditions including ambient; (4) control over the size of the quantum dots such that the light emission can be size-tuned from the infrared to the ultraviolet; (5) control over the size of the quantum dots such that the nonlinear optical properties give large figures-of-merits that surpass those required for effective all-optical switching; (6) the nonlinear optical properties are such that all-optical switching occurs in a very short time (depending on the nature of the nonlinear optical mechanism (e.g., resonant or non-resonant, the switching time can range from picoseconds to less than 60 femtoseconds); (7) low switching energy (<<1×$10^{-12}$ Joules); (8) non-degenerate (e.g., control and data beams with different wavelengths) all-optical switching where the wavelengths of the relevant beams can be detuned from each other over a very broad spectral range (>>100 nm) and still maintain effective all-optical switching; (9) all-optical switching can occur throughout a broad wavelength range (e.g., from 400 nm to 1600 nm).

Preferred Matrix Materials

According to some embodiments of the current invention, the matrix material that is used to host quantum dots can be selected from a broad range of materials due in large part to the versatile surface termination of the quantum dots as discussed above. These matrix materials can include, for example, organic and inorganic polymers or glasses with different properties including mechanical strength, optical transparency, lightwave transmissivity, thermal stability, dimensional stability, low temperature flexibility, moisture absorption, and chemical inertness.

The matrix materials in some embodiments of the current invention are preferred to be highly transparent and low absorption in the wavelength range from 600 nm to 2 μm. Also, they are preferred to be highly compatible with quantum dots so that a desired amount of quantum dots can be readily incorporated into the resulting nanocomposite material without degrading optical and mechanical properties. Polymers with special functional groups may be selected to facilitate solubility interactions and enhance compatibility with quantum dots. This is further explained as follows. Polymers with Lewis acid (base) functional groups, for example, can be selected to host quantum dots which are surface-functionalized with Lewis base (acid) surface ligands. Another example is to take advantage of hydrogen-bonding interactions. Polymers of hydrogen-bonding donors (acceptors) are the preferred matrix materials for quantum dots which are surface functionalized with hydrogen-bonding acceptors (donors). Additionally, polymers with strong dipolar groups are the preferred matrix materials for quantum dots which are engineered with strong dipolar surface ligands. The strong intermolecular interactions described above greatly enhance compatibility between the quantum dots and the matrix materials. Therefore, high contents of quantum dots can be readily incorporated into the matrix materials while maintaining desired uniformity and homogeneity (e.g., allowing the quantum dots to be substantially uniformly dispersed throughout the matrix materials). Additionally, block copolymers can be used to further enhance compatibility by skillful selection of monomer units and block length. As a result, a nanocomposite material comprising quantum dots and a matrix material can be engineered to be of high optical quality and low scattering loss. More importantly, the linear and nonlinear index of refraction can be tuned for a variety of applications primarily by adjusting the content of the quantum dots and by selecting the matrix material, according to some embodiments of the invention.

In addition to the optical properties and compatibility with the quantum dots, the preferred matrix material desirably should meet other requirements for a specific application. Thus, other properties can be considered in the selection of matrix materials.

One preferred matrix material is selected from a group of polymers with high glass transition temperature, $T_g$, such as polyimides, fluoropolymers (e.g., Teflon AF® brand fluoropolymers available from DuPont), polymers derived from B-staged bisbenzocyclobutene monomers (e.g., Cyclotene® brand resins and Cyclotene® brand fluorinated resins available from The Dow Chemical Company), phenolic resin, and fluorinated poly(aryl ether sulfide), for applications where thermal stability is important.

Another preferred matrix material is selected from a group of polymers with low $T_g$ such as poly(isobutylene), poly (diphenoxyphosphazene), and fluorinated acrylate (ZPU series from Zen Photonics Co., LTD) for applications where low temperature flexibility and low birefringence are desired.

Another preferred matrix material can be selected from photosensitive polymers, such as fluoropolymers (e.g., Cytop® brand fluoropolymers available from Asahi), poly (methyl methacrylate), and photoresists to facilitate lithographical fabrication of devices.

Another preferred matrix material is selected from a group of cross-linkable polymers for applications where isotropic homogeneity or dimensional stability is required.

Another preferred matrix material is a blend of two or more polymers which are engineered to tailor the optical and mechanical properties and thermal and chemical stability.

Another preferred matrix material is a copolymer including random and block copolymer.

Another preferred matrix material is a homopolymer including, but not limited to, the following:
Poly(vinyl alcohol)
Poly(vinyl butyral)—other
Poly(vinylcarbazol)
Poly(vinyl fluoride)
Poly methyl vinyl ether
Polyethylene
Polypropylene
Polystyrene
Poly(vinyl pyridine)
Polyimides
Poly(ethylene oxide)
Photoresist (positive or negative)
Cyclotene®
Fluorinated Cyclotene®
Cytop®
PMMA
Fluorinated acrylates
Poly(siloxanes)
Poly(silanes)
Poly(diphenoxyphosphazenes)
Poly(vinyl ferrocene)
Polycarbonate
Polystyrene
Poly(cyclic olefen) such as Zenor® and Zenex®
Teflon® AF®

Another preferred matrix material is a glass including, but not limited to, the following:
Sol-gel derived glasses
Organically modified glasses
Spin-on glasses
Flow-glass
Dielectrics such as Low K FlowFill™ brand dielectrics of Trikon Industries
Dielectrics such as Black Diamond™ brand dielectrics of Applied Materials, Inc.

Preferred Methods of Use

The engineered nonlinear nanocomposite materials of some embodiments of the present invention can be incorporated into an optical device by a variety of methods, including a variety of standard methods known in the art. The flexibility to process the nanocomposite material of embodiments of the current invention, desirably independent of the nonlinear optical properties, is a key benefit of embodiments of the current invention. By selecting an appropriate matrix material and solvent, engineered nonlinear nanocomposites can be deposited using spin-coating, spin casting, dip coating, spraying, blade application, screen printing, and other methods commonly used in the process of standard semiconductor micro-fabrication.

While processes like spin-coating have been used in other contexts, the combination of tuning the optical and mechanical properties of an engineered nonlinear nanocomposite material followed by spin-coating, or the like, is unlike previous capabilities. Traditional nonlinear materials known in the art have chemical and mechanical properties that are directly linked to their optical properties. The processing techniques that can be used to incorporate these materials are therefore often limited to those that are compatible with the materials themselves. For instance, $LiNbO_3$ is a crystal and can therefore not be incorporated by spin coating.

The steps of incorporating a nonlinear nanocomposite material into a device by selecting desired optical properties, substantially independently selecting desired chemical and/or mechanical properties to facilitate incorporation by a particular technique (e.g., spin-coating), and then incorporating the nanocomposite material using that technique represents a substantial improvement over previous incorporation methods. While spin-coating has been discussed herein as a specific example of a standard method of materials incorporation, this is done strictly for exemplary purposes and should not be considered to limit the scope of the invention.

For example, desired optical properties such as linear index of refraction and $\gamma$ can be established by selecting or tuning at least one of a chemical composition of quantum dot cores, a chemical composition of quantum dot shells, a peak size of quantum dots, a thickness of the shells, a chemical composition of ligand layers, a chemical composition of a matrix material, a concentration of the quantum dots in the matrix material, and a degree of interconnection of the quantum dots (e.g., using molecular tethers). Other desired optical properties such as single-photon and multi-photon absorption characteristics can be established by selecting or tuning at least one of a chemical composition of quantum dot cores, a chemical composition of quantum dot shells, a peak size of quantum dots, and a thickness of the shells. Desired chemical and mechanical properties can be established by selecting or tuning at least one of a chemical composition of ligand layers and a chemical composition of a matrix material. As discussed previously, at least two of these desired properties can be substantially independently established, according to some embodiments of the invention.

In addition to standard incorporation techniques, other methods of deposition such as layer-by-layer growth using polymers with alternating and complementary functionalities, as pioneered by Gero Decher and described in T. Sasaki et al., "Layer-by-Layer Assembly of Titania Nanosheet/Polycation Composite Films," Chem. Mater. 13, 4661 (2001), the disclosure of which is incorporated herein by reference in its entirety, can be used to create films and coatings of laminated layer structures in the required thickness with desired density of quantum dots.

All of the same processing techniques are also possible for quantum dot solids, including the ability to perform layer-by-layer growth. Here again, the process of selecting the chemical properties of the surface ligands and solvent to facilitate incorporation by a particular technique, desirably independent of the optical properties, represents a significant improvement over previous incorporation methods.

The following provides some additional preferred methods of incorporating an engineered nonlinear nanocomposite material into a variety of device.

The engineered nonlinear nanocomposite material can be dispersed in a polymer and subsequently dissolved in an appropriate solvent to create a fluid of sufficient viscosity to generate the desired thickness of a film. The film thickness can be easily tailored by varying the solvent content and therefore the viscosity. The specific quantum dot surface chemistry is selected for compatibility with the selected polymer and solvent to be used. Some preferred materials include: Dow Chemical's Cyclotene®, which is B-staged divinylsiloxane-bis-benzocyclobutene with Mesitylene and minor portions of other organic compounds; poly (methyl methacrylate) (PMMA); photoresists (both positive and negative) used in semiconductor manufacturing; and so forth.

The engineered nonlinear nanocomposite material is dispersed in a suitable carrier fluid or solvent and applied evenly over the desired surface. Heat, vacuum, IR radiation, and/or an inert carrier gas are then used to remove the carrier fluid, giving rise to a film of the engineered nonlinear nanocomposite material on the device.

The engineered nonlinear nanocomposite material is dispersed in a carrier gas, which is either reactive or inert. Appropriate carrier gasses include, but are not limited to, $SiH_4$, $N_2$, $H_2$, $O_2$, and $N_2O$. The gases are allowed to react under appropriate conditions of heat and/or plasma to cause a CVD film to be deposited on a substrate of choice. In this embodiment, a preferred substrate is a silicon wafer, optionally comprising lithographic structures or patterns on the surface.

The engineered nonlinear nanocomposite material is incorporated into a sputter target, optionally using procedure (i) above. Alternatively, a pure target of a desired matrix material could be used (e.g., organic or inorganic targets, preferably $SiO_2$), and the engineered nonlinear nanocomposite material is introduced in a gas in a sputter chamber. The engineered nonlinear nanocomposite material is then incorporated directly into a growing sputtered film.

The engineered nonlinear nanocomposite material is heated and caused to vaporize. The material vapors are then transported to a desired surface and condensed by keeping the surface at a suitable temperature. The result is a solid film deposited on a device.

The same concepts can be used in systems that deposit Low K material such as Low K FlowFill™ brand dielectrics from Trikon Industries or Black Diamond™ brand dielectrics from Applied Materials, Inc., thus incorporating quantum dots into low k films for even better control of the index of refraction and processability.

Preferred Nanocomposite Materials

Embodiments of the current invention comprise a nanocomposite material with a controllable set of optical, mechanical, chemical, and electronic properties. The nanocomposite material can comprise quantum dots dispersed in an organic and/or inorganic matrix material. The matrix material may be either doped or undoped with molecular species, with a density of quantum dots therein such that the index of refraction (e.g., the linear index of refraction or the overall index of refraction) of the nanocomposite material falls between approximately 1.3 and 5.0. Some embodiments of the nanocomposite material comprise at least or more than 10% by weight of the quantum dots (e.g., at least 20% by weight of the quantum dots, at least 30% by weight of the quantum dots, at least 40% by weight of the quantum dots, or at least 50% by weight of the quantum dots, such as between approximately 50% and 60% by weight of the quantum dots). More particularly, some embodiments of the nanocomposite material can comprise the above discussed weight percentages of the quantum dots with little or no agglomeration or aggregation of the quantum dots and with the quantum dots substantially uniformly dispersed throughout the matrix material. Also disclosed are nanocomposite materials (e.g., quantum dot solids) such that the density of quantum dots within the nanocomposite material is between approximately 0.005% and 75% by volume. Optionally, the index of refraction of the nanocomposite material can be additionally tuned by selecting a matrix material with a specific index of refraction and/or further doping the matrix material to modify that index. This provides additional control over the optical characteristics. Optionally, the matrix material can be a polymerizable material with a desired index of refraction. The index of the refraction can be further fine-tuned by cross-linking via various activation mechanisms including thermal, photo illumination, plasma, and high energy radiations. The matrix material in which the quantum dots are dispersed may optionally have an intrinsically high $\chi^{(3)}$. The matrix material may optionally be an intrinsic matrix of a quantum dot solid.

The nanocomposite materials according to some embodiments are preferably optically pure, with a homogeneous distribution of quantum dots dispersed therewithin. These quantum dots may be substantially uniformly dispersed as individual dots or as aggregates of controlled sizes (e.g., smaller aggregates up to massively interconnected quantum dot subsystems). The engineered nanocomposite materials are preferably optically homogeneous and uniform, so that little or no scattering and/or mode disruption result from light passing through or past the material, as the specific application demands. For certain applications, close-packed micron- or sub-micron-sized clusters of quantum dots dispersed in a polymer or other matrix material with a filling fraction optimized to enhance local field effects may be preferable.

In addition, nanocomposite materials of some embodiments preferably have an optical nonlinearity, such as $Re[\chi^{(3)}_{ijkl}]$ contributing to $\gamma$, e.g., under degenerate conditions, such as nonresonant degenerate conditions in a wavelength range-of-interest of between approximately $10^{-12}$ and $10^{-5}$ $cm^2/W$, more preferably between $10^{-10}$ and $10^{-5}$ $cm^2/W$ and most preferably between $10^{-8}$ and $10^{-5}$ $cm^2/W$. In particular, certain embodiments of the nanocomposite material have $\gamma$ being at least $10^{-9}$ $cm^2/W$ (e.g., at least $10^{-8}/cm^2/W$ or at least $10^{-7}$ $cm^2/W$) when irradiated with light having a wavelength between approximately $3\times10^{-5}$ cm and $2\times10^{-4}$ cm. More particularly, certain embodiments of the nanocomposite material have $\gamma$ being at least $10^{-9}$ $cm^2/W$ (e.g., at least $10^{-8}$ $cm^2/W$ or at least $10^{-7}$ $cm^2/W$) when irradiated with light having a wavelength between approximately $1.25\times10^{-4}$ cm and $1.35\times10^{-4}$ cm or between approximately $1.5\times10^{-4}$ cm and $1.6\times10^{-4}$. For $\gamma$ under non-degenerate conditions, both relevant wavelengths (e.g., wavelengths corresponding to trigger and data signals) can lie within the wavelength ranges stated above. Optical characteristics of the disclosed nanocomposite materials can be evaluated in a variety of configurations and are not restricted by the specific examples described herein. One of skill in the art will appreciate that the linear and nonlinear optical properties of a material can be evaluated using methods such as Z-scan, FWM, cross-phase modulation, nonlinear phase shift in an interferometer, nonlinear etalons, and so forth.

The mechanical properties of nanocomposite materials are preferably selected to be compatible with incorporation into devices selected from the list of: planar waveguides, nonplanar waveguides, optical fibers, waveguide cores, waveguide claddings, free-space optics, and hybrid optical devices. Such nanocomposite materials can be used in a variety of optical devices for switching, modulating, and manipulating light in ways such as for an optical switch, an optical cross-connect, a wavelength converter, and the like, as well as combinations thereof.

The nanocomposite materials described herein can have a number of key attributes lacking in other materials. For instance, the nanocomposite materials can have an extremely large optical nonlinearity. This optical nonlinearity can be represented by the real part of various tensor elements of $\chi^{(3)}$, which include $\chi^{(3)}_{1111}, \chi^{(3)}_{1212}, \chi^{(3)}_{1221}, \chi^{(3)}_{1122}$, and various permutations of the energies of the optical fields involved, e.g., $\chi^{(3)}_{ijkl}(-\omega_4; \omega_1, \omega_2, \omega_3)$. According to some embodiments of the invention, the value of the real part of these tensor elements falls in the range of $10^{-9}$ $cm^2/W$ to $10^{-4}$ $cm^2/W$. As a result, the nanocomposite materials allows all-optical devices to be made that can be effectively switched or controlled with very low intensity light such as light from continuous wave laser diodes and also LEDs in some cases. This capability is highly sought after but has not been previously achieved in a satisfactory manner.

Also, the nanocomposite materials described herein can exceed various FOM criteria for effective all-optical switching. In particular, certain embodiments of the nanocomposite material has a FOM that is at least 1 (e.g., at least 1.5 or 1.8), where this particular figure-of-merit can be defined as $2\gamma/\beta\lambda$, where $\beta$ is a two-photon absorption coefficient of the nanocomposite material expressed in cm/W, and $\lambda$ is a wavelength between approximately $3\times10^{-5}$ cm and $2\times10^{-4}$ cm, preferably between approximately $1.25\times10^{-4}$ cm and $1.35\times10^{-4}$ cm or between approximately $1.5\times10^{-4}$ cm and $1.6\times10^{-4}$. It should be recognized that other definitions for the FOM may be used instead. This is particularly differentiating since, though other materials may possibly have large nonlinear refractive indices, the linear or nonlinear losses such as that originating from two photon absorption are often sufficiently large so that the FOM is inadequate, the thermal properties are sufficiently poor such that the FOM is inferior, and the temporal response is considerably slower than with the nanocomposite materials described herein. Another important consequence is that significantly shorter lengths of the nanocomposite materials described herein are required for effective all-optical switching devices. Thus, significantly smaller and faster devices can be made. As an example, rather than requiring centimeters or more of a conventional material to effectively switch light, devices can be made with the nanocomposite materials with lengths of approximately ten microns to a few millimeters.

In addition, the nanocomposite materials described herein are relatively simple and inexpensive to make, are more easily processed, are compatible with a large number of other material systems, and can be incorporated more readily into various device structure and in nearly any device size. Epitaxial growth of the nanocomposite materials described herein is typically not required, which can be an advantage since epitaxial growth is typically an expensive process that is often not amenable to simple processing or large area devices and is often incompatible with many other material systems (since it requires epitaxial growth on material systems that are lattice-matched to itself). The nanocomposite materials can be deposited on various substrates, substantially independently of their size, surface area, and surface nature, in the form of films or coatings of varying thicknesses and can be formed into structures of various shapes and sizes. Importantly, these films, coatings, and structures made from the nanocomposite materials can be manufactured with a number of simple and inexpensive fabrication techniques such as spin coating, spray coating, doctor blading, and dip coating at ambient temperature and pressure, or using conventional molding processes for engineering plastics and elastomers.

And, the nanocomposite materials described herein can have optical, chemical, thermal, and mechanical properties engineered to suit device or application requirements. For certain embodiments, these various desirable attributes result in large part from the inherent flexibility in engineering the surface properties of quantum dots, substantially independently of their optical and electronic properties. In addition, these attributes can also result from use of organic or inorganic polymers with tailored optical, thermal, chemical, and mechanical properties suitable for different devices and applications.

Alternative Applications for Engineered Nanocomposite Materials

While the application of engineered nanocomposite materials as a nonlinear material is described herein, it should be recognized that such materials will also find applications in a variety of areas such as, though not limited to, engineered resonant nonlinear nanocomposite materials, engineered linear nanocomposite materials, engineered absorptive nanocomposite materials, engineered electro-optic nanocomposite materials, engineered thermo-optic nanocomposite materials, engineered thermal nanocomposite materials, engineered gain nanocomposite materials, engineered magneto-optic nanocomposite materials, engineered magnetic nanocomposite materials, engineered electronic nanocomposite materials, engineered biological nanocomposite materials, engineered optoelectronic nanocomposite materials, and engineered mechanical nanocomposite materials. It should be recognized that the tunable physical, chemical, electronic, and optical properties of the materials described herein, as well as the methods of incorporation thereof, can be used to create materials with specific characteristics tailored to many other applications.

At this point, one of ordinary skill in the art will recognize various advantages associated with some embodiments of the invention. Embodiments of this invention provide a method of synthesizing nanocrystalline materials. Embodiments of the invention also provide a method of synthesis that produces quantum dots with organically functionalized surfaces and a method of synthesis that produces quantum dots with surfaces passivated with oxide. Embodiments of the invention provide a method of synthesis that is safe, energy efficient, scalable, and cost-effective. Embodiments of this invention also provide a method of synthesis that employs environmentally benign starting materials or commercially available or readily prepared materials. Advantageously, embodiments of this invention provide a method of synthesis that results in high yield and a method of synthesis that results in very soluble and processable products. Also, embodiments of the invention provide a method of synthesis that results in highly crystalline material and that yields quantum dots with a narrow size distribution, such as with a dispersion of the size distribution is less than 15% rms. Embodiments of this invention provide a method of synthesis that yields quantum dots with narrow shape distribution and a method of synthesis that produces quantum dots that are uniform in composition. In addition, embodiments of the invention provide a method of synthesis that produces quantum dots that are uniform in surface chemistry.

Each of the patent applications, patents, publications, and other published documents mentioned or referred to in this specification is herein incorporated by reference in its entirety, to the same extent as if each individual patent application, patent, publication, and other published document was specifically and individually indicated to be incorporated by reference.

While the present invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, process step or steps, to the objective, spirit and scope of the present invention. All such modifications are intended to be within the scope of the claims appended hereto. In particular, while the methods disclosed herein have been described with reference to particular steps performed in a particular order, it will be understood that these steps may be combined, sub-divided, or re-ordered to form an equivalent method without departing from the teachings of the present invention. Accordingly, unless specifically indicated herein, the order and grouping of the steps is not a limitation of the present invention.

What is claimed is:

1. A quantum dot comprising:
   a) a core that is crystalline and including Ge; and
   b) a shell that is inorganic and noncrystalline and including $GeO_n$ with n between approximately 1.5 and 2, said shell surrounding said core and having a thickness greater than one monolayer of $GeO_n$ and up to ten monolayers of $GeO_n$,
   said quantum dot exhibits photoluminescence with a quantum efficiency that is at least 40 percent.

2. The quantum dot of claim 1, wherein said core has a diameter between approximately 1 nm and 20 nm.

3. The quantum dot of claim 1, wherein said core has a diameter between approximately 1 nm and 50 nm.

4. The quantum dot of claim 1, wherein said core has a diameter between approximately 1 nm and 10 nm.

5. The quantum dot of claim 1, wherein said core is substantially spherical with an aspect ratio between approximately 0.8 and 1.2.

6. The quantum dot of claim 1, wherein n is between approximately 1.8 and 2.

7. The quantum dot of claim 1, wherein said shell completely surrounds said core.

8. The quantum dot of claim 1, wherein said quantum efficiency is at least 50 percent.

* * * * *